(12) United States Patent
Wakisaka et al.

(10) Patent No.: US 7,944,064 B2
(45) Date of Patent: May 17, 2011

(54) SEMICONDUCTOR DEVICE HAVING ALIGNMENT POST ELECTRODE AND METHOD OF MANUFACTURING THE SAME

(75) Inventors: Shinji Wakisaka, Hanno (JP); Tomohiro Ito, Ome (JP); Shigeru Yokoyama, Hachioji (JP); Osamu Kuwabara, Tokyo (JP); Norihiko Kaneko, Fussa (JP); Syouichi Kotani, Tama (JP)

(73) Assignee: Casio Computer Co., Ltd., Tokyo (JP)

( * ) Notice: Subject to any disclaimer, the term of this patent is extended or adjusted under 35 U.S.C. 154(b) by 1151 days.

(21) Appl. No.: 11/656,866

(22) Filed: Jan. 22, 2007

(65) Prior Publication Data

US 2007/0164432 A1 Jul. 19, 2007

Related U.S. Application Data

(63) Continuation-in-part of application No. 10/853,728, filed on May 24, 2004, now abandoned.

(30) Foreign Application Priority Data

May 26, 2003 (JP) .................................. 2003-147448
Sep. 12, 2003 (JP) .................................. 2003-320581
Feb. 16, 2006 (JP) .................................. 2006-039135

(51) Int. Cl.
*H01L 23/544* (2006.01)

(52) U.S. Cl. ................ 257/797; 257/773; 257/E23.179; 438/401; 438/462

(58) Field of Classification Search .................. 257/773, 257/797, E23.179; 438/401, 462
See application file for complete search history.

(56) References Cited

U.S. PATENT DOCUMENTS

| | | | |
|---|---|---|---|
| 4,642,672 A | 2/1987 | Kitakata | |
| 5,503,962 A | 4/1996 | Caldwell | |
| 5,939,132 A | 8/1999 | Fujii et al. | |
| 5,982,044 A | 11/1999 | Lin et al. | |
| 6,440,821 B1 | 8/2002 | Conboy et al. | |
| 6,590,274 B2 | 7/2003 | Ohsumi et al. | |
| 6,856,029 B1 | 2/2005 | Daniel et al. | |
| 2001/0041425 A1 | 11/2001 | Ohsumi et al. | |
| 2003/0038367 A1 | 2/2003 | Yamaguchi | |
| 2003/0209812 A1 | 11/2003 | Nin | |

FOREIGN PATENT DOCUMENTS

| | | |
|---|---|---|
| JP | 2-2606 | 1/1990 |
| JP | 3-196633 | 8/1991 |
| JP | 10-335801 | 12/1998 |
| JP | 11-195667 A | 7/1999 |
| JP | 11-260768 | 9/1999 |
| JP | 2001-135559 | 5/2001 |
| JP | 2001-144197 A | 5/2001 |
| JP | 2003-234430 | 8/2003 |

*Primary Examiner* — Wael M Fahmy
*Assistant Examiner* — John C Ingham
(74) *Attorney, Agent, or Firm* — Holtz, Holtz, Goodman & Chick, PC

(57) ABSTRACT

A semiconductor device includes a semiconductor substrate which has a plurality of semiconductor device formation regions and alignment mark formation region having the same planar size as that of the semiconductor device formation region, a plurality of post electrodes which are formed in each semiconductor device formation region, and an alignment post electrode which is formed in the alignment mark formation region and smaller in number than the post electrodes formed in each semiconductor device formation region.

11 Claims, 55 Drawing Sheets

SEMICONDUCTOR DEVICE HAVING ALIGNMENT POST ELECTRODE AND METHOD OF MANUFACTURING THE SAME

CROSS-REFERENCE TO RELATED APPLICATIONS

This is a Continuation-in-Part application of U.S. patent application Ser. No. 10/853,728, filed May 24, 2004, now abandoned, the entire contents of which are incorporated herein by reference.

This application is based upon and claims the benefit of priority from prior Japanese Patent Applications No. 2003-147448, filed May 26, 2003; No. 2003-320581, filed Sep. 12, 2003; and No. 2006-039135, filed Feb. 16, 2006, the entire contents of all of which are incorporated herein by reference.

BACKGROUND OF THE INVENTION

1. Field of the Invention

The present invention relates to a semiconductor device having an alignment post electrode and a method of manufacturing the same.

2. Description of the Related Art

Conventionally, if a photomask is aligned by using the orientation flat of a semiconductor integrated circuit wafer, in order to forming post electrodes for external connection on connection pads formed on the wafer, the error becomes large. To prevent this, alignment is done on the basis of the opening portions of an insulating film which covers the edge portion of the connection pads. However, when the number of post electrodes increases, and/or the array pitch between them decreases, the alignment accuracy cannot be maintained even on the basis of the opening portions of the insulating film. To cope with this problem, there is an improved technique for forming alignment marks directly on connection pads (e.g., Jpn. Pat. Appln. KOKAI Publication No. 11-195667).

In the method described in this reference, the alignment marks as missing parts of a metal thin film are formed at or near the edge portion of connection pads. The alignment marks are arranged on diagonal lines of a wafer to do setting of the entire wafer.

In recent years, so-called WLP (Wafer Level Package) has been developed. In WLP, after post electrodes are formed on the entire surface of a semiconductor integrated circuit wafer, packaging is executed by forming a sealing member on the entire surface of the semiconductor integrated circuit wafer to encapsulate all the post electrodes with the sealing member. After that, the wafer is separated into a plurality of semiconductor integrated circuit elements by dicing. In this WLP, after the sealing member is formed on the semiconductor integrated circuit wafer, polishing is executed to expose the upper surfaces of the post electrodes and planarize the sealing member. Even after the post electrode formation, there are steps that require alignment, including steps of printing solder on the upper surfaces of the post electrodes, mounting solder balls, and marking on the lower surface of the package.

In the method described in the publication, after the alignment marks are formed, actually, an underlying metal layer is formed on the entire surface of the semiconductor integrated circuit wafer to cover the upper surfaces of all connection pads. Hence, when the post electrodes are formed on the underlying metal layer, the alignment marks lose their functions as alignment marks.

For this reason, alignment in each step after post electrode formation is done by using the shape of the upper surface of each post electrode, which is exposed from the sealing member. In this case, it is difficult to identify post electrodes serving as alignment marks and the remaining post electrodes, resulting in high recognition error rate.

BRIEF SUMMARY OF THE INVENTION

It is an object of the present invention to provide a semiconductor device and a method of manufacturing the same, which can reliably recognize an alignment mark and efficiently execute alignment after post electrode formation.

According to an aspect of the present invention, there is provided a semiconductor device comprising:

a semiconductor substrate which has an upper surface including a plurality of semiconductor device formation regions and at least one alignment mark formation region having the same planar size as a planar size of each of the semiconductor device formation regions;

a plurality of connection pads formed in each of the semiconductor device formation regions;

an insulating film formed on the upper surface of the semiconductor substrate in all of the semiconductor device formation regions, including on the connection pads except for respective central portions thereof, and in the at least one alignment mark formation region;

a plurality of post electrodes which are formed on an upper side of the insulating film in each of the semiconductor device formation regions and formed of metal, and each of which is electrically connected to at least a corresponding one of the connection pads;

a temporary alignment post electrode formed of metal and a final alignment post electrode formed of the same material as the temporary alignment post electrode, which are formed on an upper side of the insulating film in the alignment mark formation region, and which are smaller in number than the post electrodes formed in each semiconductor device formation region, the final alignment post electrode having a planar size that is smaller than a planar size of the temporary alignment post electrode; and a sealing film which is made from an organic resin and which is formed between the post electrodes in each of the semiconductor device formation regions and on an outside of the temporary and final alignment post electrodes in the alignment mark formation region;

wherein an upper surface of each of the temporary and final alignment post electrodes is exposed to outside and is flush with an upper surface of the sealing film.

According to another aspect of the present invention, there is provided a semiconductor device comprising:

a semiconductor substrate which has an upper surface including a plurality of semiconductor device formation regions and at least one alignment mark formation region having the same planar size as a planar size of each of the semiconductor device formation regions;

a plurality of connection pads formed in each of the semiconductor device formation regions;

an insulating film formed on the upper surface of the semiconductor substrate in all of the semiconductor device formation regions, including on the connection pads except for respective central portions thereof, and in the at least one alignment mark formation region;

a plurality of post electrodes which are formed on an upper side of the insulating film in each of the semiconductor device formation regions and each of which is electrically connected to at least a corresponding one of the connection pads;

at least one alignment post electrode which is formed on an upper side of the insulating film in the alignment mark formation region, and which is smaller in number than the post electrodes formed in each semiconductor device formation region; and a sealing film which is made from an organic resin and which is formed between the post electrodes in each of the semiconductor device formation regions and on an outside of the alignment post in the alignment mark formation region;

wherein an upper surface of the alignment post electrode is exposed to outside and is flush with an upper surface of the sealing film; and wherein the semiconductor substrate includes a plurality of non-semiconductor device formation regions around the alignment mark formation region, and each of the non-semiconductor device formation regions has the same planar size as the planar size of each of the semiconductor device formation regions and does not have post electrodes formed thereon.

According to still another aspect of the present invention, there is provided a semiconductor device comprising:

a semiconductor substrate which includes a plurality of semiconductor device formation regions and at least one alignment mark formation region having the same planar size as a planar size of each of the semiconductor device formation regions;

a plurality of post electrodes which are formed in each of the semiconductor device formation regions; and at least one alignment post electrode which is formed in the alignment mark formation region, and which is smaller in number than the post electrodes formed in each of the semiconductor device formation regions;

wherein the semiconductor substrate includes a plurality of non-semiconductor device formation regions around the alignment mark formation region, and each of the non-semiconductor device formation regions has the same planar size as the planar size of each of the semiconductor device formation regions and does not have post electrodes formed thereon.

According to still another aspect of the present invention, there is provided a semiconductor device comprising:

a semiconductor substrate including a plurality of semiconductor device formation regions in each of which a plurality of connection pads are formed, and at least one alignment mark formation region having the same planar size as a planar size of each of the semiconductor device formation regions;

a plurality of post electrodes which are formed in each of the semiconductor device formation regions and each of which is electrically connected to at least a corresponding one of the connection pads; and at least one alignment post electrode and at least one dummy electrode which are formed in the alignment mark formation region, the alignment post electrode being smaller in number than the post electrodes formed in each semiconductor device formation region, and the dummy electrode being not electrically connected to the connection pad.

DETAILED DESCRIPTION OF THE INVENTION

First Embodiment

Figure 1:
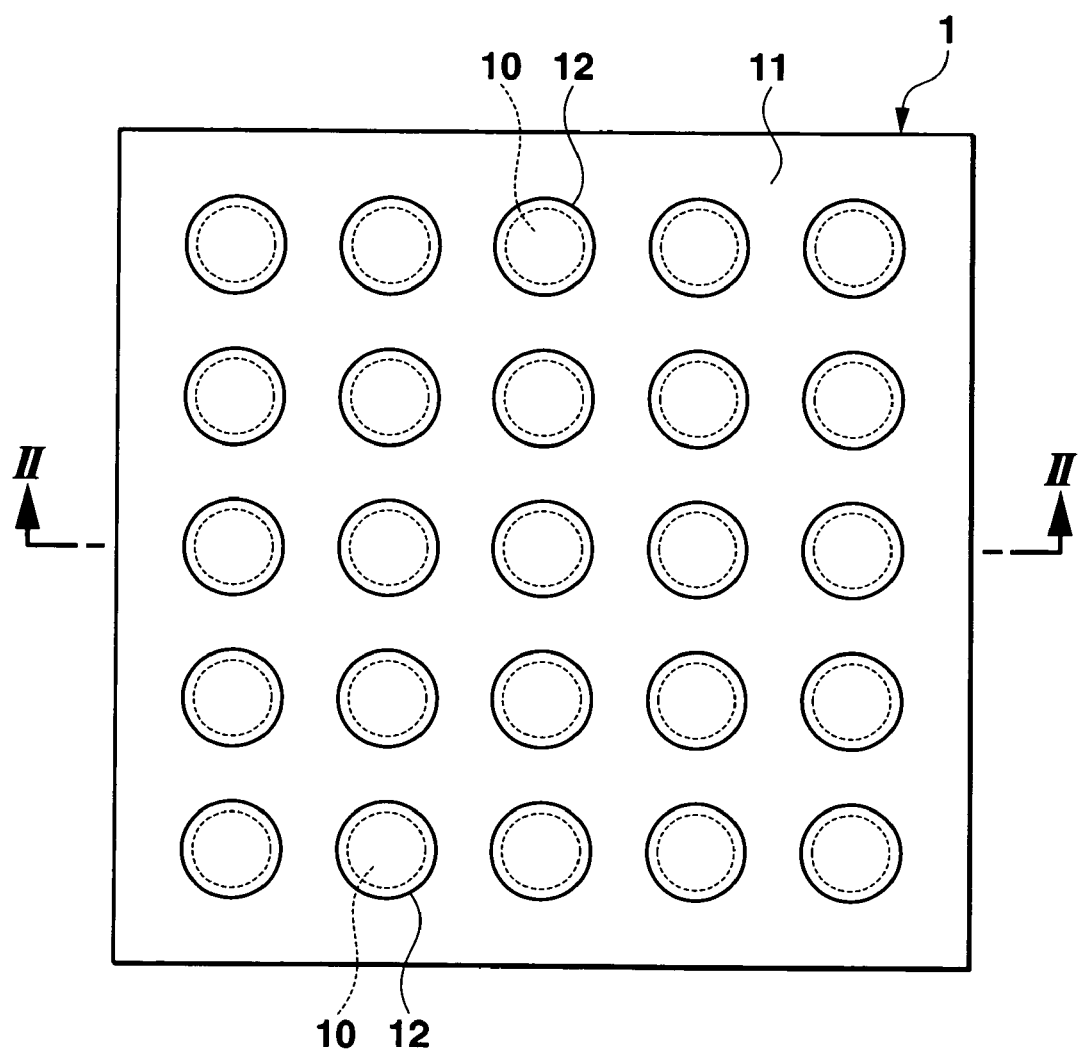
FIG. 1 is a plan view of a semiconductor element of a semiconductor device according to the first embodiment of the present invention.
Figure 2:
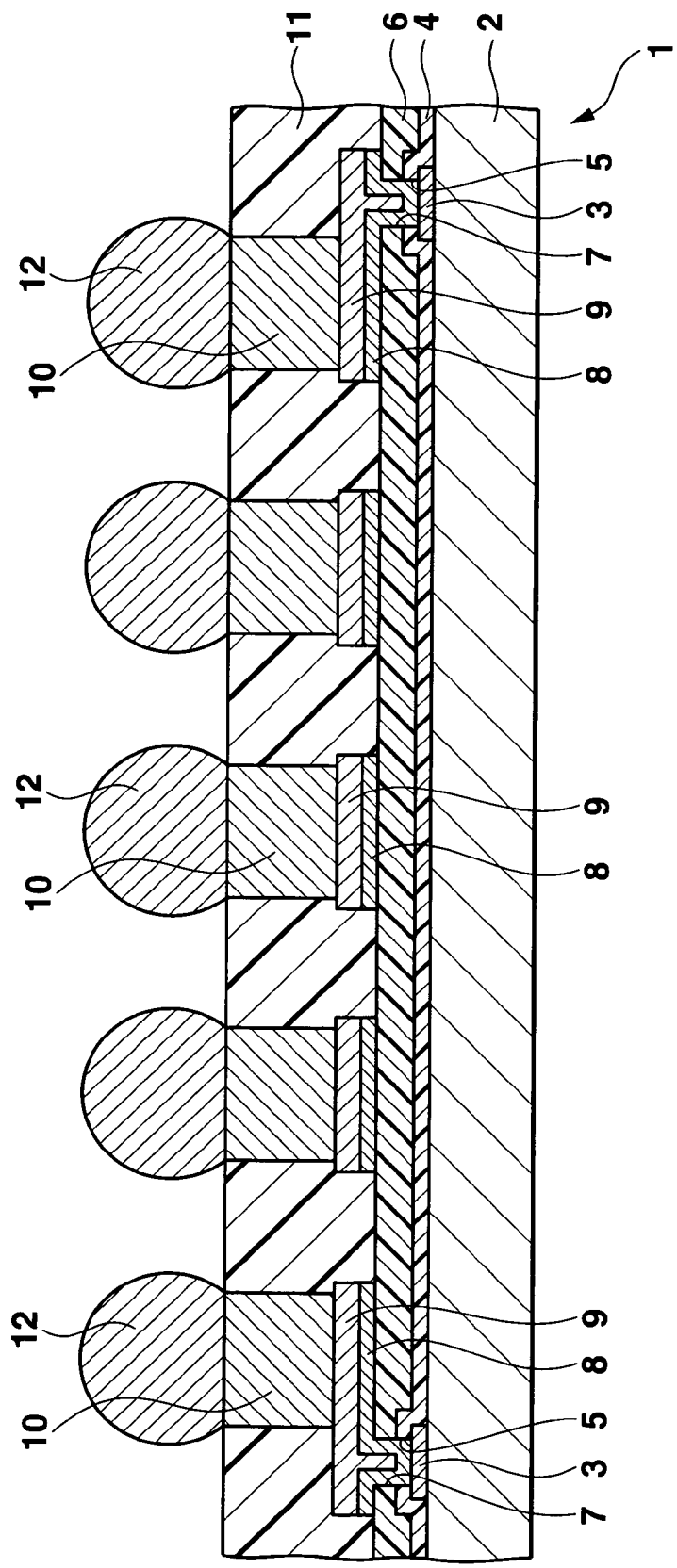
FIG. 2 is an enlarged sectional view taken along a line II-II in FIG. 1.

FIG. 1 is a plan view of a semiconductor element 1 of a semiconductor device according to an embodiment of the present invention. FIG. 2 is a sectional view taken along a line II-II in FIG. 1. The semiconductor element 1 is called a CSP (Chip Size Package) and has a silicon substrate 2 having a square planar shape. An integrated circuit (not shown) is formed at the central portion of the upper surface of the silicon substrate 2. A plurality of connection pads 3 made of, e.g., an aluminum-based metal are formed at the peripheral portion of the upper surface and electrically connected to the integrated circuit.

An insulating film 4 made of silicon oxide or silicon nitride and a protective film 6 made of polyimide are sequentially formed on the upper surface of the silicon substrate 2 except the central portion of each connection pad 3. The central portion of each connection pad 3 is exposed through an opening portion 5 formed in the insulating film 4 and an opening portion 7 formed in the protective film 6.

An underlying metal layer 8 is formed from the upper surface of each connection pad 3 exposed through the opening portions 5 and 7 to a predetermined portion of the upper surface of the protective film 6. An interconnection 9 made of copper is formed on the upper surface of the underlying metal layer 8. Post electrodes 10 made of copper are formed on the upper surfaces of the interconnections 9 outside the connection pad portions.

A sealing film 11 made of an organic resin, e.g., epoxy resin is formed on the upper surface of the protective film 6 including the interconnections 9 such that the upper surface becomes flush with the upper surfaces of the post electrodes 10. Hence, the upper surfaces of the post electrodes 10 are exposed from the sealing film 11. In this case, each post electrode 10 has a circular planar shape. Solder balls 12 are formed on the exposed upper surfaces of the post electrodes 10.

Figure 3:
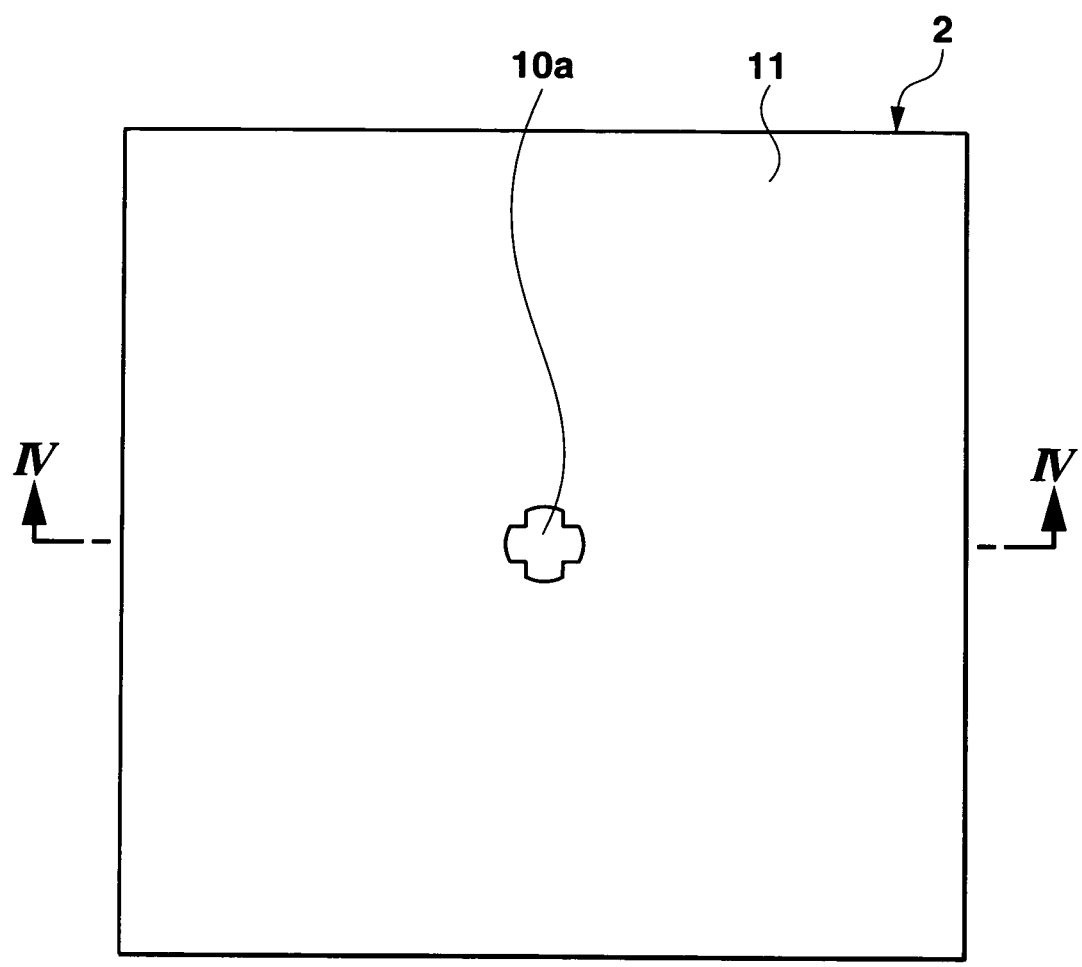
FIG. 3 is a plan view showing an example of an element with an alignment mark, which is obtained simultaneously when the semiconductor device shown in FIGS. 1 and 2 is manufactured.
Figure 4:
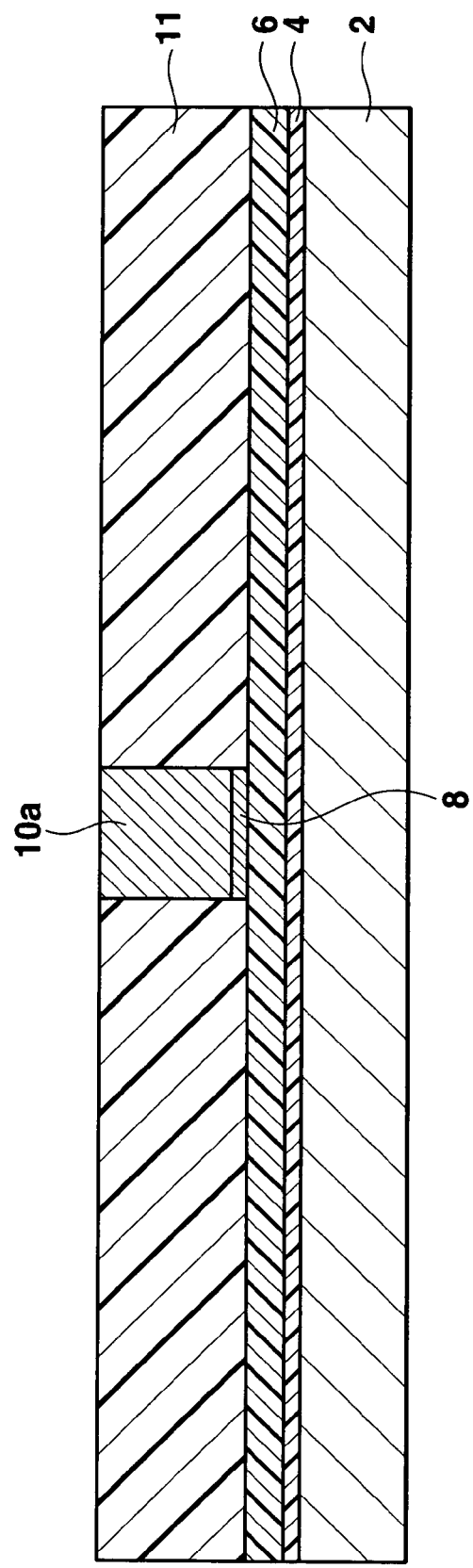
FIG. 4 is an enlarged sectional view taken along a line IV-IV in FIG. 3.

FIG. 3 is a plan view showing an example of an element with an alignment mark, which is obtained simultaneously when the semiconductor device shown in FIGS. 1 and 2 is manufactured. FIG. 4 is a sectional view taken along a line IV-IV in FIG. 3. In this element with an alignment mark, the insulating film 4 and protective film 6 are formed on the upper surface of the silicon substrate 2 having a square planar shape. The underlying metal layer 8 and an alignment post electrode 10a are formed at the central portion of the upper surface of the protective film 6. The sealing film 11 is formed on the upper surface of the protective film 6 such that the upper surface becomes flush with that of the alignment post electrode 10a. The alignment post electrode 10a has a columnar shape whose section has an uniform shape when cut along a plane parallel to the upper surface of the semiconductor substrate. In this case, the alignment post electrode 10a has a cross section of an almost cross planar shape, unlike the post electrode 10 having a circular planar shape.

Figure 5:
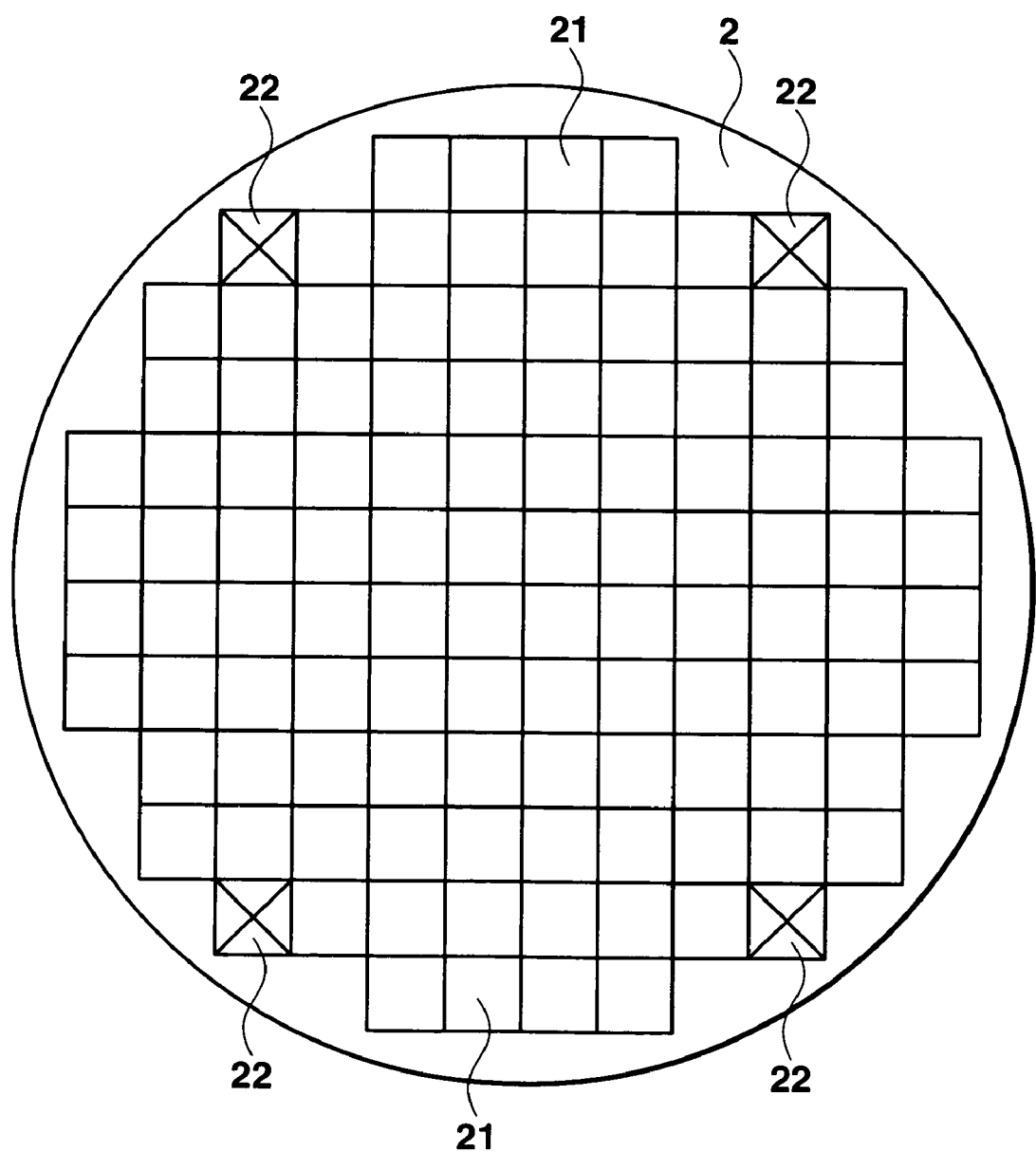
FIG. 5 is a plan view of a silicon substrate in a wafer state, which is initially prepared in manufacturing the semiconductor device according to the first embodiment.

An example of a method of manufacturing the semiconductor device having the above structure will be described next. First, as shown in FIG. 5, the silicon substrate (semiconductor substrate) 2 in a wafer state is prepared. Referring to FIG. 5, each unmarked square region defined by vertical and horizontal lines is a semiconductor device formation region 21. A region marked with X is an alignment mark formation region 22. In this case, a semiconductor integrated circuit is formed even in the alignment mark formation region 22, like the semiconductor device formation region 21. The planar size of the alignment mark formation region 22 is the same as that of the semiconductor device formation region 21. The alignment mark formation regions 22 are formed at four portions, i.e., the upper right, lower right, upper left, and lower left portions of the silicon substrate 2.

Figure 6:
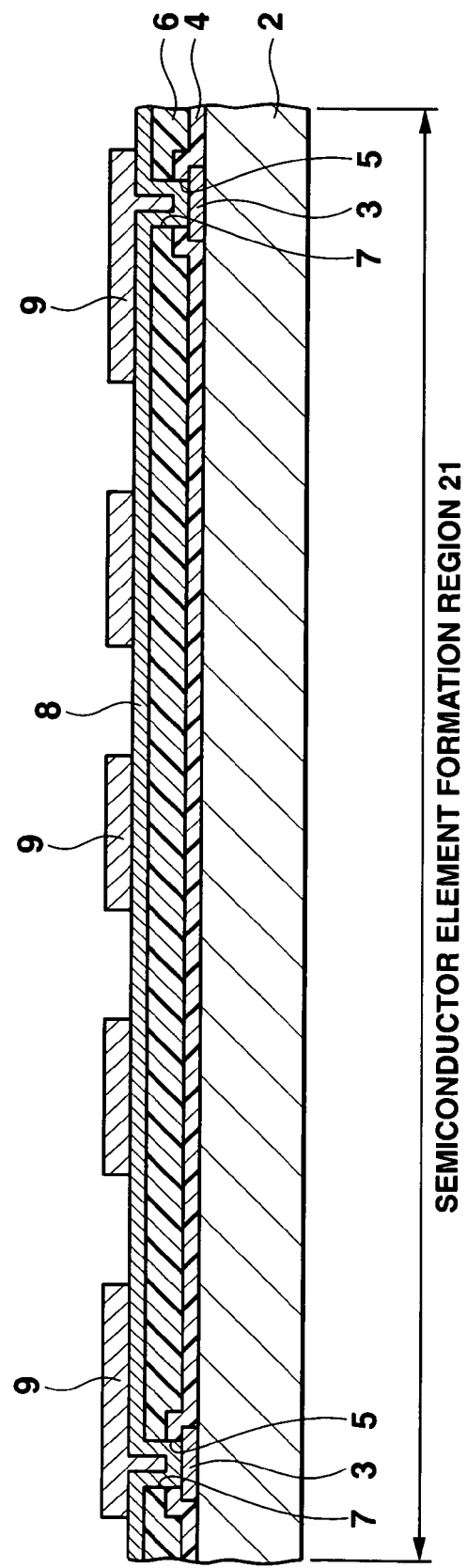
FIG. 6 is an enlarged sectional view of a semiconductor element formation region shown in FIG. 5.
Figure 7:
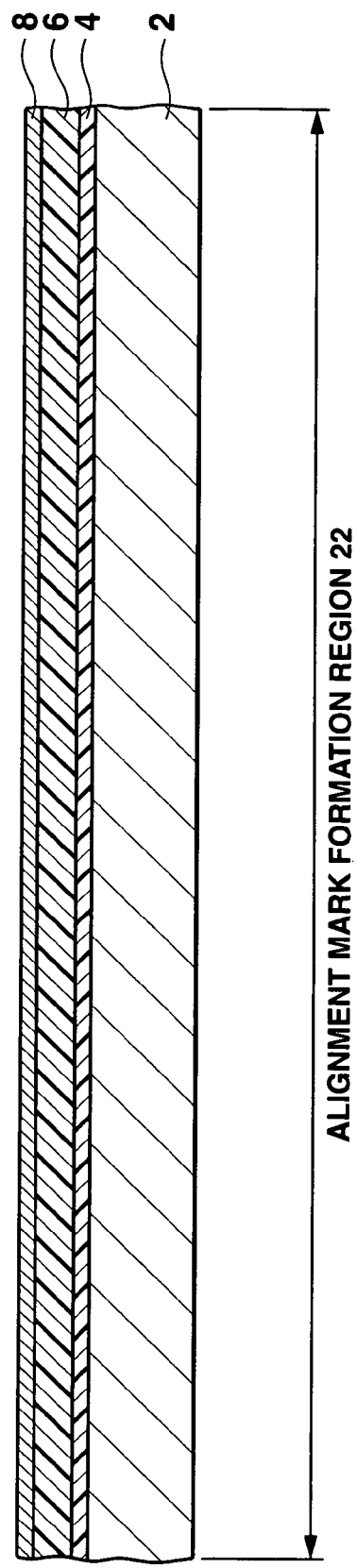
FIG. 7 is an enlarged sectional view of an alignment mark formation region shown in FIG. 5.

As shown in FIG. 6, the connection pads 3 made of, e.g., an aluminum-based metal are formed at the peripheral portion of the upper surface of the semiconductor device formation region 21 of the silicon substrate 2. The insulating film 4 made of, e.g., silicon oxide and the protective film 6 made of polyimide are formed in the upper surface region except the central portion of each connection pad 3. The underlying metal layer 8 is formed on the entire upper surface of the protective film 6, including the upper surfaces of the connection pads 3 exposed through the opening portions 5 and 7 formed in the insulating film 4 and protective film 6. The Interconnections 9 made of copper are formed at predetermined portions of the upper surface of the underlying metal layer 8. As shown in FIG. 7, the insulating film 4, protective film 6, and underlying metal layer 8 are formed on the upper surface of the alignment mark formation region 22 of the silicon substrate 2.

Figure 8:
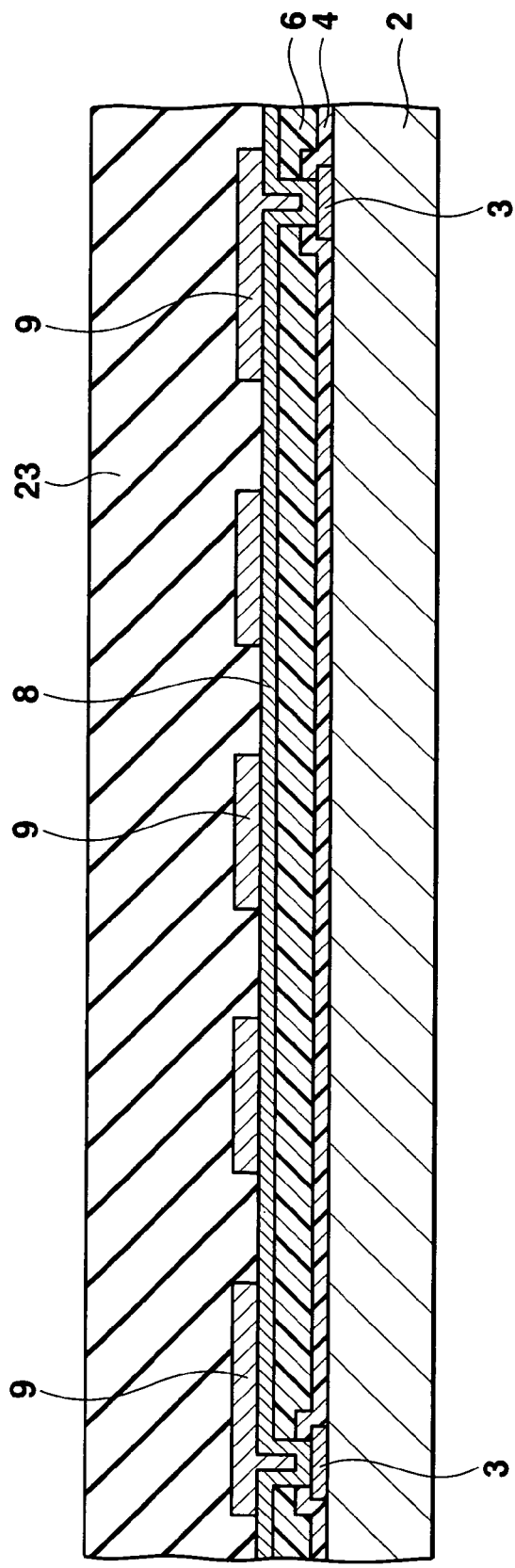
FIG. 8 is an enlarged sectional view showing a semiconductor device formation region in a step following FIG. 6.
Figure 9:
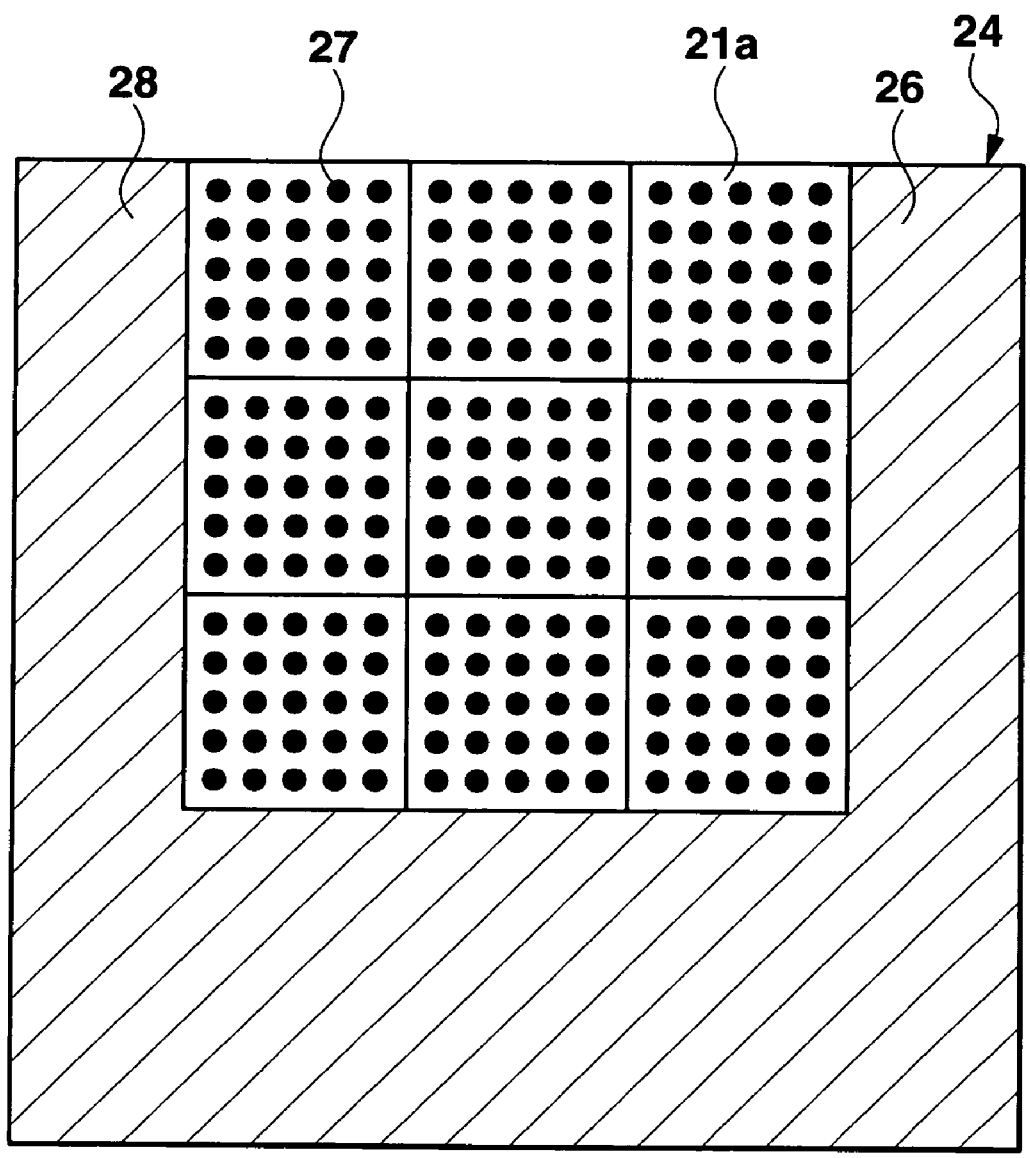
FIG. 9 is a plan view of a first exposure mask.

As shown in FIG. 8, a plating resist film 23 made of a negative photoresist is formed on the entire surface of the underlying metal layer 8, including the interconnections 9. Exposure is executed by using a first exposure mask 24 and second exposure mask 25 shown in FIGS. 9 and 10, respectively, as exposure masks. The first exposure mask 24 shown in FIG. 9 is used to form the post electrodes. In each of regions 21a corresponding to 3×3, i.e., a total of nine semiconductor device formation regions 21 in a predetermined region of a square glass plate 26, circular light-shielding portions 27 are formed at portions corresponding to the formation regions of the post electrodes 10. A light-shielding portion 28 is formed around that region.

Figure 10:
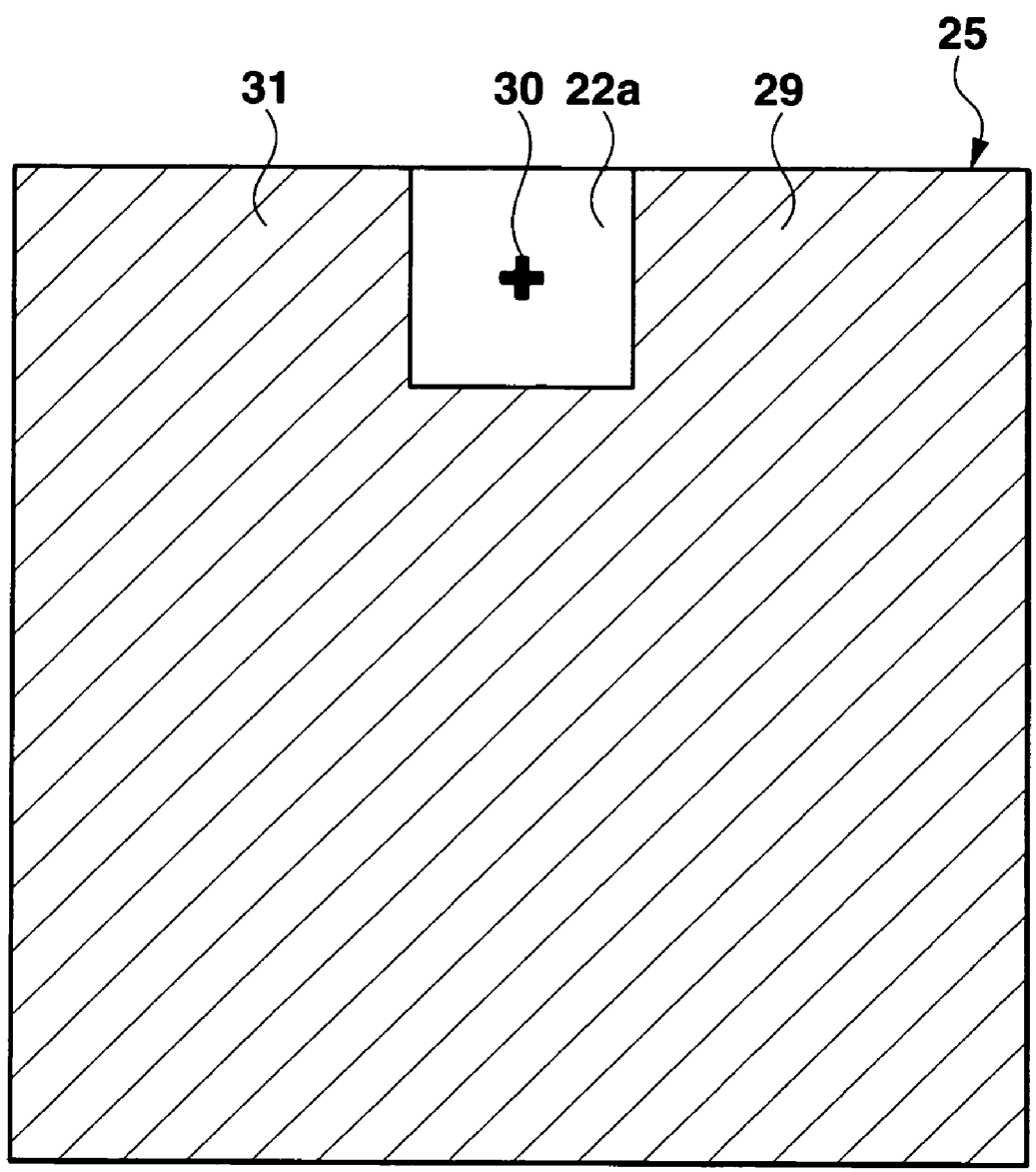
FIG. 10 is a plan view of a second exposure mask.

The second exposure mask 25 shown in FIG. 10 is used to form the alignment post electrode. In a region 22a corresponding to the alignment mark formation region 22 in a predetermined region of a square glass plate 29, a cross light-shielding portion 30 is formed at a portion corresponding to the formation regions of the alignment post electrode 10a. A light-shielding portion 31 is formed around that region. In this case, the length of the two lines that form the cross of the cross light-shielding portion 30 is larger than the diameter of each circular light-shielding portion 27 of the first exposure mask 24. The width of the two lines is smaller than the diameter of the circular light-shielding portion 27.

As an example, assume that the diameter of each of the circular light-shielding portions 27 of the first exposure mask 24 is 250 μm, and the pitch between them is 500 μm. In this case, the length of the two lines that form the cross of the cross light-shielding portion 30 is 500 μm, and the width of the two lines is 125 μm. The reason why the length of the two lines that form the cross of the cross light-shielding portion 30 is larger than the diameter of each circular light-shielding portion 27 of the first exposure mask 24 will be described later. The first exposure mask 24 and second exposure mask 25 shown in FIGS. 9 and 10 are used for step exposure.

Figure 11:
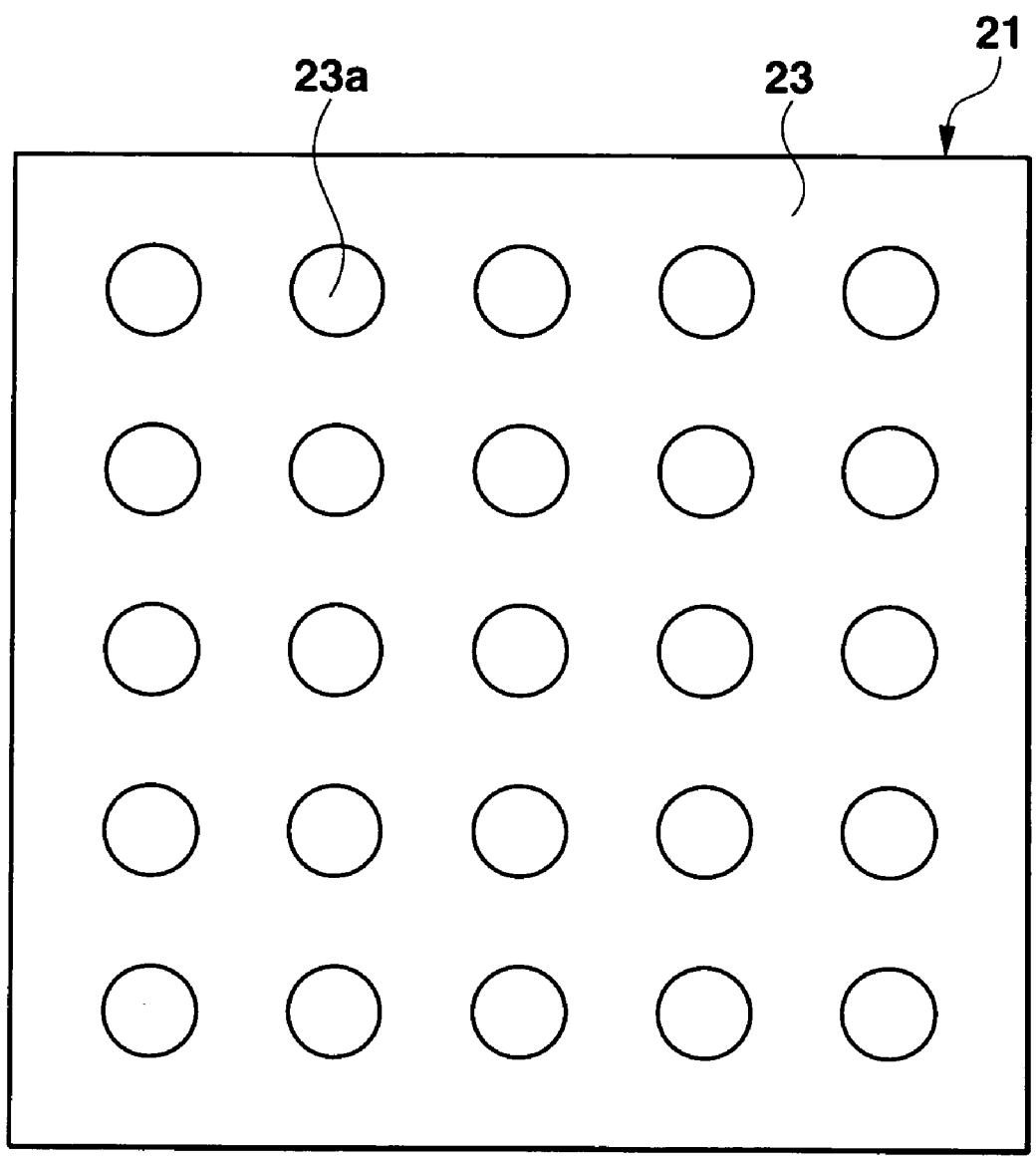
FIG. 11 is a plan view for explaining the exposed state of a plating resist film in the semiconductor device formation region.

In exposure, first step exposure is executed for the semiconductor device formation regions 21 and alignment mark formation regions 22 shown in FIG. 5 by using the first exposure mask 24 shown in FIG. 9. As a result, in the semiconductor device formation region 21, the plating resist film 23 obtains unexposed portions 23a at portions corresponding to the formation regions of the post electrodes 10, as indicated by circles in FIG. 11. The plating resist film 23 in the alignment mark formation region 22 is also exposed, like the plating resist film 23 in the semiconductor device formation region 21 shown in FIG. 11. This step exposure is sequentially executed on the entire surface of the silicon substrate 2 while scanning the substrate for each shot.

Figure 12:
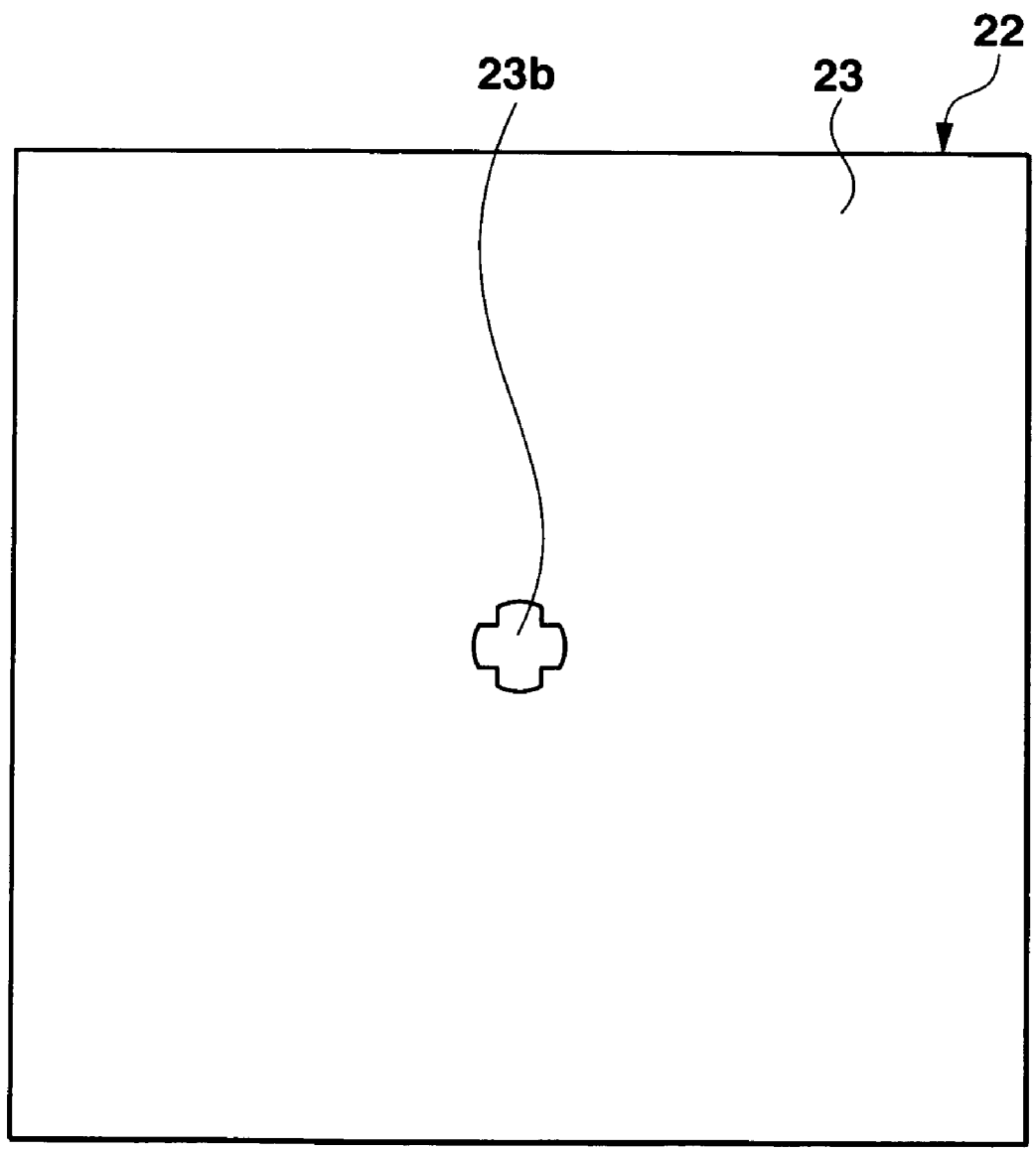
FIG. 12 is a plan view for explaining the exposed state of the plating resist film in the alignment mark formation region.

Next, exposure is executed for only the alignment mark formation regions 22 shown in FIG. 5 by using the second exposure mask 25 shown in FIG. 10. In the alignment mark formation region 22, the plating resist film 23 obtains an unexposed portion 23b at only a portion corresponding to the formation region of the alignment post electrode 10a, as indicated by an almost cross hollow portion in FIG. 12. That is, the plating resist film 23 in the alignment mark formation region 22 is exposed twice by using the first exposure mask 24 and second exposure mask 25. The unexposed portion 23b is formed at only the almost cross portion at the central portion.

The alignment mark formation region 22 is exposed by using the first exposure mask 24 having the circular light-shielding portions 27 each having a diameter of 250 μm. The second exposure mask 25 used for the second exposure has the cross light-shielding portion 30 with two lines each having a length of 500 μm. Hence, an allowable tolerance of ±120 μm is obtained for alignment of the mask 25 for the second exposure. More specifically, when the misalignment with respect to the unexposed portion 23a falls within the range of ±120 μm, the tips of the cross alignment mark of the light-shielding portion 30 are located outside the unexposed portion 23a. Hence, the diameter of the cross portion of the unexposed portion 23b shown in FIG. 12 never becomes 250 μm or less by the second exposure. For this purpose, the length of the two lines that form the cross of the cross light-shielding portion 30 is set to be larger than the diameter of each circular light-shielding portion 27 of the first exposure mask 24. The exposure using the second exposure mask 25 is executed for each alignment mark formation region 22. The exposure is executed a total of four times.

Figure 13:
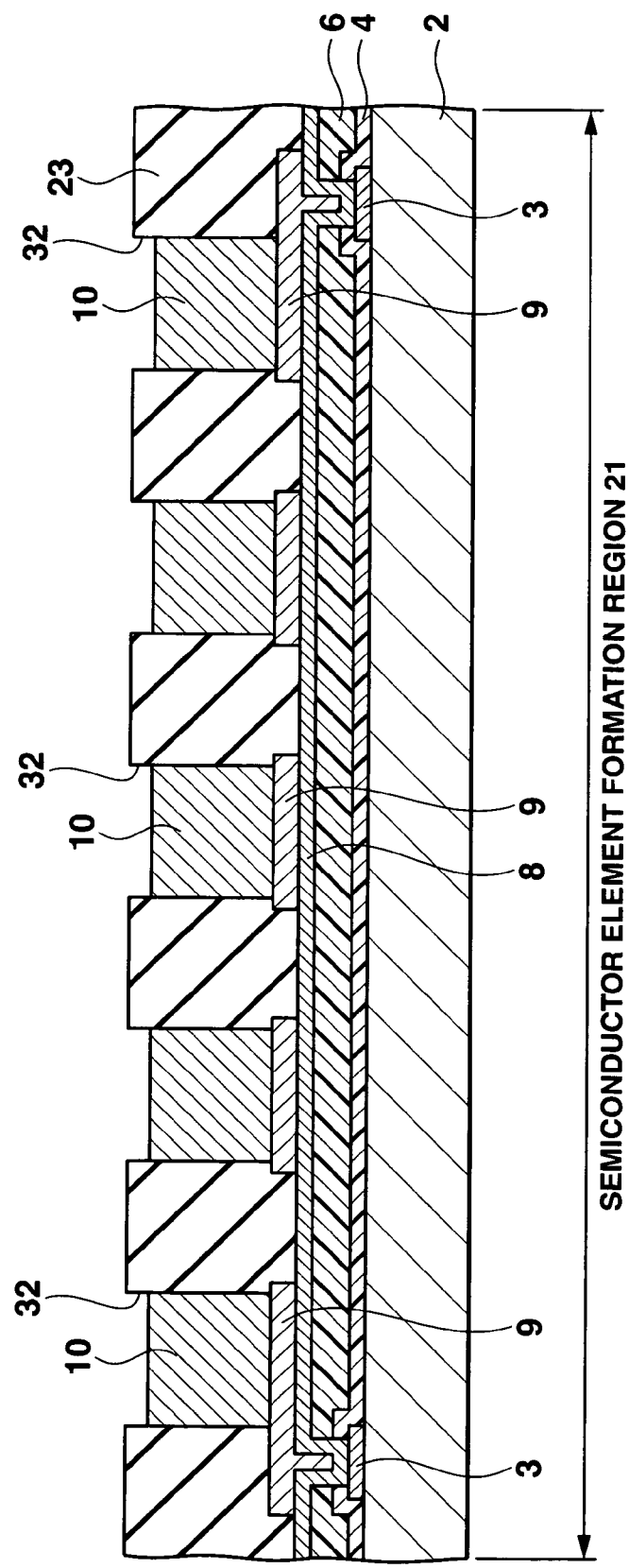
FIG. 13 is an enlarged sectional view showing the semiconductor device formation region in a step following FIG. 8.
Figure 14:
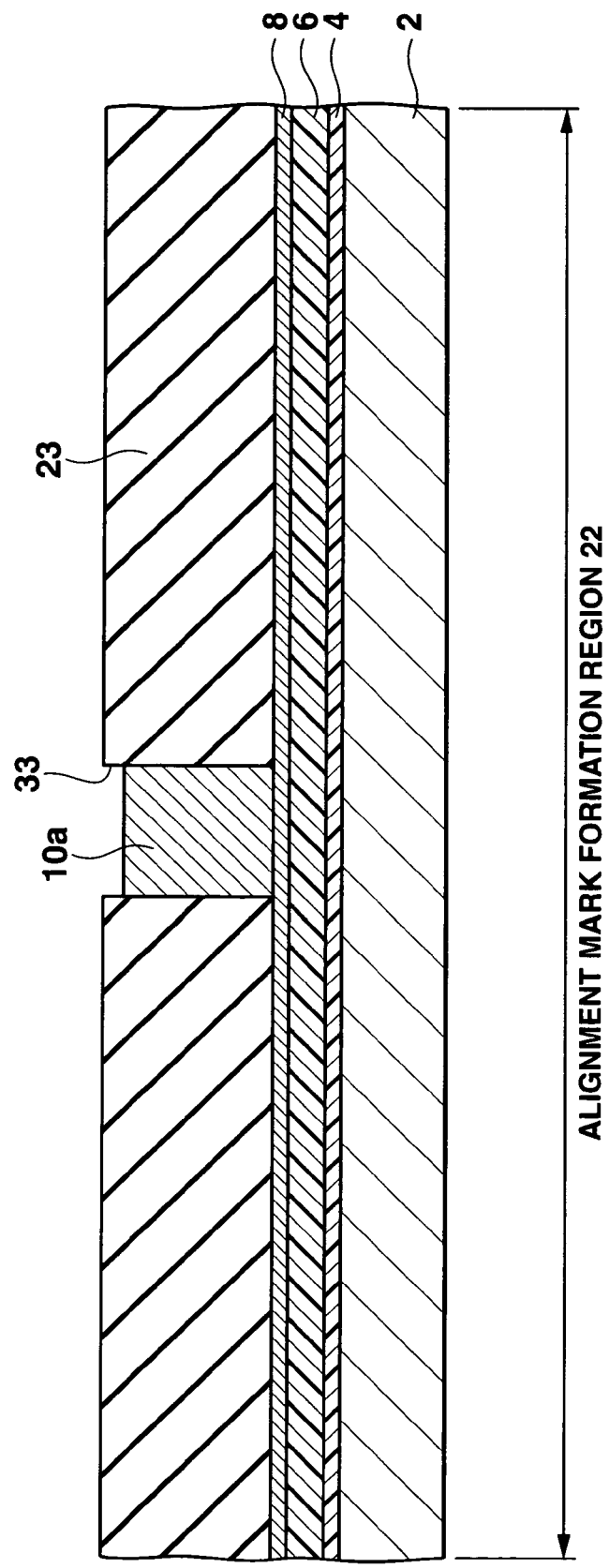
FIG. 14 is an enlarged sectional view showing the alignment mark formation region in the same step as in FIG. 13.

Development is executed to form opening portions 32 in the plating resist film 23 in regions corresponding to the connection pad portions of the interconnections 9, i.e., the formation regions of the post electrodes 10 in the semiconductor device formation region 21, as shown in FIG. 13. As shown in FIG. 14, an opening portion 33 is formed in the plating resist film 23 in a region corresponding to the formation region of the alignment post electrode 10a in the alignment mark formation region 22.

Copper electroplating is executed by using the underlying metal layer 8 as a plating current path. Accordingly, in the semiconductor device formation region 21, the post electrodes 10 are formed on the upper surfaces of the connection pad portions of the interconnections 9 in the opening portions 32 of the plating resist film 23, as shown in FIG. 13. In the alignment mark formation region 22, the alignment post electrode 10a is formed on the upper surface of the underlying metal layer 8 in the opening portion 33 of the plating resist film 23, as shown in FIG. 14. Next, the plating resist film 23 is peeled.

Figure 15:
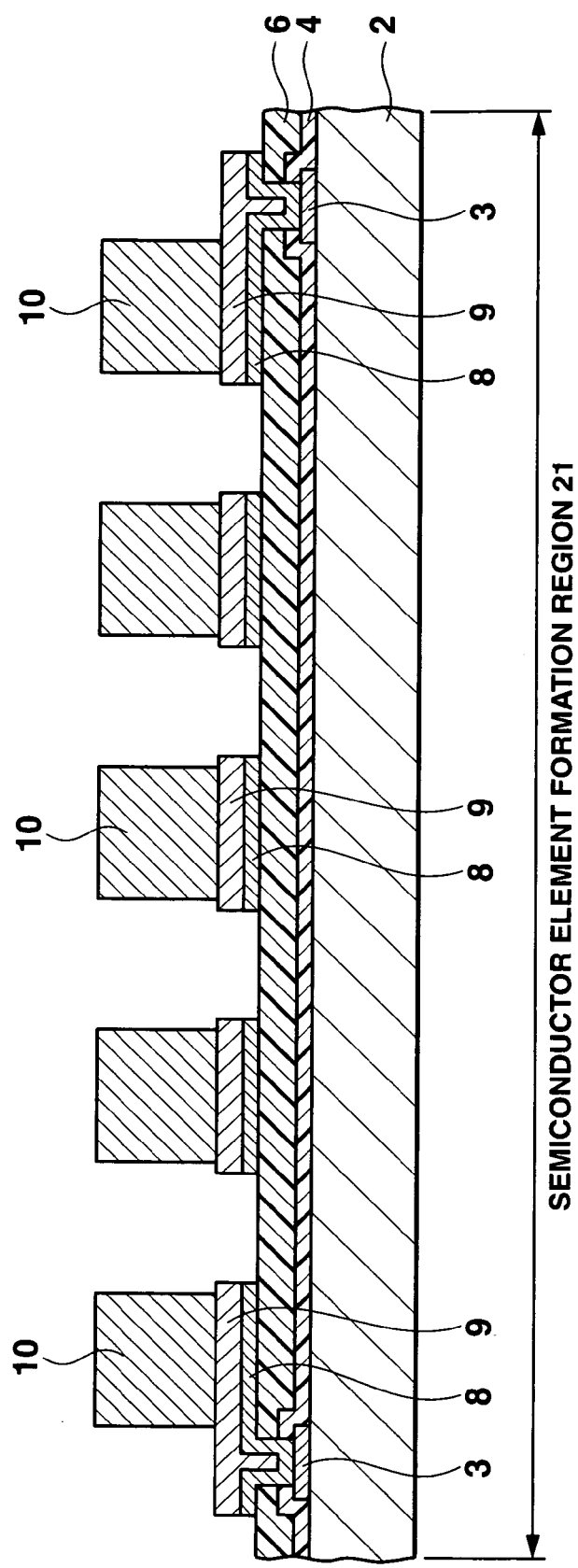
FIG. 15 is an enlarged sectional view showing the semiconductor device formation region in a step following FIG. 13.
Figure 16:
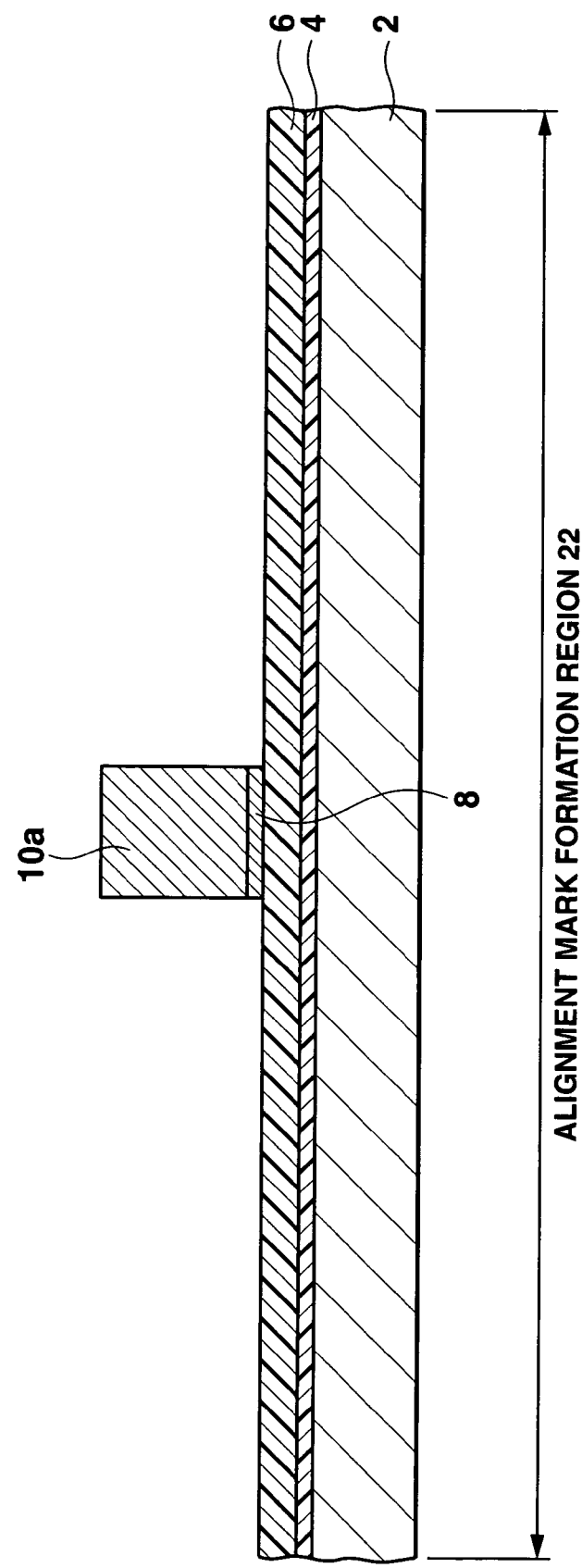
FIG. 16 is an enlarged sectional view showing the alignment mark formation region in the same step as in FIG. 15.

Unnecessary portions of the underlying metal layer 8 are removed by etching by using the interconnections 9 and alignment post electrode 10a as a mask. In the semiconductor device formation region 21, the underlying metal layer 8 is left only under each interconnection 9, as shown in FIG. 15. In the alignment mark formation region 22, the underlying metal layer 8 is left only under the alignment post electrode 10a, as shown in FIG. 16.

Figure 17:
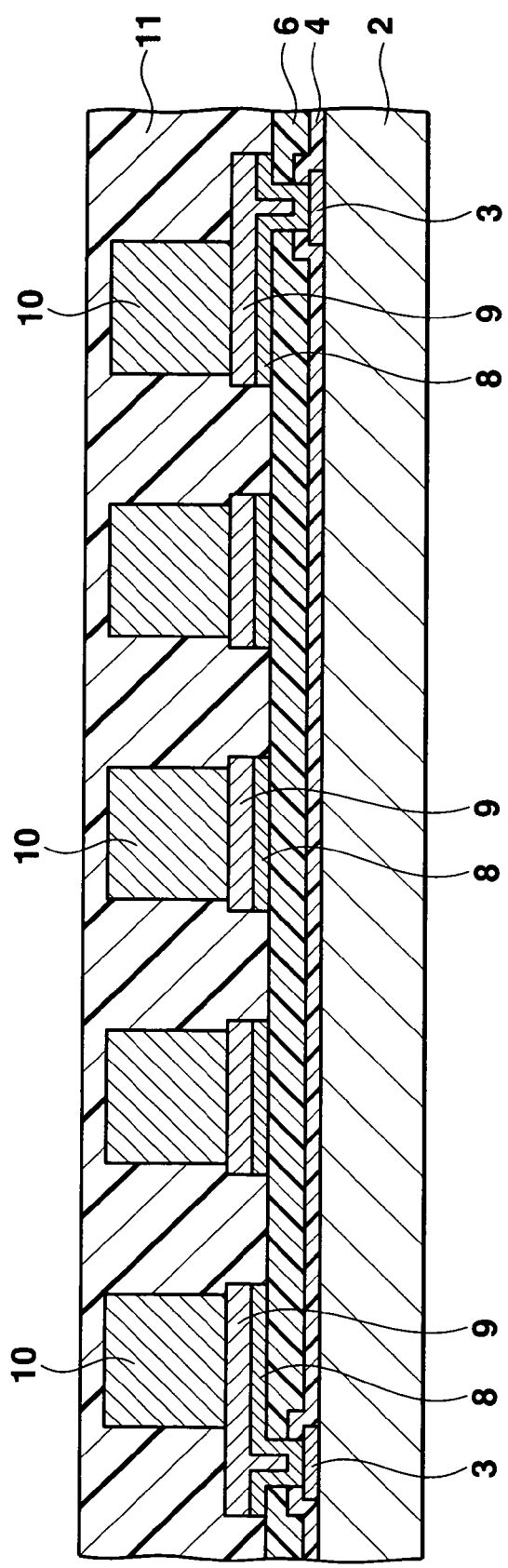
FIG. 17 is an enlarged sectional view showing the semiconductor device formation region in a step following FIG. 15.

As shown in FIG. 17, the sealing film 11 made of, e.g., epoxy resin is formed on the entire upper surface of the protective film 6, including the post electrodes 10 and interconnections 9 (and alignment post electrode 10a), such that the thickness becomes slightly larger than the height of the post electrodes 10 (and alignment post electrode 10a). Hence, in this state, the upper surfaces of the post electrodes 10 (and alignment post electrode 10a) are covered with the sealing film 11.

Figure 18:
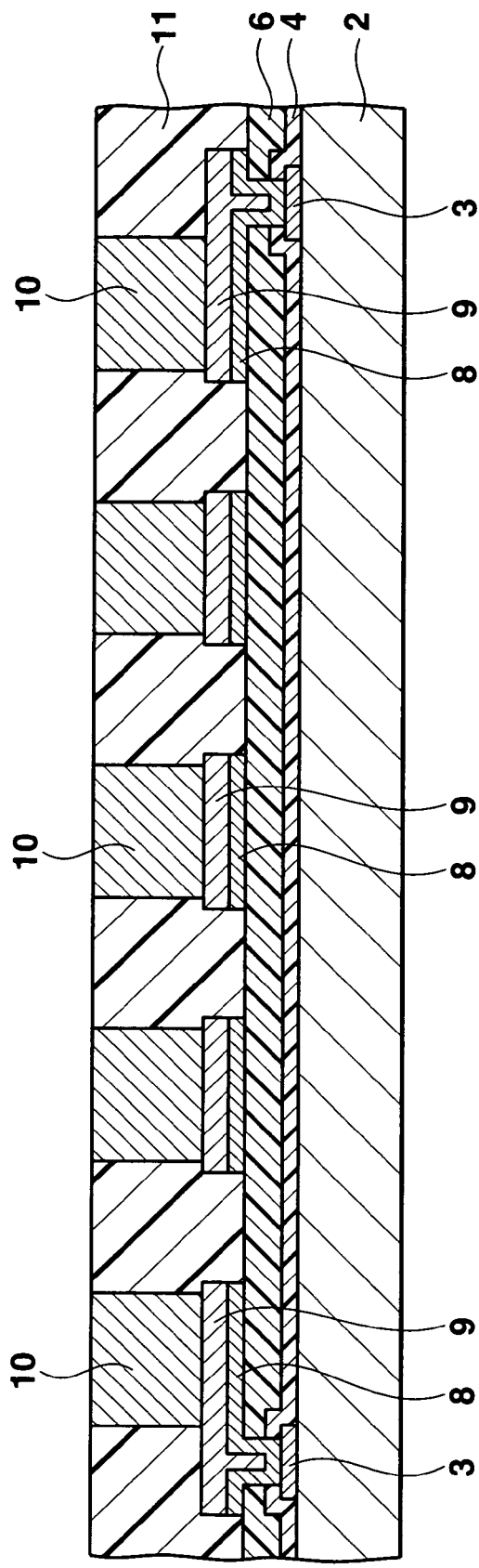
FIG. 18 is an enlarged sectional view showing the semiconductor device formation region in a step following FIG. 17.

The upper surface sides of the sealing film 11 and then post electrodes 10 (and alignment post electrode 10a) are appropriately polished and removed. Accordingly, as shown in FIG. 18, the upper surfaces of the post electrodes 10 (and alignment post electrode 10a) are exposed from the sealing film 11. The exposed upper surfaces of the post electrodes 10 (and alignment post electrode 10a) are flush with the upper surface of the sealing film 11.

Figure 19:
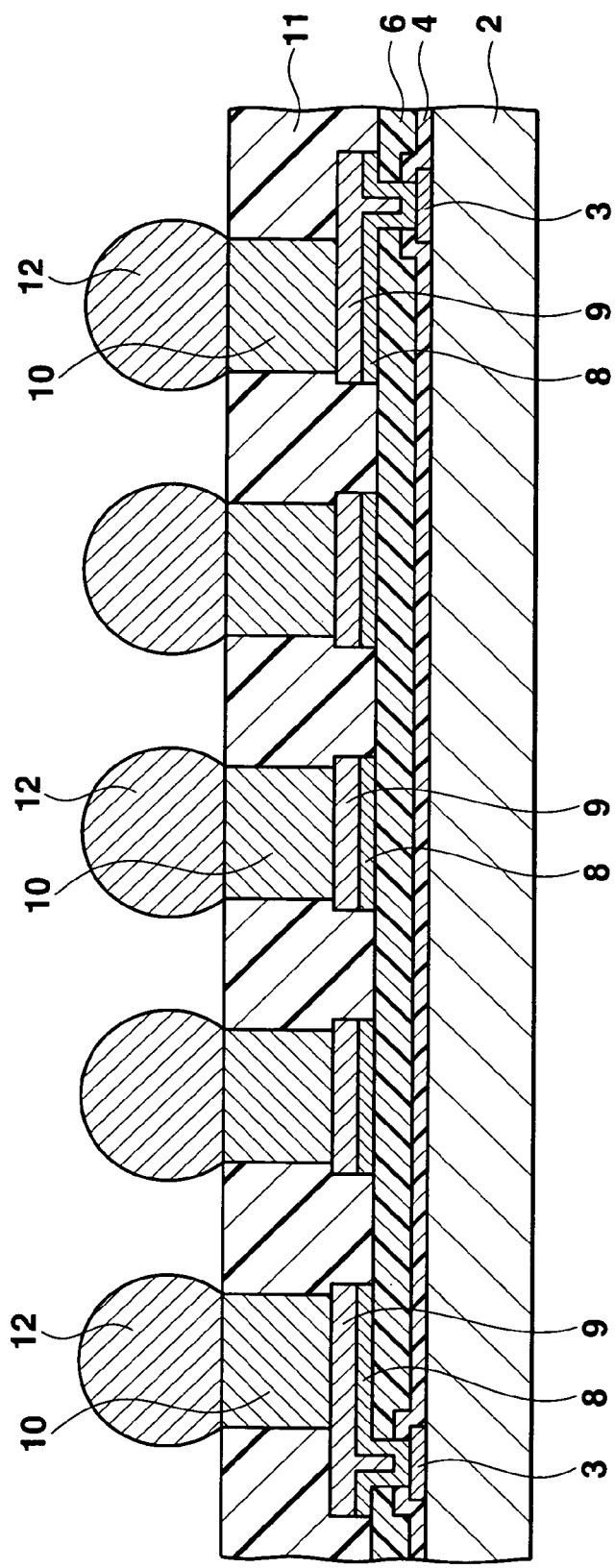
FIG. 19 is an enlarged sectional view showing the semiconductor device formation region in a step following FIG. 18.

As shown in FIG. 19, the solder balls 12 are formed on the exposed upper surfaces of the post electrodes 10. Next, predetermined marks (marking) are formed at predetermined portions on the lower surface of the silicon substrate 2 in regions corresponding to the semiconductor device formation regions 21. Finally, a dicing step is executed to obtain a plurality of semiconductor devices shown in FIGS. 1 and 2. In addition, four elements with alignment marks shown in FIGS. 3 and 4 are obtained.

In the step of forming the solder balls 12, the mark (marking) formation step, and the dicing step after the step of forming the post electrodes 10, alignment of the silicon substrate 2 in the wafer state are necessary. Additionally, in some cases, a solder layer is formed on the upper surface of each post electrode 10 before formation of the solder balls 12 on the upper surfaces of the post electrodes 10. Even in this case, alignment is necessary. Even when an electrical contact test process is to be executed after the mark (marking) formation step before the dicing step, alignment of the silicon substrate 2 in the wafer state is necessary. In this case, the alignment post electrodes 10a formed in the alignment mark formation regions 22 are used as alignment marks.

More specifically, the alignment post electrodes 10a are formed in the alignment mark formation regions 22 having the same planar size as that of the semiconductor device formation regions 21 where the post electrodes 10 are formed. For this reason, even when the step exposure method is employed, the alignment post electrodes 10a formed in the alignment mark formation regions 22 can easily be recognized as alignment marks in aligning the silicon substrate 2 in the wafer state. Hence, any alignment mark recognition error can be prevented.

Furthermore, in this case, the alignment post electrodes 10a have an almost cross planar shape, unlike the post electrodes 10 having a circular planar shape. For this reason, any alignment mark recognition error can reliably be prevented without confusion between the alignment post electrodes 10a and the post electrodes 10.

Second Embodiment

Figure 20:
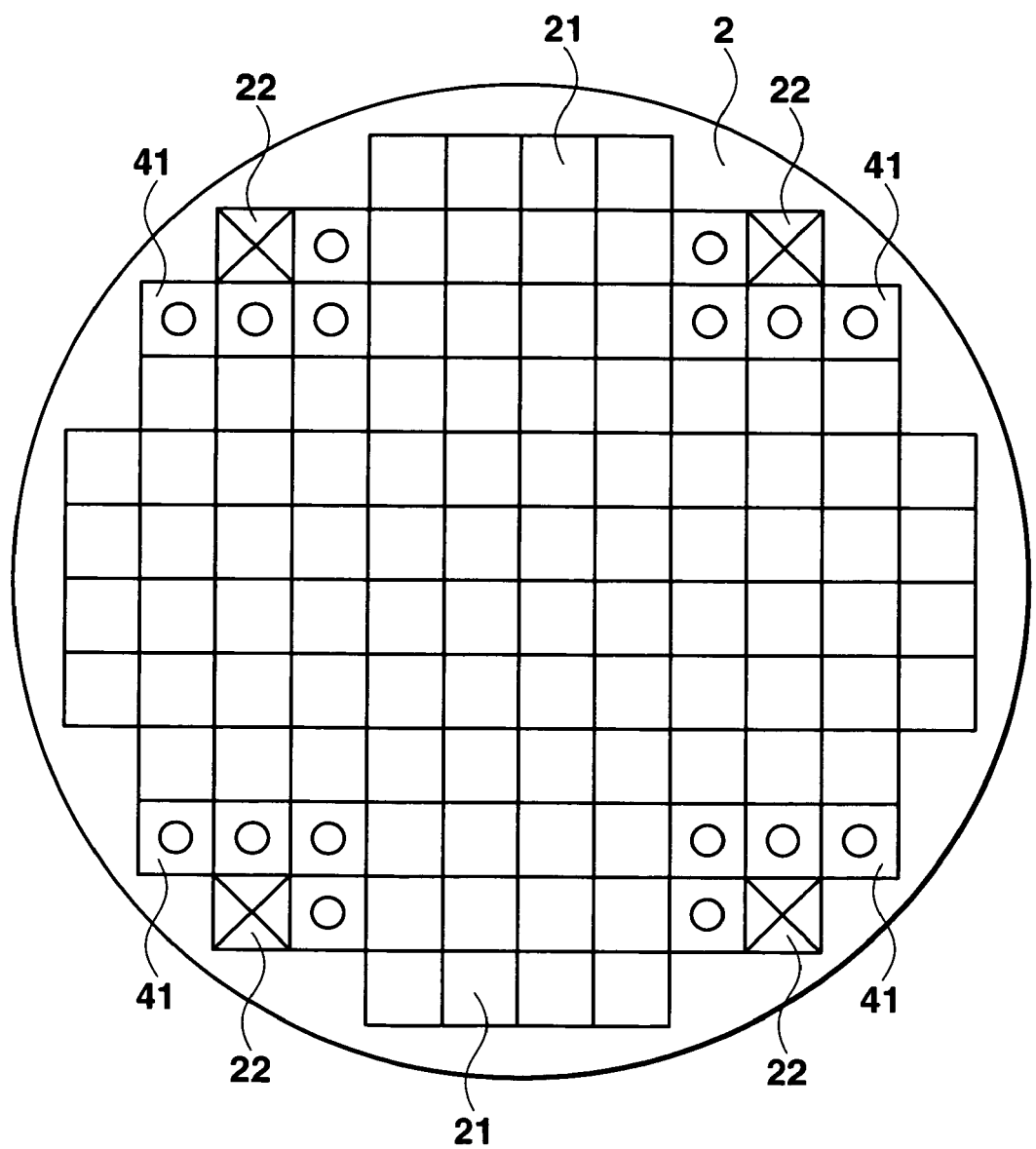
FIG. 20 is a plan view showing a silicon substrate in a wafer state so as to explain the second embodiment of the present invention.

For example, as in the second embodiment of the present invention shown in FIG. 20, regions marked with ◯ around alignment mark formation regions 22 may be non-semiconductor device formation regions 41 each having the same planar size as a semiconductor device formation region 21 and having no post electrode. In this case, since the non-semiconductor device formation regions 41 having no post electrode exist between the alignment mark formation regions 22 and semiconductor device formation regions 21, any alignment mark recognition error can more reliably be prevented.

Figure 21:
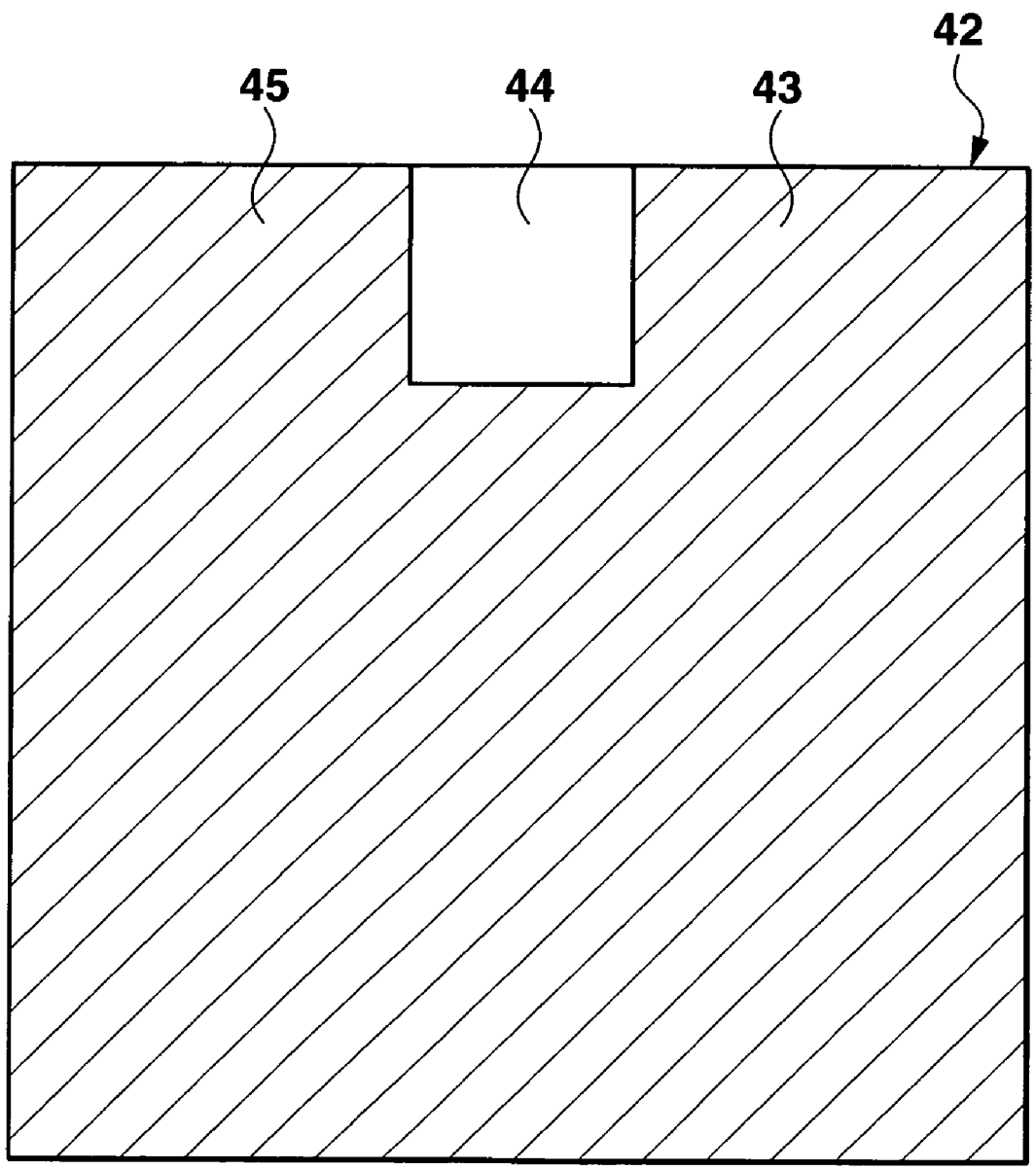
FIG. 21 is a plan view of a third exposure mask.

A method of forming the non-semiconductor device formation regions 41 shown in FIG. 20 will be described next. In this case, a third exposure mask 42 shown in FIG. 21 is prepared in advance in addition to first exposure mask 24 and second exposure mask 25. In the third exposure mask 42, a square glass plate 43 has a transparent portion 44 in an entire predetermined region corresponding to the non-semiconductor device formation region 41. A light-shielding portion 45 is formed around the transparent portion 44.

First step exposure is executed for the semiconductor device formation regions 21 and alignment mark formation regions 22 on the entire surface of a silicon substrate 2 by using the first exposure mask 24. Next, exposure for the four alignment mark formation regions 22 is executed by using the second exposure mask 25. With this process, each alignment mark formation region 22 is entirely exposed except an unexposed portion 23b shown in FIG. 12.

After that, exposure is executed by using the glass plate 43 while aligning the edge portion of the transparent portion 44 of the third exposure mask 42 with the edge portion of the non-semiconductor device formation region 41. Alignment and exposure by the third exposure mask 42 are executed for all the non-semiconductor device formation regions 41 by sequentially moving the third exposure mask 42 to each of them. By this exposure, the plating resist film in the non-semiconductor device formation region 41 entirely changes to an exposed portion. Even when development is performed, no opening portion is formed in the plating resist film in this region. Hence, even when electroplating is executed, no post electrode is formed in this region so that the non-semiconductor device formation region 41 is formed. In this case, in the non-semiconductor device formation region 41, an underlying metal layer is formed on the entire upper surface of the protective film in the initial state. However, no re-interconnection is formed on the upper surface of the underlying metal layer. Furthermore, no post electrode is formed, as described above. Hence, the underlying metal layer formed on the entire upper surface of the protective film in the initial state is totally removed.

Figure 22:
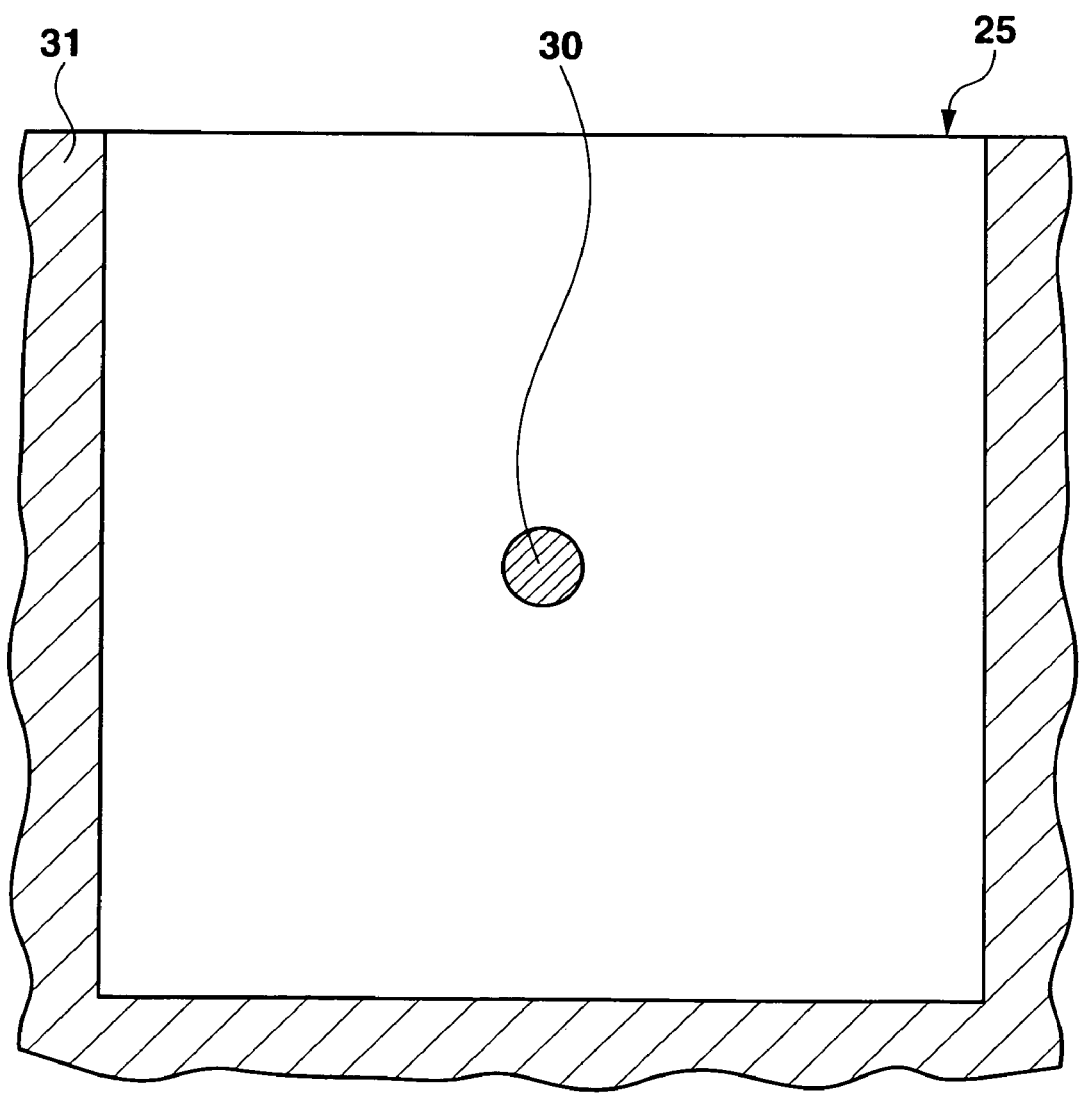
FIG. 22 is a plan view showing the first modification of the second exposure mask.
Figure 23:
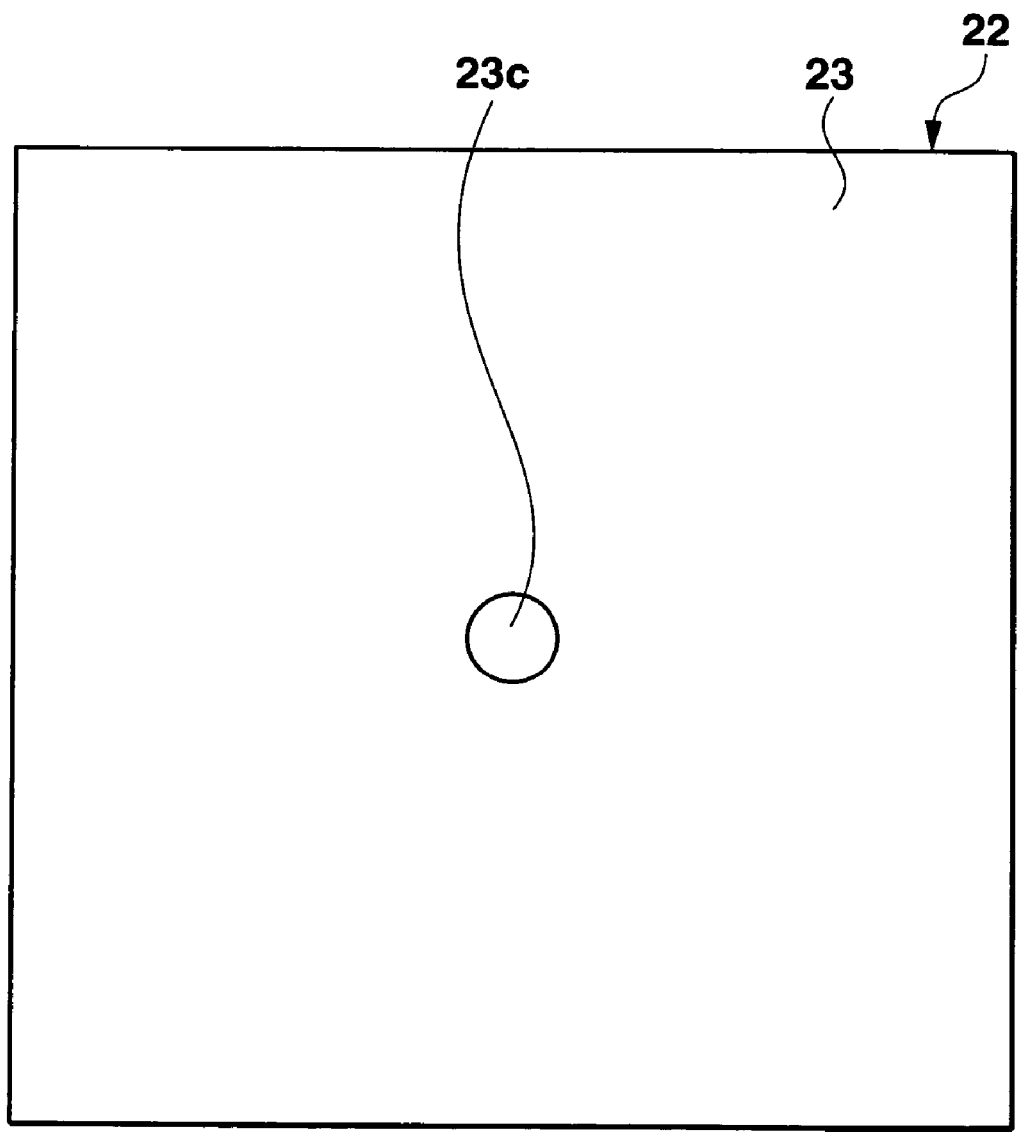
FIG. 23 is a plan view for explaining the exposed state of a plating resist film in an alignment mark formation region when the first modification of the second exposure mask shown in FIG. 22 is used.

As the first modification of the second exposure mask 25, for example, as shown in FIG. 22, an exposure mask having a circular light-shielding portion 30 having a diameter equal to or slightly larger than that of a circular light-shielding portion 27 of the first exposure mask 24 is used. In this case, as indicated by a circle in FIG. 23, an unexposed portion 23c is formed on a plating resist film 23 at only a portion corresponding to the alignment post electrode formation region in the alignment mark formation region 22. A circular alignment post electrode 10a having a planar shape corresponding to the unexposed portion 23c, i.e., the same planar shape as that of a post electrode 10 is formed. Even in this case, the alignment post electrode 10a is formed in the alignment mark formation region 22. Hence, the alignment post electrode can easily be recognized as an alignment mark, and any alignment mark recognition error can be prevented. The alignment post electrode may have a triangular, rectangular such as square, or any other planar shape.

Figure 24:
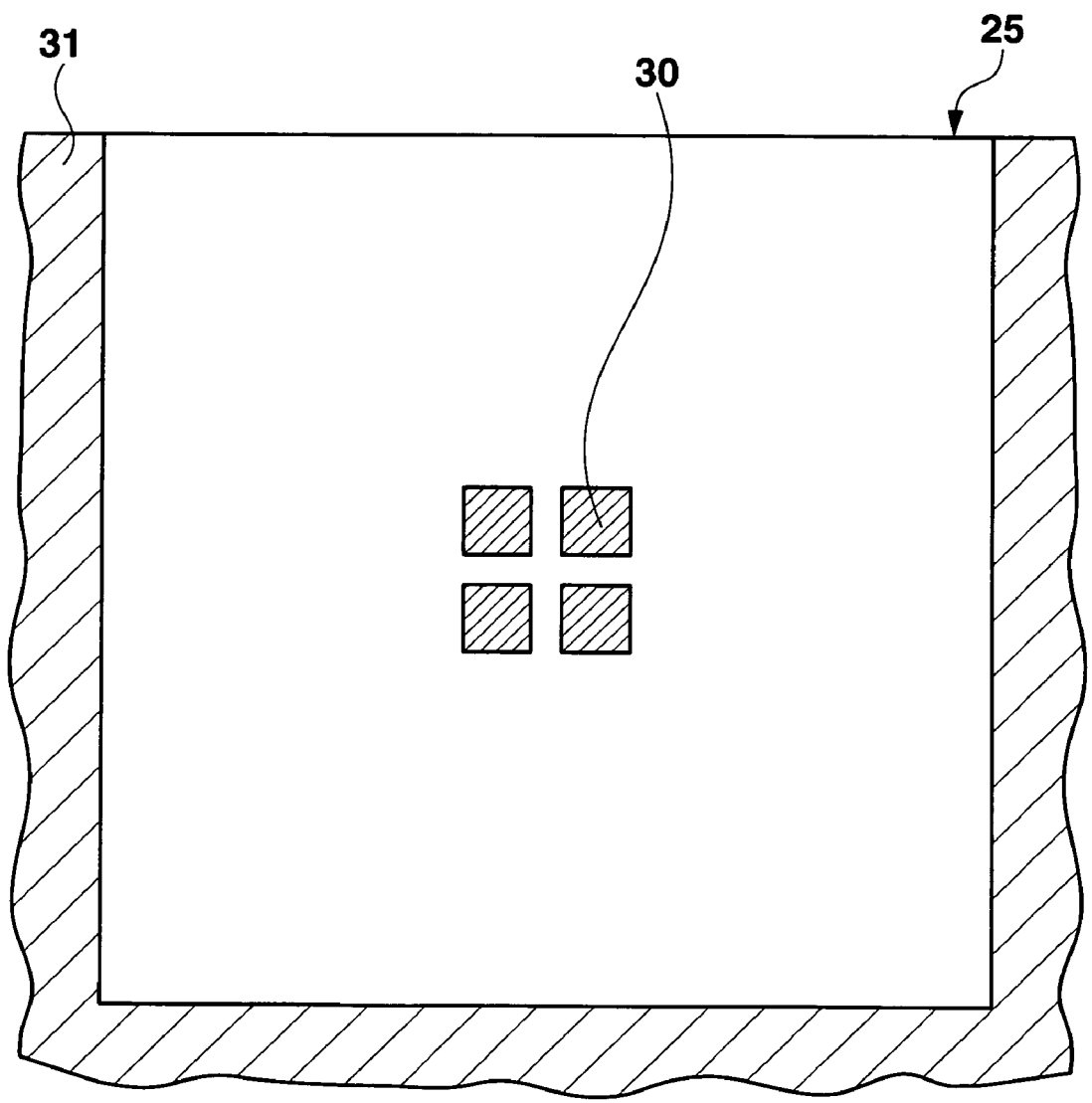
FIG. 24 is a plan view showing the second modification of the second exposure mask.
Figure 25:
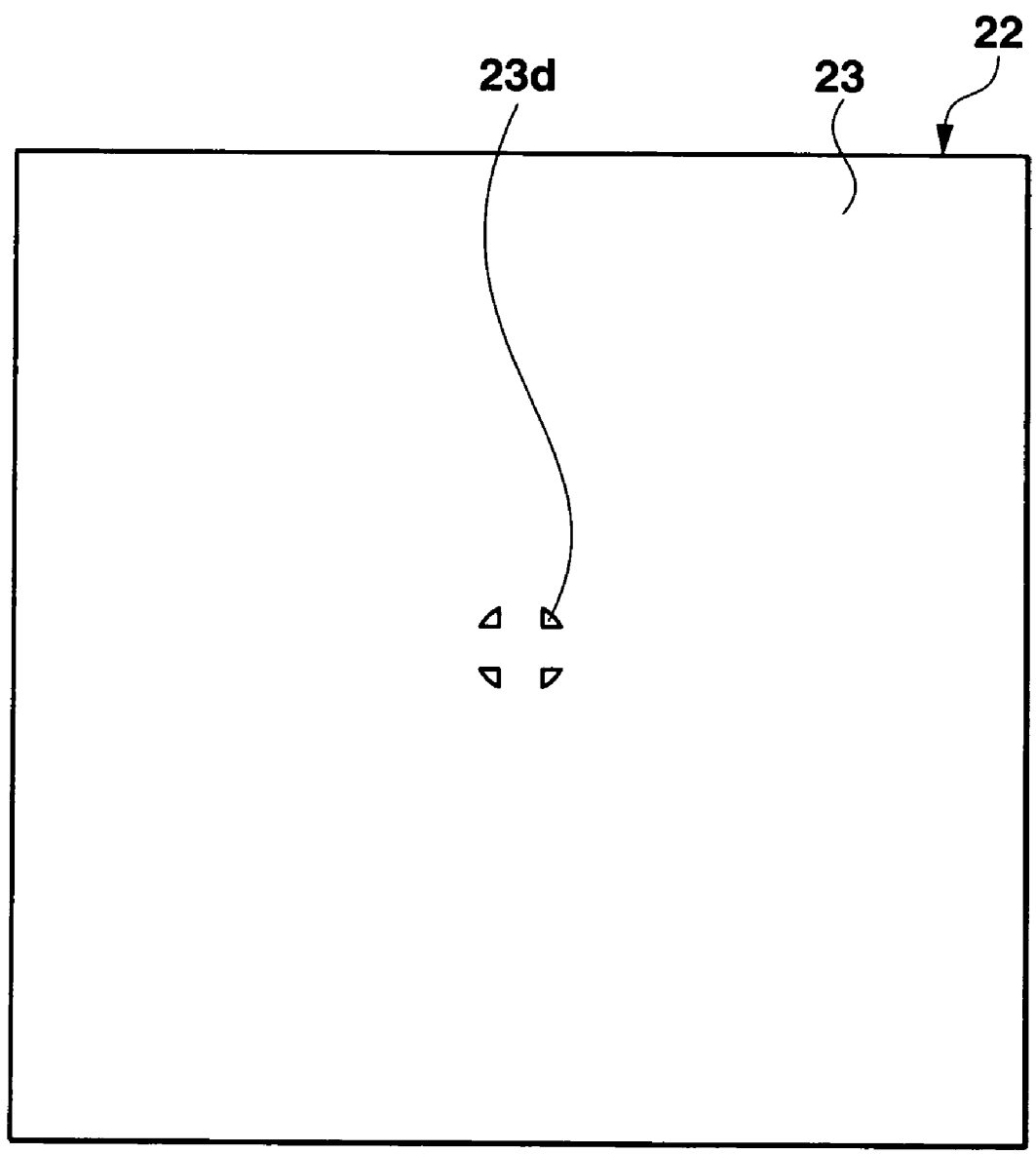
FIG. 25 is a plan view for explaining the exposed state of the plating resist film in the alignment mark formation region when the second modification of the second exposure mask shown in FIG. 24 is used.

As the second modification of the second exposure mask 25, for example, as shown in FIG. 24, an exposure mask having a cross transparent portion between four square light-shielding portions 30 is used. In this case, as indicated by four quarter circles in FIG. 25, an unexposed portion 23d is formed on the plating resist film 23 at only a portion corresponding to the alignment post electrode formation region in the alignment mark formation region 22. An alignment post electrode having a planar shape corresponding to the unexposed portion 23d is formed.

An exposure mask prepared by forming the first exposure mask 24 and second exposure mask 25 on a single glass plate may be used. Alternatively, an exposure mask prepared by forming the first exposure mask 24, second exposure mask 25, and third exposure mask 42 on a single glass plate may be used.

Third Embodiment

Figure 26:
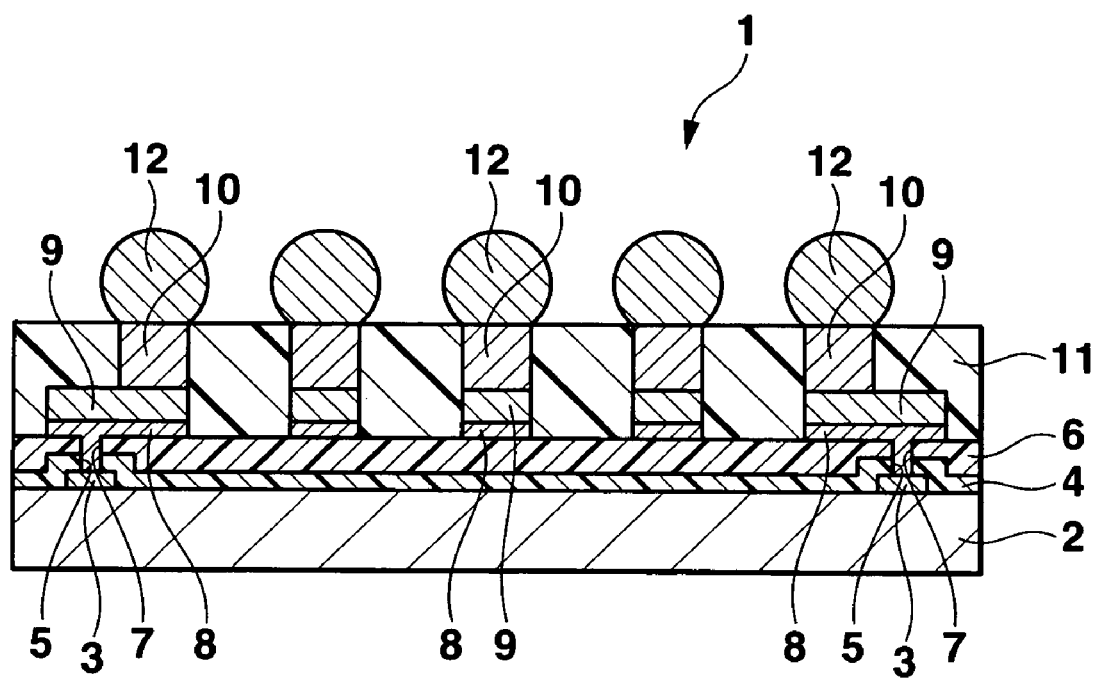
FIG. 26 is an enlarged sectional view for explaining the third embodiment of the present invention, which is taken along a line II-II in FIG. 1.

FIG. 26 is a sectional view taken along a line II-II in FIG. 1. A semiconductor element 1 is called a CSP (Chip Size Package) and has a silicon substrate 2 having a square planar shape. A semiconductor integrated circuit (not shown) having a predetermined function is formed at the central portion of the upper surface of the silicon substrate 2. A plurality of connection pads 3 made of, e.g., an aluminum-based metal are formed at the peripheral portion of the upper surface and connected to the semiconductor integrated circuit.

An insulating film 4 made of silicon oxide or silicon nitride is formed on the upper surface of the silicon substrate 2 except the central portion of each connection pad 3. The central portion of each connection pad 3 is exposed through an opening portion 5 formed in the insulating film 4. A protective film (insulating film) 6 made of epoxy resin or polyimide resin is formed on the upper surface of the insulating film 4. In this case, an opening portion 7 is formed in the protective film 6 at a portion corresponding to the opening portion 5 of the insulating film 4.

An underlying metal layer 8 made of copper or the like is formed from the upper surface of each connection pad 3 exposed through the opening portions 5 and 7 to a predetermined portion of the upper surface of the protective film 6. Interconnections 9 made of copper are formed on the upper surface of the underlying metal layer 8. Post electrodes 10 made of copper are formed on the upper surfaces of the connection pad portions of the interconnections 9.

A sealing film 11 made of epoxy resin or polyimide region is formed on the upper surface of the protective film 6 including the interconnections 9 such that the upper surface becomes flush with the upper surfaces of the post electrodes 10. Hence, the upper surfaces of the post electrodes 10 are exposed. In this case, each post electrode 10 has a circular planar shape. Solder balls 12 are formed on the exposed upper surfaces of the post electrodes 10.

Figure 27:
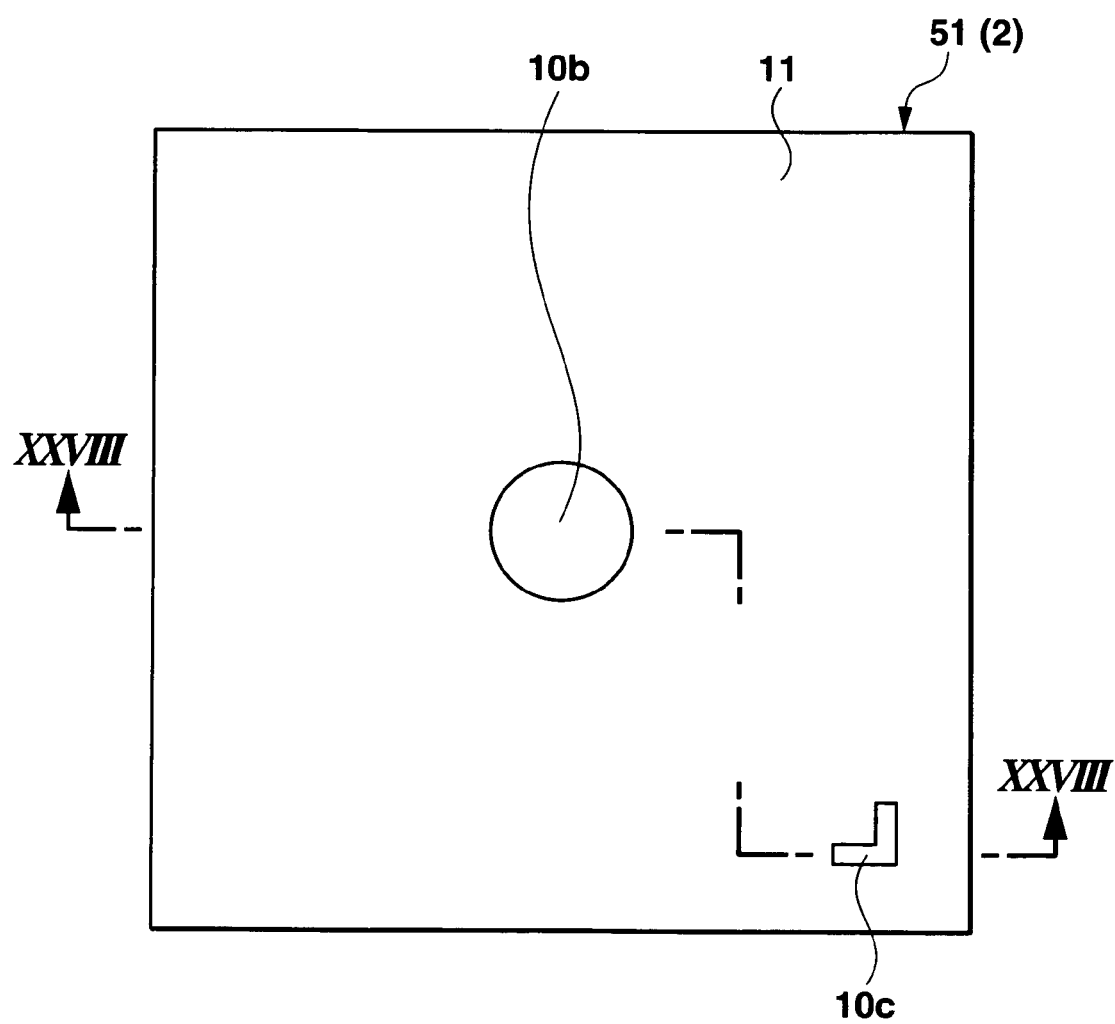
FIG. 27 is a plan view showing an example of an element with alignment marks, which is obtained simultaneously when the semiconductor device shown in FIGS. 1 and 26 is manufactured.
Figure 28:
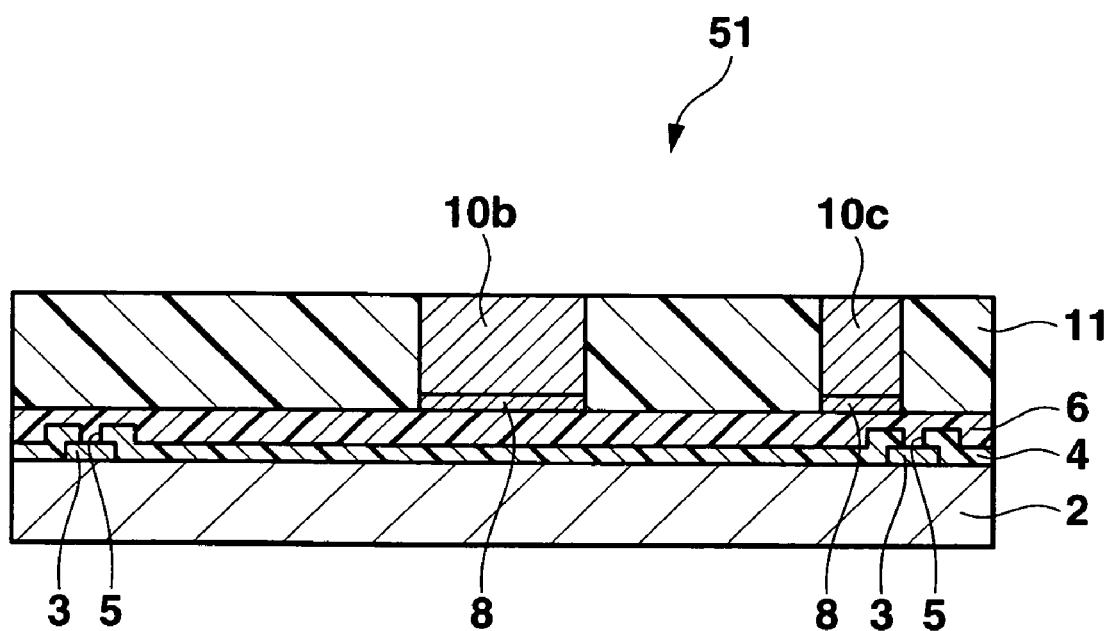
FIG. 28 is an enlarged sectional view taken along a line XXVIII-XXVIII in FIG. 27.

FIG. 27 is a plan view showing an example of an element with an alignment mark, which is obtained simultaneously when the semiconductor element 1 shown in FIGS. 1 and 26 is manufactured. FIG. 28 is a sectional view taken along a line XXVIII-XXVIII in FIG. 27. The structure of part of an element 51 with an alignment mark is the same as the structure of part of the semiconductor element 1.

More specifically, at part of the element 51 with an alignment mark, a semiconductor integrated circuit (not shown) having a predetermined function is formed at the central portion of the upper surface of the silicon substrate 2 which has the same planar size as that of the silicon substrate 2 of the semiconductor element 1. The plurality of connection pads 3 are formed at the peripheral portion of the upper surface and connected to the semiconductor integrated circuit. The insulating film 4 is formed on the upper surface of the silicon substrate 2 except the central portion of each connection pad 3. The central portion of each connection pad 3 is exposed through the opening portion formed in the insulating film 4.

At the remaining portion of the element 51 with an alignment mark, the protective film 6 is formed on the upper surface of the insulating film 4, including the upper surface of each connection pad 3 exposed through the opening portion 5. In this case, the protective film 6 has no opening portion at a portion corresponding to the opening portion 5 of the insulating film 4. The underlying metal layers 8 are formed at the central portion and lower right portion of the upper surface of the protective film 6. A temporary alignment post electrode 10b and a final alignment post electrode 10c are formed on the upper surfaces of the underlying metal layers 8. The sealing film 11 is formed on the upper surface of the protective film 6 such that the upper surface becomes flush with the upper surfaces of the two alignment post electrodes 10b and 10c.

In this case, the temporary alignment post electrode 10b has a circular planar shape. The final alignment post electrode 10c has an almost L planar shape, unlike the temporary alignment post electrode 10b having a circular planar shape. The temporary alignment post electrode 10b is used for temporary alignment (to be described later) of the silicon substrate in a wafer state. The temporary alignment post electrode 10b is formed relatively large and has a diameter of about 1 mm. The final alignment post electrode 10c is used for final alignment (to be described later) of the silicon substrate in a wafer state. The final alignment post electrode 10c is formed relatively small. For example, one side of the final alignment post electrode 10c has a length of 0.45 mm and a width of 0.15 mm.

Figure 29:
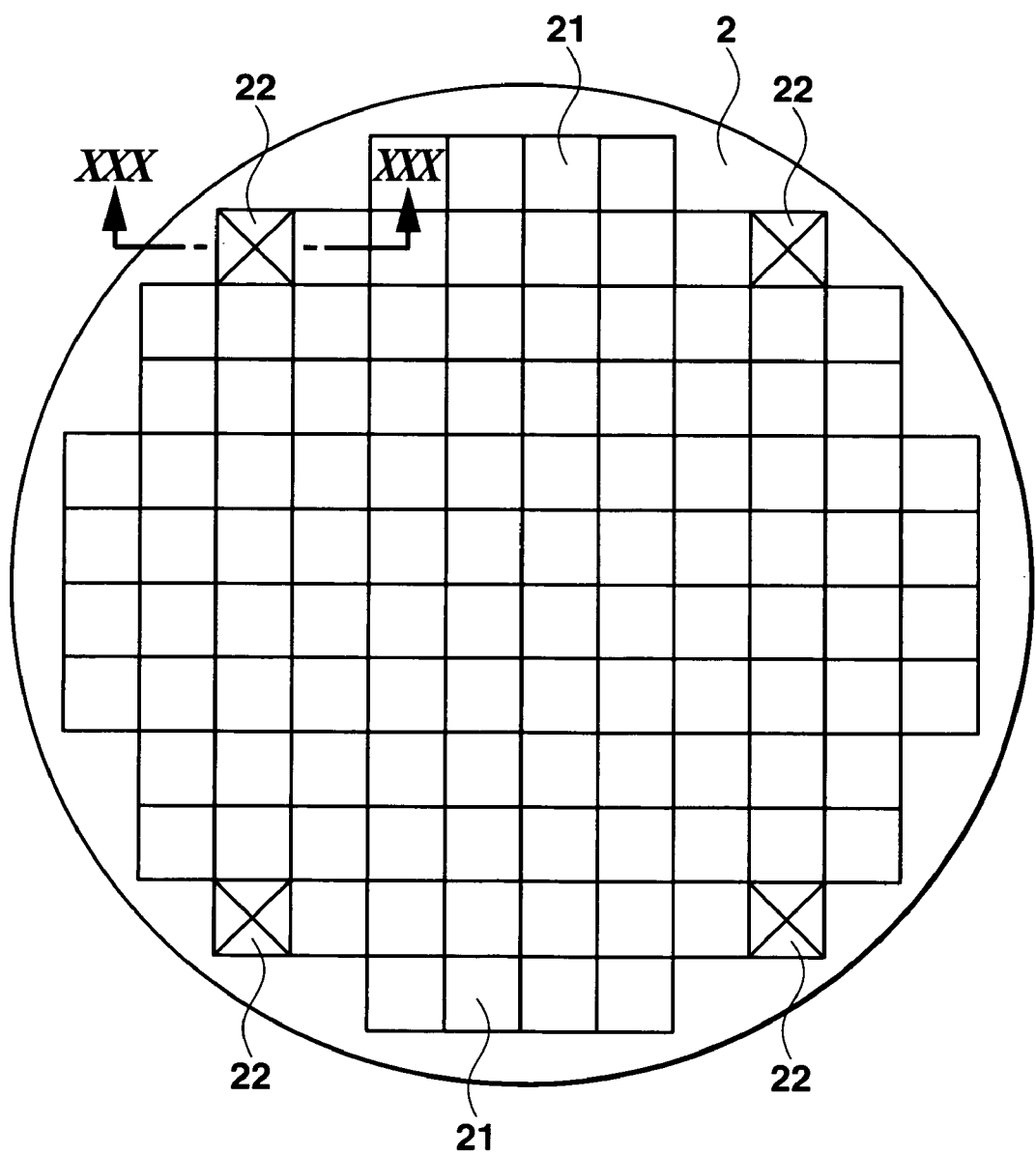
FIG. 29 is a plan view of a silicon substrate in a wafer state, which is initially prepared in manufacturing the semiconductor element of a semiconductor device shown in FIG. 26.

An example of a method of manufacturing the semiconductor element 1 having the above structure will be described next. First, as shown in FIG. 29, the silicon substrate (semiconductor substrate) 2 in a wafer state is prepared. Referring to FIG. 29, each unmarked square region defined by vertical and horizontal lines is a semiconductor device formation region 21. A region marked with X is an alignment mark formation region 22. In this case, the planar size of the alignment mark formation region 22 is the same as that of the semiconductor device formation region 21. In the embodiment, although the alignment mark formation regions 22 are formed at four portions, i.e., the upper left, upper right, lower left, and lower right portions of the silicon substrate 2, a number and location of the alignment mark formation regions 22 are not limited in this design. For example, there may be provided at least three alignment mark formation regions including two alignment mark formation regions located at corner portions of one of a pair of diagonal lines in the upper surface of the semiconductor substrate.

Figure 30:
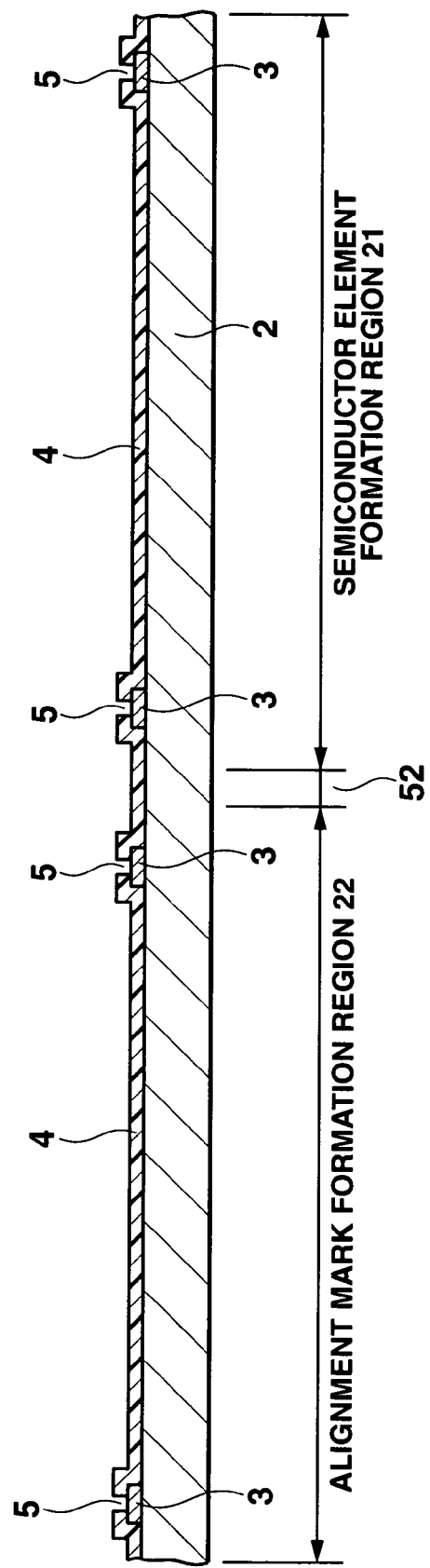
FIG. 30 is a sectional view taken along a line XXX-XXX in FIG. 29.

FIG. 30 is a sectional view taken along a line XXX-XXX in FIG. 29. In this state, the semiconductor device formation region 21 and alignment mark formation region 22 have the same structure. More specifically, a semiconductor integrated circuit (not shown) is formed at the central portion of the upper surface of the silicon substrate 2 in the wafer state in each of the regions 21 and 22. The connection pads 3 made of, e.g., an aluminum-based metal are formed at the peripheral portion of the upper surface and connected to the semiconductor integrated circuit.

The insulating film 4 made of, e.g., silicon oxide is formed on the upper surface of the silicon substrate 2 except the central portion of each connection pad 3. The central portion of each connection pad 3 is exposed through the opening portion 5 formed in the insulating film 4. A dicing line 52 is formed between the alignment mark formation region 22 and the semiconductor device formation region 21.

Exposure masks used in this manufacturing method will be described next with reference to FIGS. 31 and 32. A first exposure mask 62 shown in FIG. 31 has first to fourth fields 63 to 66. In the first field 63, protective film (insulating film) formation exposure masks 63A are formed in a 2 (rows)×2 (columns) matrix in correspondence with four semiconductor device formation regions 21 in a 2 (rows)×2 (columns) matrix. In this case, when a positive photoresist is to be used for pattern formation of the protective film 6, the protective film formation exposure mask 63A has a light-shielding portion (not shown) in a region other than the formation regions of the opening portions 7 of the protective film 6.

In the second field 64, re-interconnection formation exposure masks 64A are formed in a 2 (rows)×2 (columns) matrix in correspondence with four semiconductor device formation regions 21 in a 2 (rows)×2 (columns) matrix. In this case, when a positive photoresist is to be used to form the interconnections 9 by electroplating, the re-interconnection formation exposure mask 64A has a light-shielding portion (not shown) in a region other than the formation regions of the interconnections 9.

In the third field 65, post electrode formation exposure masks 65A are formed in a 2 (rows)×2 (columns) matrix in correspondence with four semiconductor device formation regions 21 in a 2 (rows)×2 (columns) matrix. In this case, when a negative photoresist is to be used to form the post electrodes 10 by electroplating, the post electrode formation exposure mask 65A has circular light-shielding portions 65a at portions corresponding to the formation regions of the post electrodes 10.

The fourth field 66 is a blank field. Since a second exposure mask 71 shown in FIG. 32 has first to fourth fields 72 to 75 as effective fields, as will be described later, the number of fields in the first exposure mask 62 is made equal to that in the second exposure mask 71 by preparing the fourth field 66 as a blank field.

Figure 32:
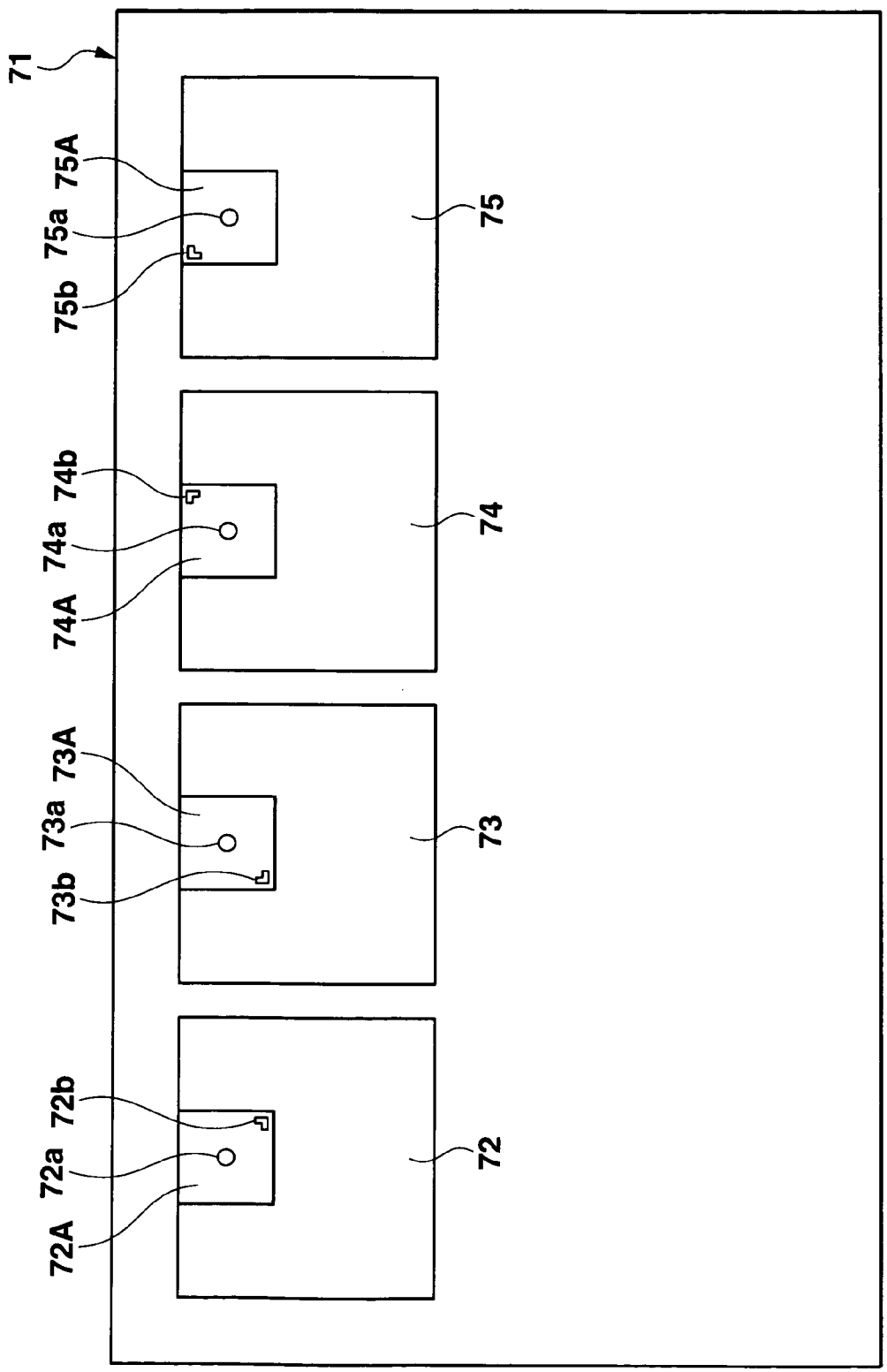
FIG. 32 is a plan view of the first exposure mask to be used in forming the semiconductor device shown in FIG. 26.

The second exposure mask 71 shown in FIG. 32 has the first to fourth fields 72 to 75. In the first field 72, one alignment post electrode formation exposure mask 72A is formed in correspondence with the alignment mark formation region 22 at the upper left portion in FIG. 29. In this case, the alignment post electrode formation exposure mask 72A has a circular light-shielding portion 72a at the central portion. An almost L-shaped light-shielding portion 72b is formed at the lower right portion along the lower right corner of the exposure mask.

In the second field 73, one alignment post electrode formation exposure mask 73A is formed in correspondence with the alignment mark formation region 22 at the upper right portion in FIG. 29. In this case, the alignment post electrode formation exposure mask 73A has a circular light-shielding portion 73a at the central portion. An almost L-shaped light-shielding portion 73b is formed at the lower left portion along the lower left corner of the exposure mask.

In the third field 74, one alignment post electrode formation exposure mask 74A is formed in correspondence with the alignment mark formation region 22 at the lower left portion in FIG. 29. In this case, the alignment post electrode formation exposure mask 74A has a circular light-shielding portion 74a at the central portion. An almost L-shaped light-shielding portion 74b is formed at the upper right portion along the upper right corner of the exposure mask.

In the fourth field 75, one alignment post electrode formation exposure mask 75A is formed in correspondence with the alignment mark formation region 22 at the lower right portion in FIG. 29. In this case, the alignment post electrode formation exposure mask 75A has a circular light-shielding portion 75a at the central portion. An almost L-shaped light-shielding portion 75b is formed at the upper left portion along the upper left corner of the exposure mask.

Figure 33:
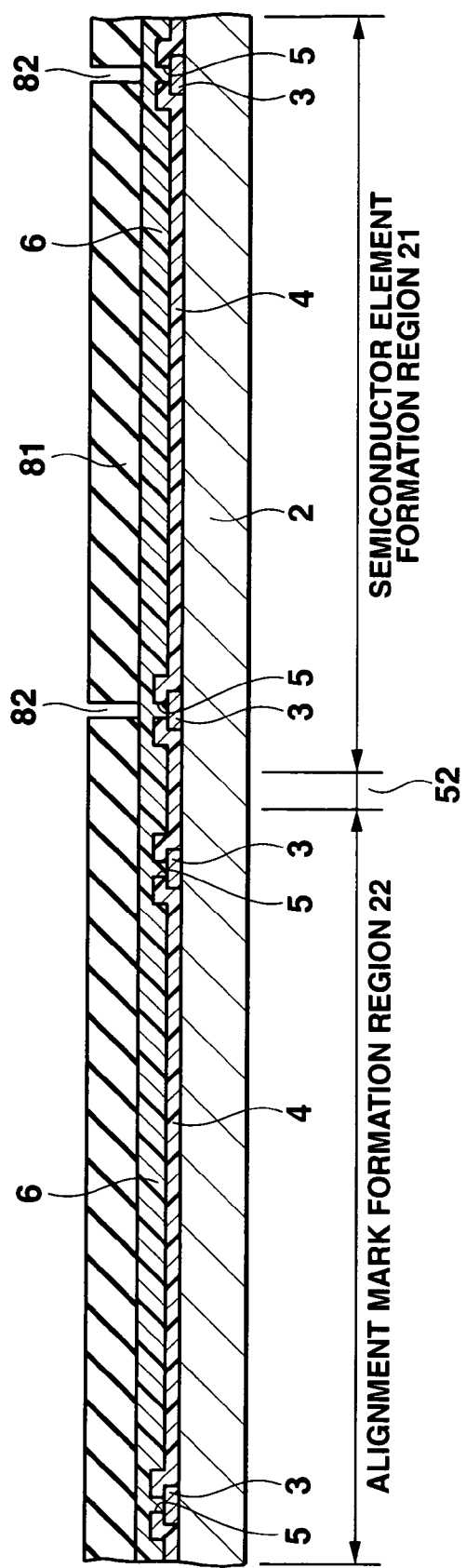
FIG. 33 is an enlarged sectional view for explaining a step following FIG. 30.

When the structure shown in FIG. 30 is prepared, next, as shown in FIG. 33, the protective film 6 made of epoxy resin is formed on the entire upper surface of the insulating film 4, including the upper surface portions of the connection pads 3 exposed through the opening portions 5. A positive resist film 81 is formed on the upper surface of the protective film 6 by patterning. In this case, the positive resist film 81 is formed on the entire upper surface of the protective film 6, and exposure is executed.

Figure 31:
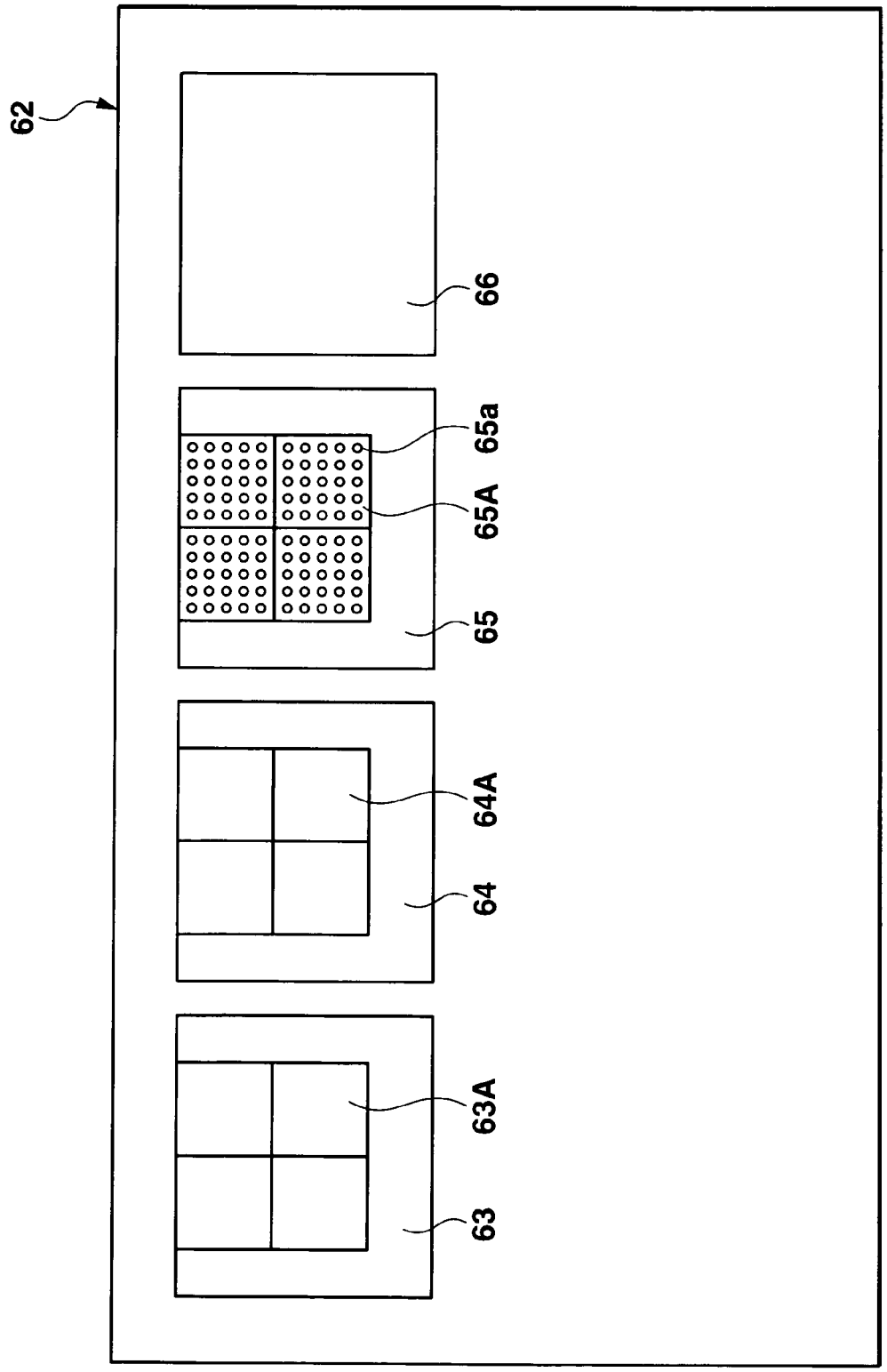
FIG. 31 is a plan view of a first exposure mask to be used in forming the semiconductor device shown in FIG. 26.

More specifically, step exposure is executed for every 2 (rows)×2 (columns) semiconductor device formation regions 21 shown in FIG. 29 by using the protective film formation exposure masks 63A formed in a 2 (rows)×2 (columns) matrix in the first field 63 of the first exposure mask 62 shown in FIG. 31. With this process, portions of the resist film 81 in the semiconductor device formation region 21, which correspond to the opening portions 5 of the insulating film 4, are exposed.

Figure 34:
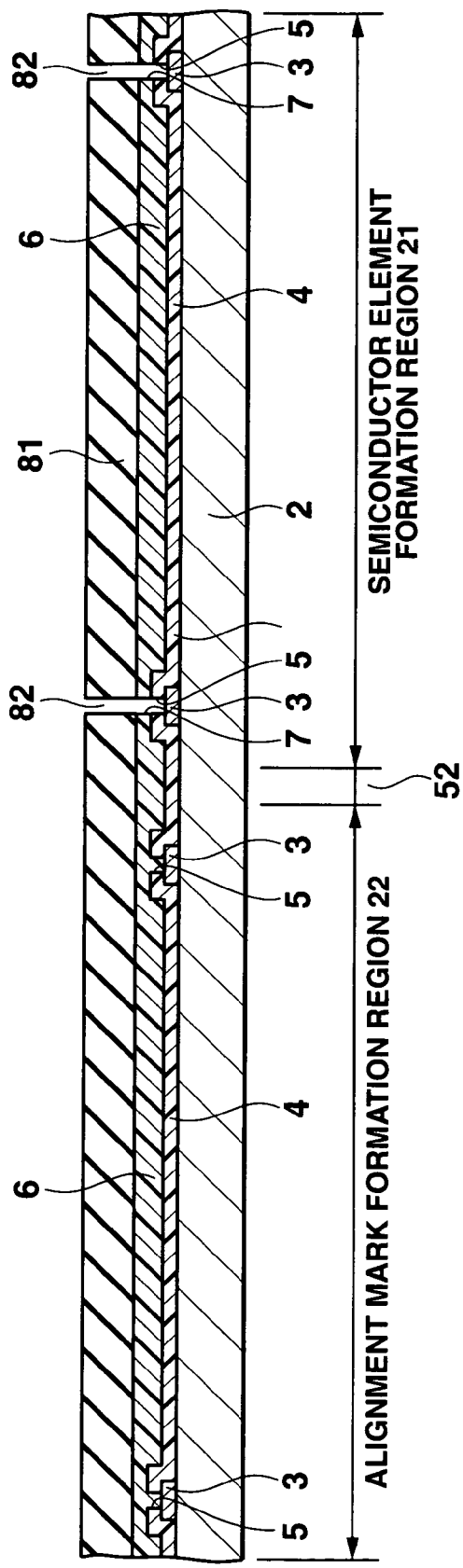
FIG. 34 is an enlarged sectional view for explaining a step following FIG. 33.

Next, development is executed to form opening portions 82 in the resist film 81 at portions corresponding to the opening portions 5 of the insulating film 4. As shown in FIG. 34, the protective film 6 is etched by using the resist film 81 as a mask to form the opening portions 7 in the protective film 6 under the opening portions 82 of the resist film 81. On the other hand, in the alignment mark formation region 22, the resist film 81 is not exposed. Hence, no opening portions are formed in the resist film 81. No opening portions are formed in the protective film 6 at portions corresponding to the opening portions 5 of the insulating film 4, either. The resist film 81 is peeled.

Figure 35:
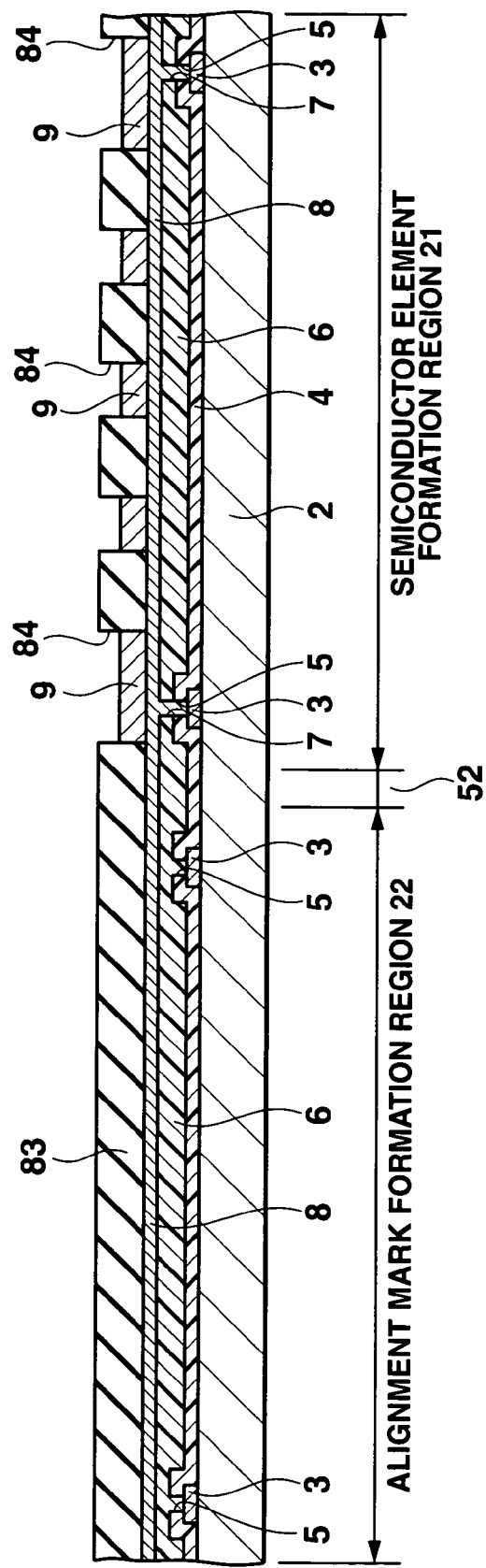
FIG. 35 is an enlarged sectional view for explaining a step following FIG. 34.

As shown in FIG. 35, the underlying metal layer 8 is formed on the entire upper surface of the protective film 6, including the connection pads 3 exposed through the opening portions 5 and 7. In this case, the underlying metal layer 8 may have only a copper layer formed by electroless plating or only a copper layer formed by sputtering. Alternatively, a copper layer may be formed by sputtering on a thin titanium layer formed by sputtering.

A positive resist film 83 is formed on the upper surface of the underlying metal layer 8 by patterning. In this case, the positive resist film 83 is formed on the entire upper surface of the underlying metal layer 8, and exposure is executed. More specifically, step exposure is executed for every 2 (rows)××2 (columns) semiconductor device formation regions 21 shown in FIG. 29 by using the re-interconnection formation exposure masks 64A formed in a 2 (rows)××2 (columns) matrix in the second field 64 of the first exposure mask 62 shown in FIG. 31. With this process, portions of the resist film 83 in the semiconductor device formation region 21, which correspond to the interconnection formation regions, are exposed.

Next, development is executed to form opening portions 84 in the resist film 83 at portions corresponding to the interconnection formation regions. Next, copper electroplating is executed by using the underlying metal layer 8 as a plating current path to form the interconnections 9 on the upper surface of the underlying metal layer 8 in the opening portions 84 of the resist film 83, i.e., the interconnection formation regions. On the other hand, in the alignment mark formation region 22, the resist film 83 is not exposed. Hence, no opening portions are formed in the resist film 83. No re-interconnections are formed on the upper surface of the underlying metal layer 8, either. The resist film 83 is peeled.

Figure 36:
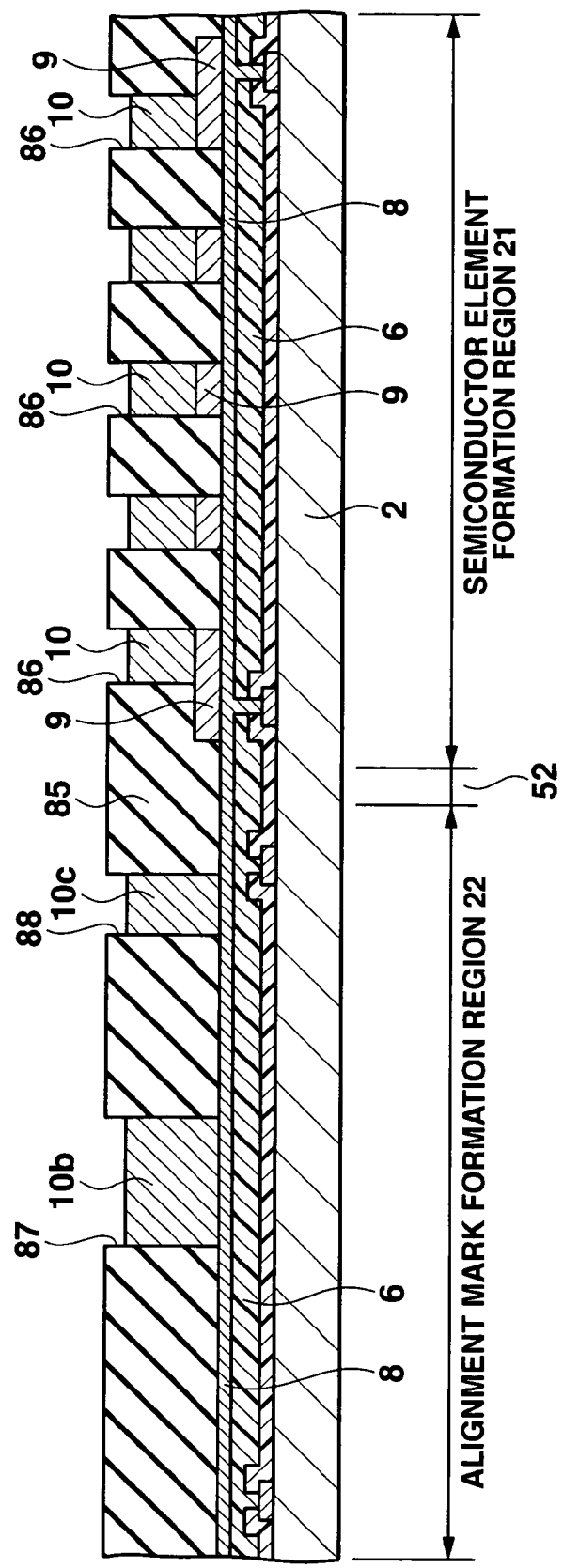
FIG. 36 is an enlarged sectional view for explaining a step following FIG. 35.

As shown in FIG. 36, a negative plating resist film 85 is formed on the upper surface of the underlying metal layer 8, including the interconnections 9, by patterning. In this case, the negative plating resist film 85 is formed on the entire upper surface of the underlying metal layer 8, including the interconnections 9, and exposure is executed. More specifically, step exposure is executed for every 2 (rows)×2 (columns) semiconductor device formation regions 21 shown in FIG. 29 by using the post electrode formation exposure masks 65A formed in a 2 (rows)×2 (columns) matrix in the third field 65 of the first exposure mask 62 shown in FIG. 31. With this process, portions of the resist film 85 in the semiconductor device formation region 21 in FIG. 29, except the portions corresponding to the formation regions of the post electrodes 10, are exposed.

The alignment mark formation region 22 at the upper left portion in FIG. 29 is exposed by using the alignment post electrode formation exposure mask 72A formed in the first field 72 of the second exposure mask 71 shown in FIG. 32. With this process, portions of the resist film 85 in the alignment mark formation region 22 at the upper left portion in FIG. 29, except the portions corresponding to the formation regions of the alignment post electrodes 10b and 10c, are exposed.

The three remaining alignment mark formation regions 22 in FIG. 29 are exposed by using the alignment post electrode formation exposure masks 73A to 75A formed in the second to fourth fields 73 to 75 of the second exposure mask 71 shown in FIG. 32. With this process, portions of the resist film 85 in the three remaining alignment mark formation regions 22 in FIG. 29, except the portions corresponding to the formation regions of the alignment post electrodes 10b and 10c, are exposed.

Next, development is executed. In the semiconductor device formation region 21, opening portions 86 are formed in the resist film 85 at the connection pad portions of the interconnections 9, i.e., in regions corresponding to the formation regions of the post electrodes 10. In the alignment mark formation region 22, opening portions 87 and 88 are formed in the resist film 85 in regions corresponding to the formation regions of the two alignment post electrodes 10b and 10c.

Next, copper electroplating is executed by using the underlying metal layer 8 as a plating current path. Accordingly, in the semiconductor device formation region 21, the post electrodes 10 are formed on the upper surfaces of the connection pad portions of the interconnections 9 in the opening portions 86 of the resist film 85. In the alignment mark formation region 22, the temporary alignment post electrode 10b and final alignment post electrode 10c are formed on the upper surface of the underlying metal layer 8 in the opening portion 87 and 88 of the resist film 85. Next, the resist film 85 is peeled.

Figure 37:
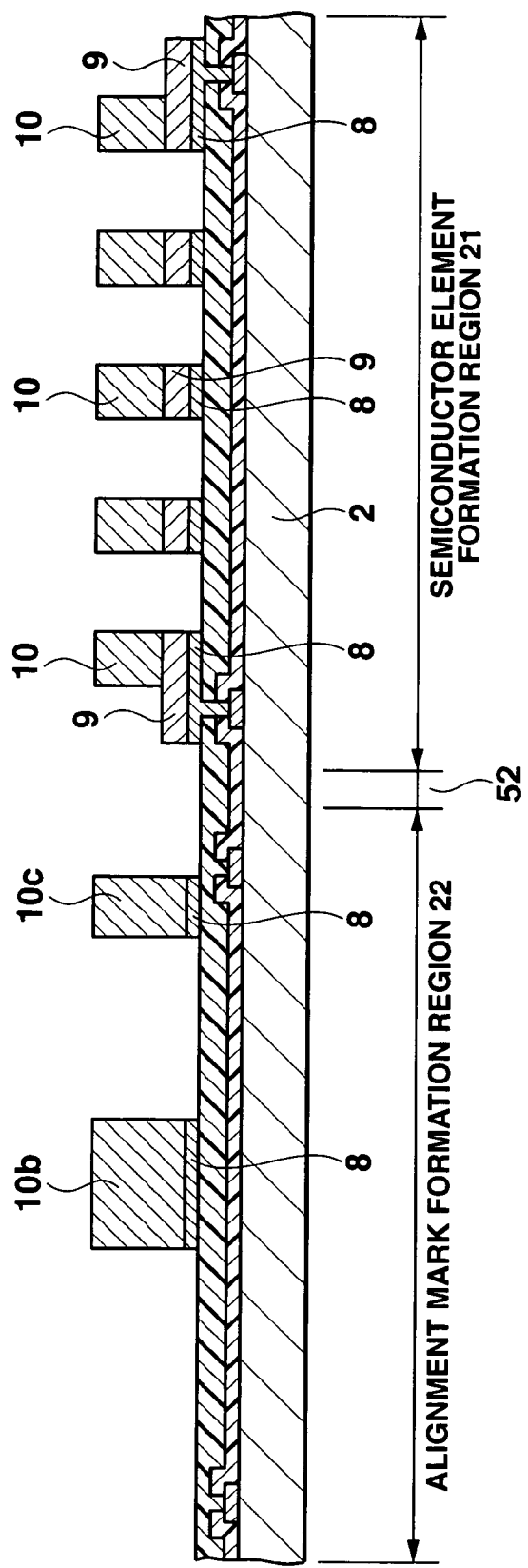
FIG. 37 is an enlarged sectional view for explaining a step following FIG. 36.

As shown in FIG. 37, unnecessary portions of the underlying metal layer 8 are removed by etching by using the interconnections 9 and the two alignment post electrodes 10b and 10c as a mask. In the semiconductor device formation region 21, the underlying metal layer 8 is left only under each interconnection 9. In the alignment mark formation region 22, the underlying metal layer 8 is left only under each of the two alignment post electrodes 10b and 10c.

Figure 38:
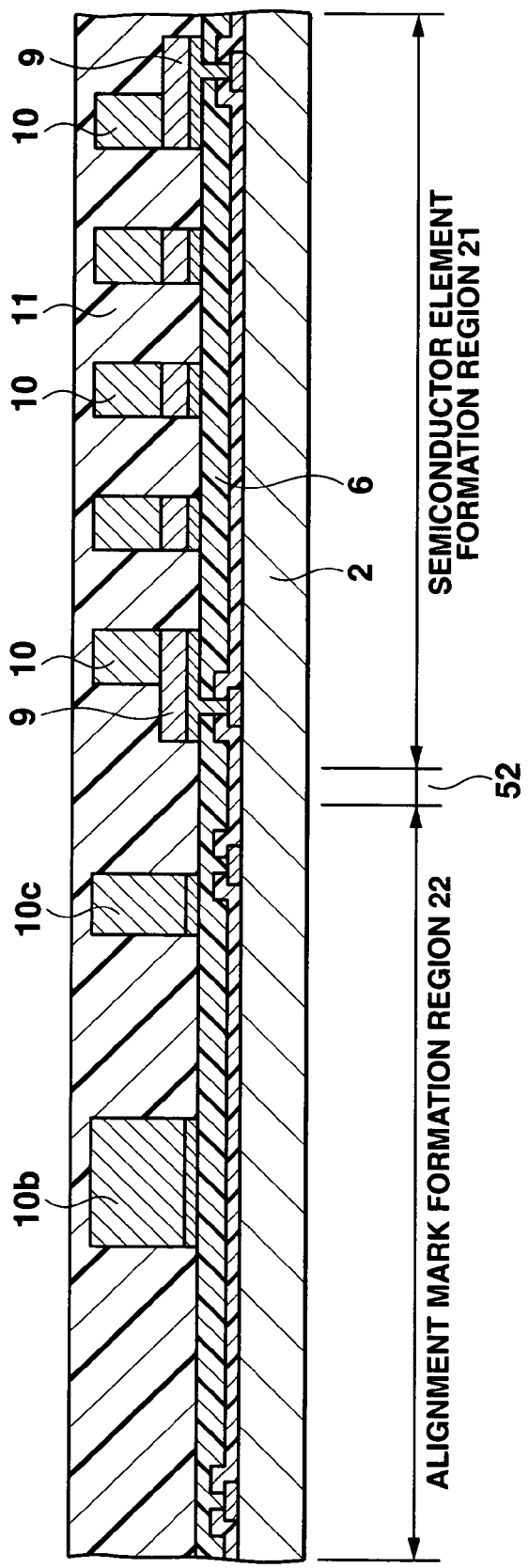
FIG. 38 is an enlarged sectional view for explaining a step following FIG. 37.

As shown in FIG. 38, the sealing film 11 made of, e.g., epoxy resin is formed on the entire upper surface of the protective film 6, including the post electrodes 10, interconnections 9, and two alignment post electrodes 10b and 10c, such that the thickness becomes slightly larger than the height of the post electrodes 10 and two alignment post electrode 10b and 10c. Hence, in this state, the upper surfaces of the post electrodes 10 and two alignment post electrodes 10b and 10c are covered with the sealing film 11.

Figure 39:
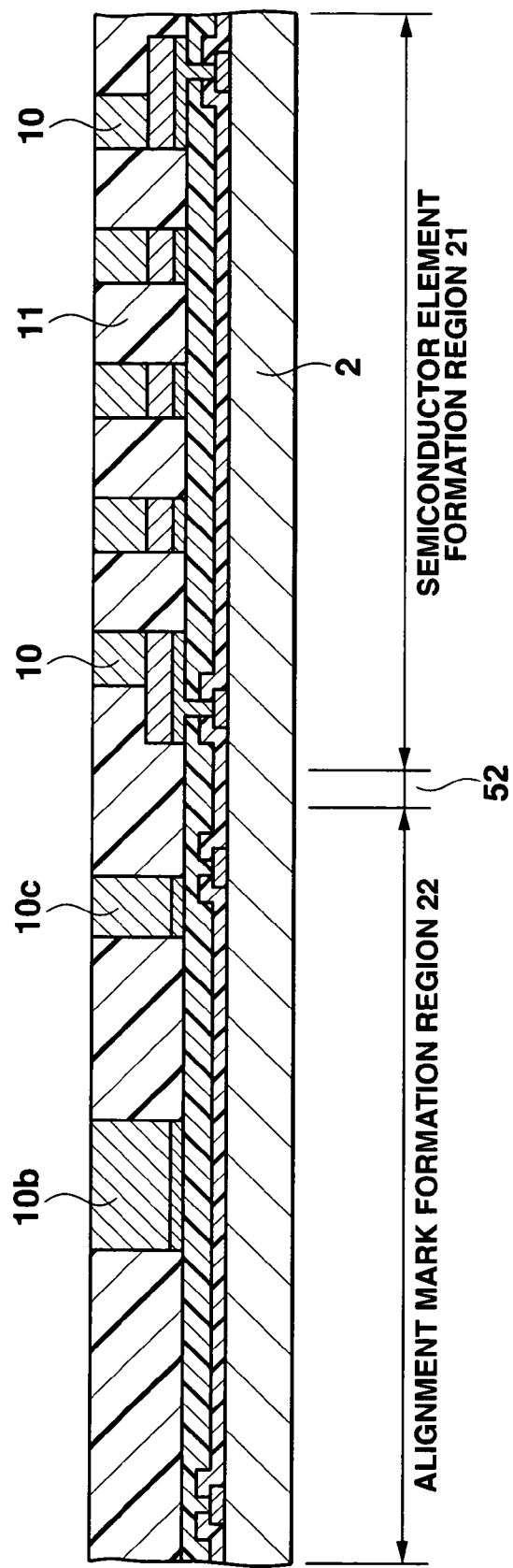
FIG. 39 is an enlarged sectional view for explaining a step following FIG. 38.

The upper surface side of the sealing film 11 and post electrodes 10, and two alignment post electrodes 10b and 10c is appropriately polished and removed. Accordingly, as shown in FIG. 39, the upper surfaces of the post electrodes 10 and two alignment post electrodes 10b and 10c are exposed. In addition, the upper surface of the sealing film 11, including the exposed upper surfaces of the post electrodes 10 and two alignment post electrodes 10b and 10c, are planarized.

Figure 40:
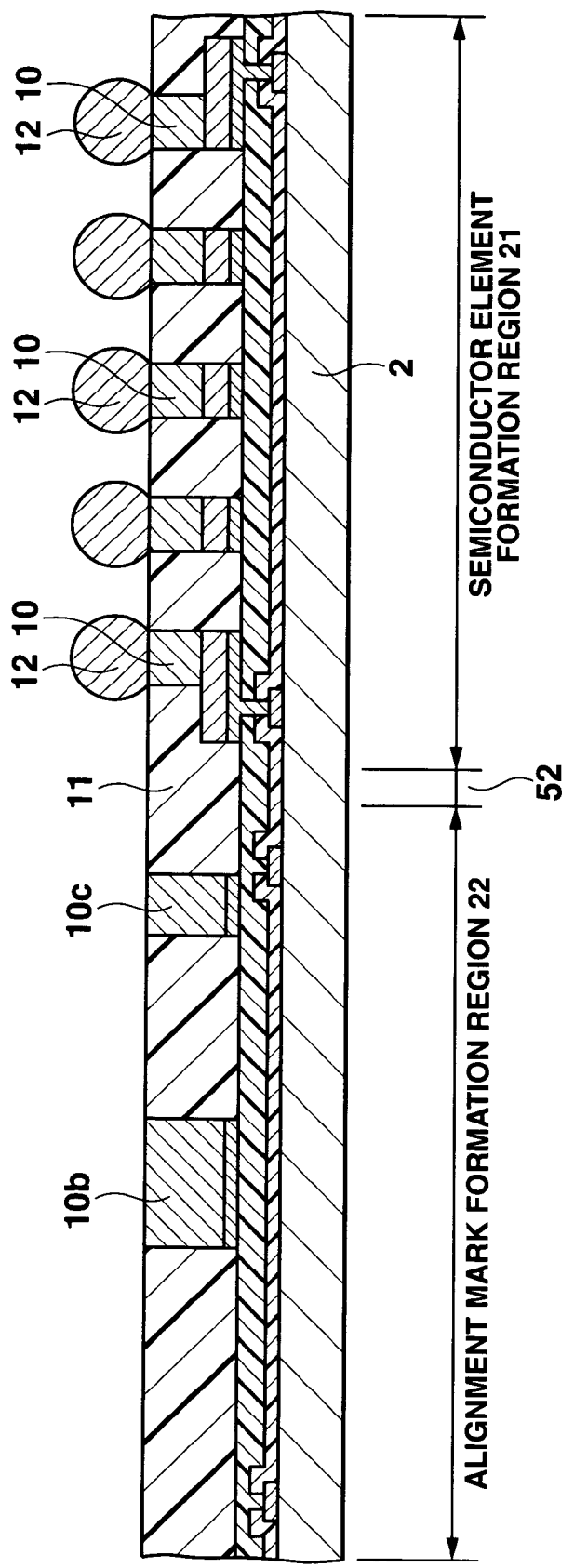
FIG. 40 is an enlarged sectional view for explaining a step following FIG. 39.
Figure 41:
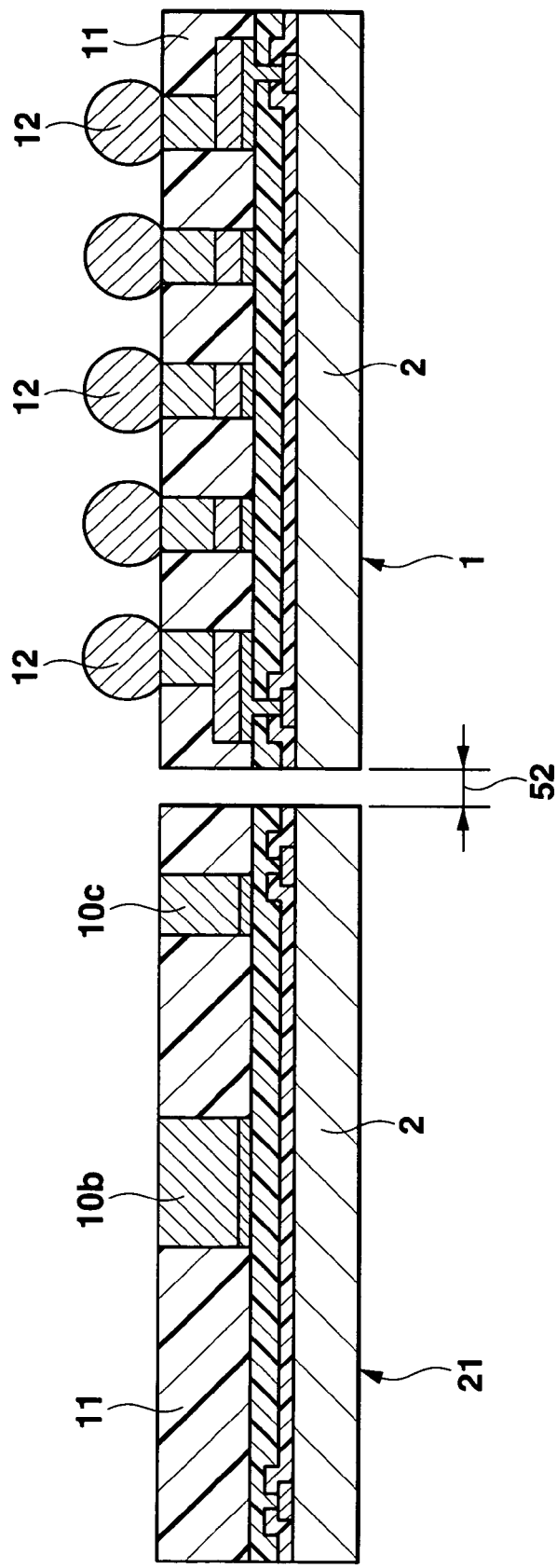
FIG. 41 is an enlarged sectional view for explaining a step following FIG. 40.

As shown in FIG. 40, the solder balls 12 are formed on the upper surfaces of the post electrodes 10. Next, predetermined marks (marking) are formed at predetermined portions on the lower surface of the silicon substrate 2 in regions corresponding to the semiconductor device formation regions 21. Next, the structure is cut along the dicing line 52, as shown in FIG. 41. Accordingly, a plurality of semiconductor devices 1 shown in FIGS. 1 and 26 are obtained. In addition, four elements 51 with alignment marks shown in FIGS. 27 and 28 are obtained.

In the step of forming the solder balls 12, the mark (marking) formation step, and the dicing step after the step of forming the post electrodes 10, alignment of the silicon substrate 2 in the wafer state is necessary. Additionally, in some cases, a solder layer is formed on the upper surface of each post electrode 10 before formation of the solder balls 12 on the upper surfaces of the post electrodes 10. Even in this case, alignment is necessary. Even when an electrical contact test process is to be executed after the mark (marking) formation step before the dicing step, alignment of the silicon substrate 2 in the wafer state is necessary. In this case, the two alignment post electrodes 10b and 10c formed in the alignment mark formation regions 22 are used as alignment marks.

More specifically, the alignment post electrodes 10b and 10c are formed in the alignment mark formation regions 22 having the same planar size as that of the semiconductor device formation regions 21 where the post electrodes 10 are formed. For this reason, the alignment post electrodes 10b and 10c formed in the alignment mark formation regions 22 can easily be recognized as alignment marks in aligning the silicon substrate 2 in the wafer state. Hence, any alignment mark recognition error can be prevented.

In this case, the temporary alignment post electrode 10b has a circular planar shape which is the same as the planar shape of the post electrode 10. However, the diameter (1 mm) of the temporary alignment post electrode 10b is considerably larger than the diameter (e.g., 0.25 mm) of the post electrode 10. In addition, the temporary alignment post electrode 10b is formed in the alignment mark formation region 22. For these reasons, the temporary alignment post electrode 10b is never erroneously recognized as the post electrode 10.

The temporary alignment post electrode 10b is used for temporary alignment of the silicon substrate 2 in the wafer state. The final alignment post electrode 10c is used for final alignment of the silicon substrate 2 in the wafer state. For example, a temporary alignment camera and final alignment camera are prepared in a dicing apparatus. In this case, the temporary alignment camera has a relatively wide visual field range and a relatively low lens magnification. The final alignment camera has a relatively narrow visual field range and a relatively high lens magnification.

Temporary alignment is done to make the final alignment post electrode 10c on the silicon substrate 2 in the wafer state fall within the visual field range of the final alignment camera. Final alignment is done, in, e.g., a dicing apparatus, to cause the dicing saw to accurately cut the dicing line 52 of the silicon substrate 2 in the wafer state. This alignment can accurately be executed because it is done after temporary alignment.

In addition, in this case, since the final alignment post electrode 10c has an almost L planar shape, unlike the temporary alignment post electrode 10b having a circular planar shape. For this reason, any alignment mark recognition error can reliably be prevented without confusion between the two alignment post electrodes 10b and 10c.

In the above-described embodiment, the first exposure mask 62 and second exposure mask 71 shown in FIGS. 31 and 32, respectively, are used. Since two exposure masks called reticles for step exposure are necessary, the exposure mask production cost is high. In addition, since the exposure mask must be exchanged during the post electrode formation step, the step time becomes long. Another exposure mask which allows manufacturing using only one exposure mask will be described next with reference to FIG. 42.

Figure 42:
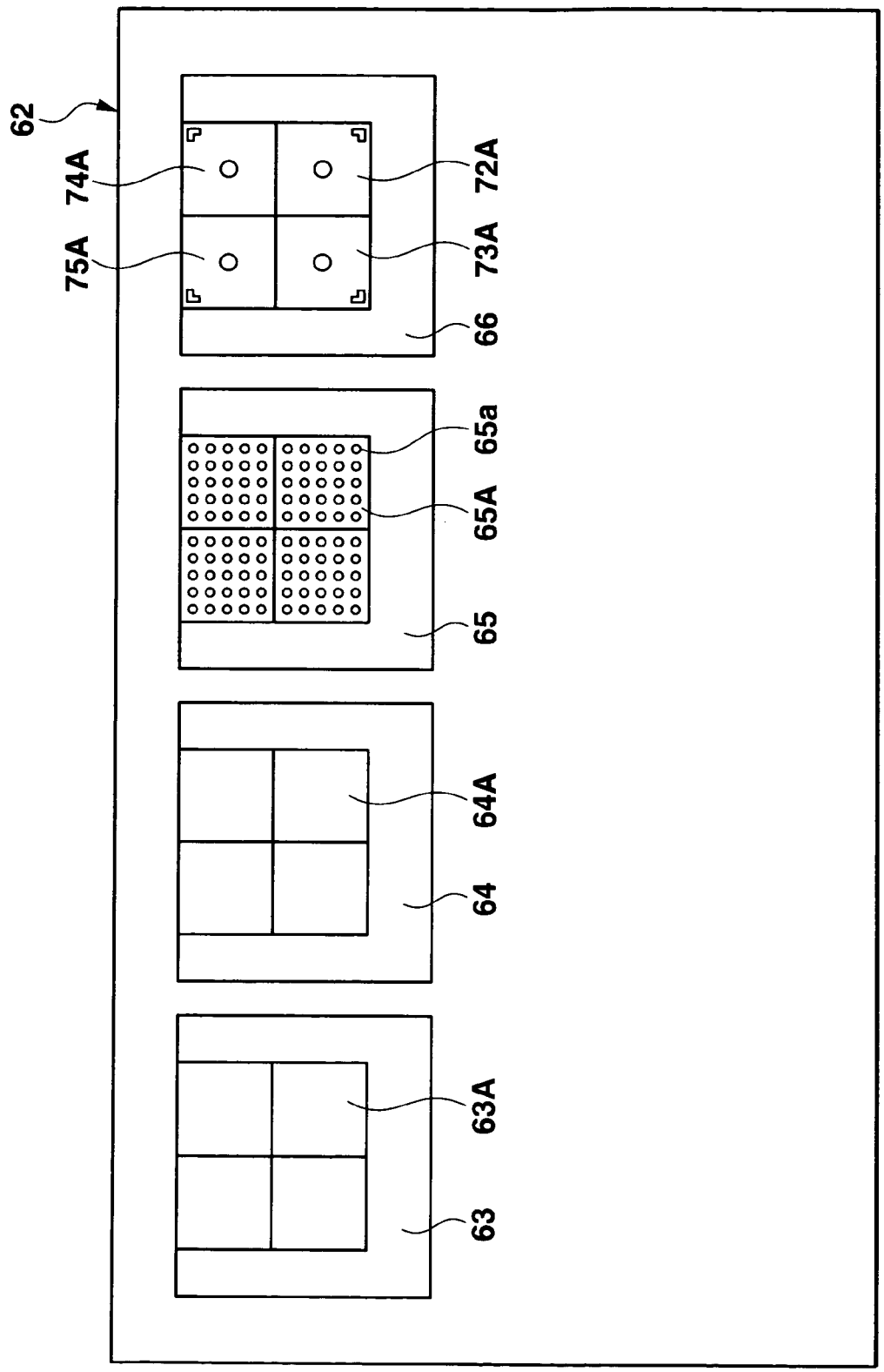
FIG. 42 is a plan view showing another example of the exposure mask.

The first exposure mask 62 shown in FIG. 42 is different from that shown in FIG. 31 in that the four alignment post electrode formation exposure masks 72A to 75A shown in FIG. 32 are formed in a 2 (rows)×2 (columns) matrix in the fourth field 66. In this case, the alignment post electrode formation exposure mask 72A is arranged at the lower right portion. The alignment post electrode formation exposure mask 73A is arranged at the lower left portion. The alignment post electrode formation exposure mask 74A is arranged at the upper right portion. The alignment post electrode formation exposure mask 75A is arranged at the upper left portion.

Figure 43:
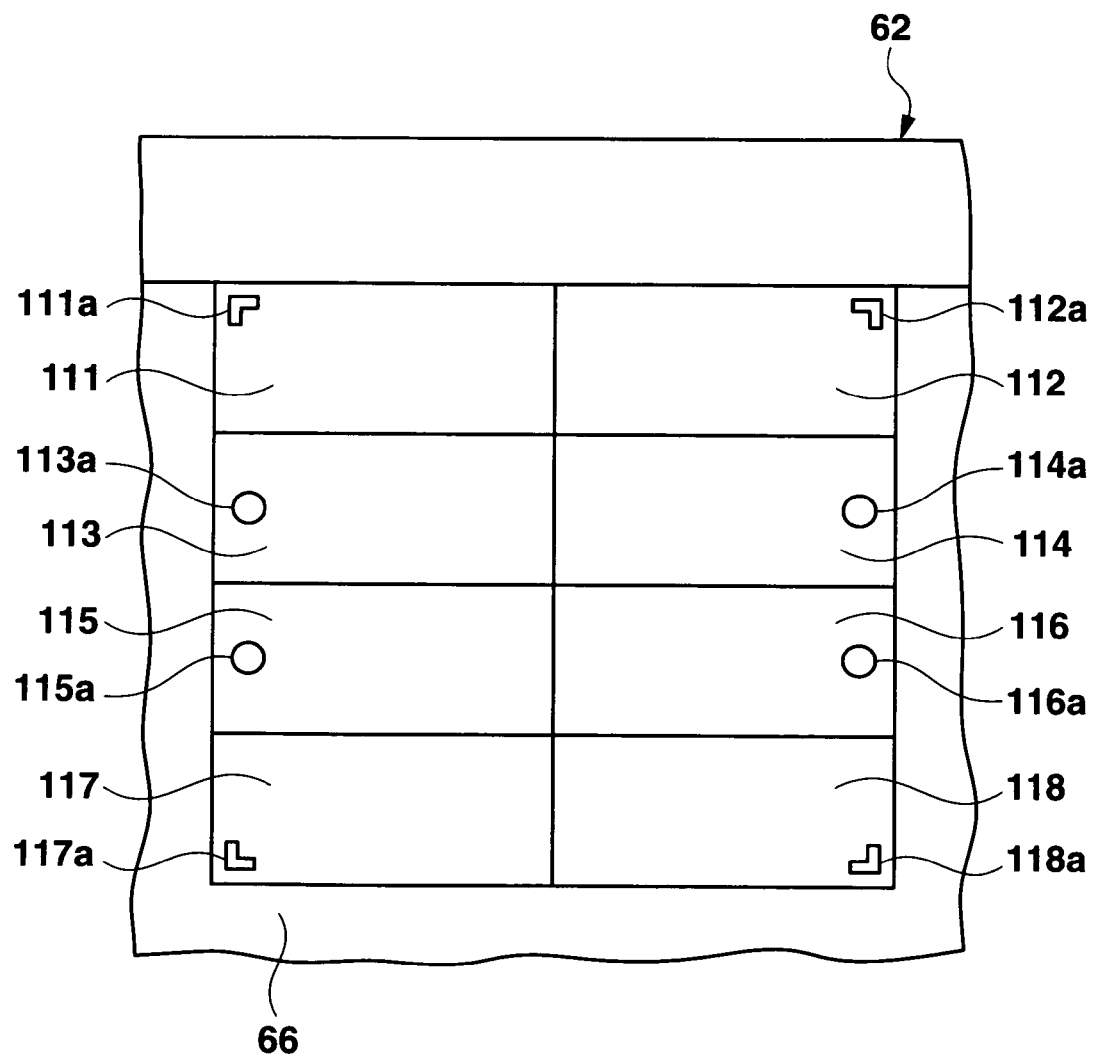
FIG. 43 is a plan view showing the first modification of the exposure mask shown in FIG. 42.
Figure 44:
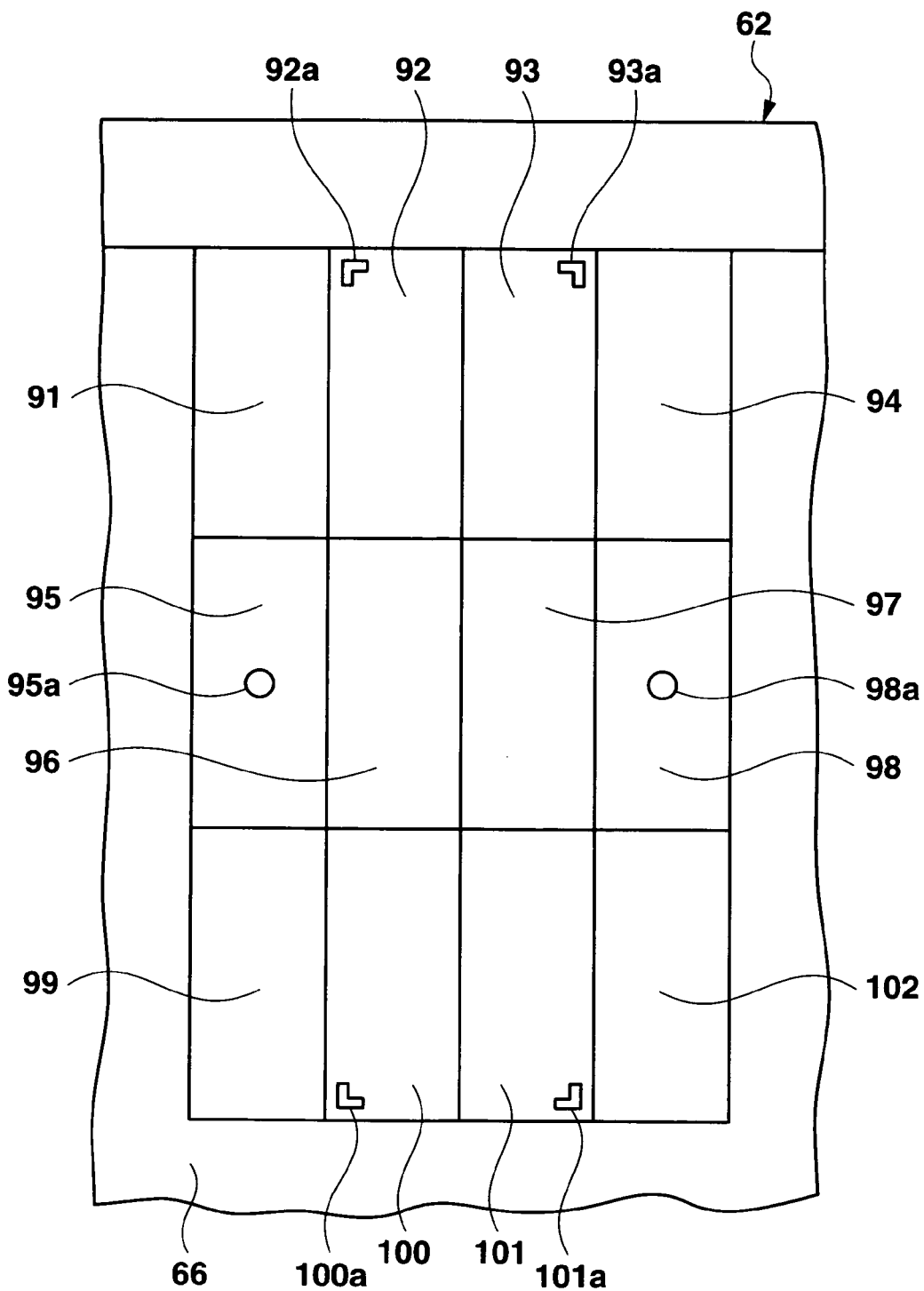
FIG. 44 is a plan view showing the second modification of the exposure mask shown in FIG. 42.

The number of exposure masks formed in the first to third fields 63 to 65 of the first exposure mask 62 is not limited to 2 (rows)×2 (columns) and may be, e.g., 2 (rows)×4 (columns). In this case, for example, as in the first modification shown in FIG. 43, eight alignment post electrode formation exposure masks 111 to 118 may be formed in a 2 (rows)×4 (columns) matrix in the fourth field 66. In this case, however, since an element with an alignment mark (i.e., a semiconductor device) has a rectangular planar shape, each of the alignment post electrode formation exposure masks 111 to 118 also has a rectangular shape.

In the alignment post electrode formation exposure mask 111, an almost L-shaped light-shielding portion 111a is formed at the upper left portion along the upper left corner of the exposure mask. In the alignment post electrode formation exposure mask 112, an almost L-shaped light-shielding portion 112a is formed at the upper right portion along the upper right corner of the exposure mask. In the alignment post electrode formation exposure mask 113, a circular light-shielding portion 113a is formed at the central portion of the left side. In the alignment post electrode formation exposure mask 114, a circular light-shielding portion 114a is formed at the central portion of the right side.

In the alignment post electrode formation exposure mask 115, a circular light-shielding portion 115a is formed at the central portion of the left side. In the alignment post electrode formation exposure mask 116, a circular light-shielding portion 116a is formed at the central portion of the right side. In the alignment post electrode formation exposure mask 117, an almost L-shaped light-shielding portion 117a is formed at the lower left portion along the lower left corner of the exposure mask. In the alignment post electrode formation exposure mask 118, an almost L-shaped light-shielding portion 118a is formed at the lower right portion along the lower right corner of the exposure mask.

The number of exposure masks formed in the first to third fields 63 to 65 of the exposure mask 62 may be, e.g., 4 (rows)×3 (columns). Even in this case, since an element with an alignment mark (i.e., a semiconductor device) has a rectangular planar shape, each of second exposure masks 91 to 102 for alignment post electrode formation also has a rectangular shape. The unmarked alignment post electrode formation exposure masks 91, 94, 96, 99, and 102 are blank mask and have no light-shielding portion.

In the alignment post electrode formation exposure mask 92, an almost L-shaped light-shielding portion 92a is formed at the upper left portion along the upper left corner of the exposure mask. In the alignment post electrode formation exposure mask 93, an almost L-shaped light-shielding portion 93a is formed at the upper right portion along the upper right corner of the exposure mask. In the alignment post electrode formation exposure mask 95, a circular light-shielding portion 95a is formed at the central portion. In the alignment post electrode formation exposure mask 98, a circular light-shielding portion 98a is formed at the central portion. In the alignment post electrode formation exposure mask 100, an almost L-shaped light-shielding portion 100a is formed at the lower left portion along the lower left corner of the exposure mask. In the alignment post electrode formation exposure mask 101, an almost L-shaped light-shielding portion 101a is formed at the lower right portion along the lower right corner of the exposure mask.

The temporary alignment post electrode 10b need not always have a circular planar shape. It may have, e.g., a square planar shape. The final alignment post electrode 10c need not always have an almost L planar shape. It may have, e.g., an almost cross or plus-sign-shape planar shape.

Fourth Embodiment

Figure 45A:
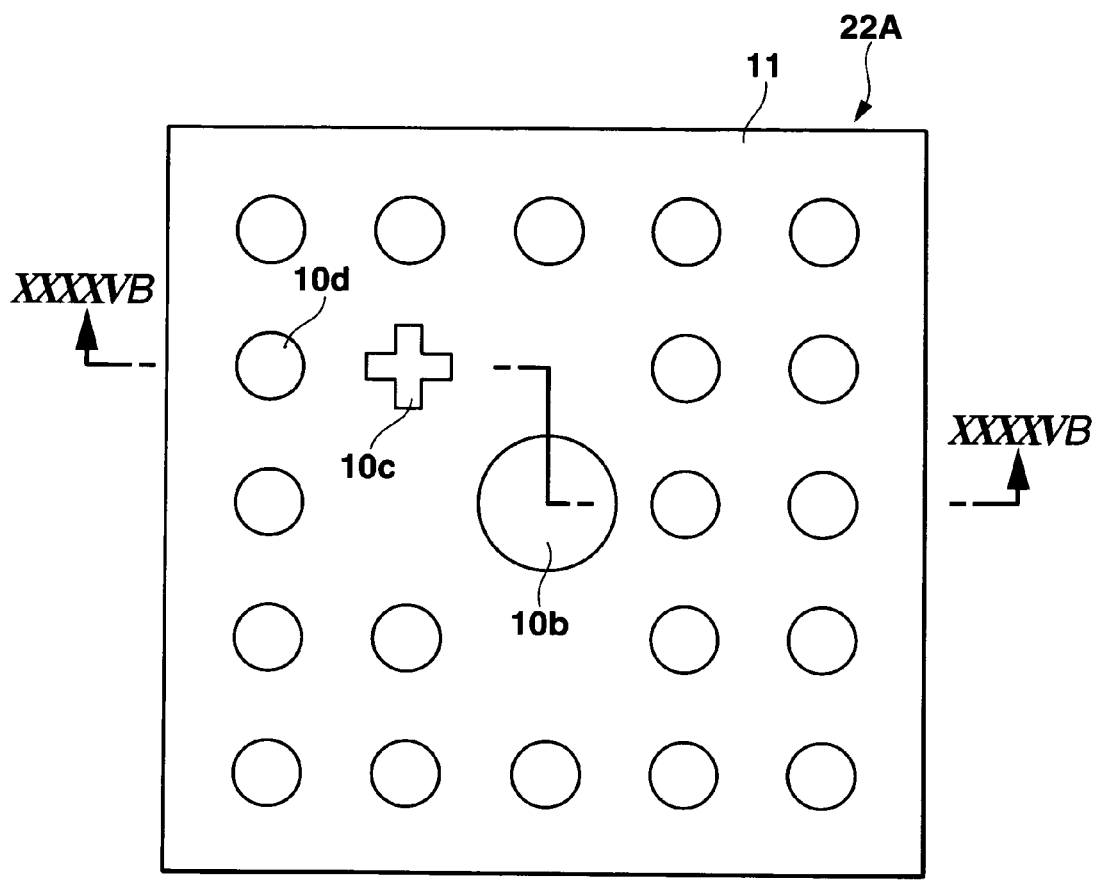
FIG. 45A is a plan view showing an example of an element with an alignment mark, which is obtained simultaneously when the semiconductor device shown in FIG. 1 is manufactured.
Figure 45B:
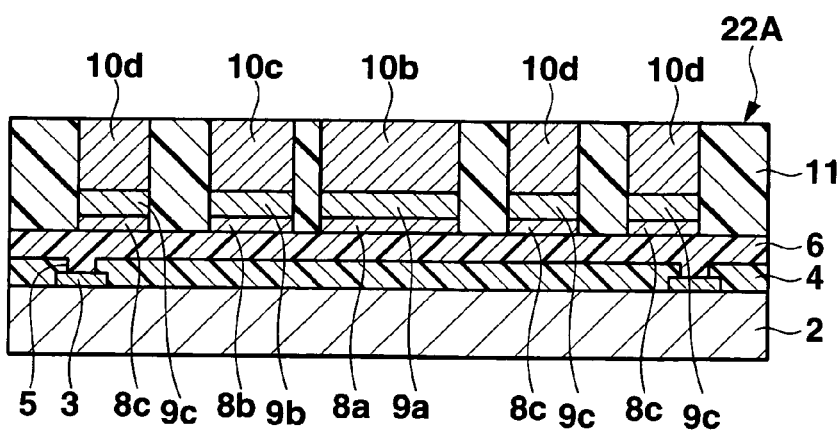
FIG. 45B is an enlarged sectional view taken along a line XXXXVB-XXXXVB in FIG. 45A.

FIG. 45A is a plan view showing an example of an element with an alignment mark, which is obtained simultaneously when the semiconductor device shown in FIG. 1 is manufactured, and FIG. 45B is an enlarged sectional view taken along a line XXXXVB-XXXXVB in FIG. 45A. A construction of a part of the element 22A with an alignment mark is set to the same of that of a part of the semiconductor element 1 shown in FIG. 1.

That is, in the same part of this element 22A with an alignment mark as the semiconductor element 1, an integrated circuit (not shown) having a predetermined function is formed on an upper surface of a silicon substrate 2 having the same square planar shape as the silicon substrate 2 of the semiconductor element 1, a plurality of connection pads 3 are provided on the silicon substrate 2 around the integrated circuit to be electrically connected to the circuit, and an insulating film 4 is provided on the upper surfaces of the silicon substrate 2 and the connection pads 3 except the central portion of each pad 3 so that the central portion of the pad 3 is exposed through an opening portion 5 formed in the insulating film 4.

In the different part of the element 22A of an alignment mark, a protective film 6 provided on the upper surface of the insulating film 4 is also provided on the upper surfaces of the connection pads 3 exposed through the opening portion 5. That is the opening portion 5 is filled with a part of the protective film 6. The part of the protective film 6 which corresponds to the opening portion 5 of the insulating film 4 is not provided an opening portion.

Underlying metal layers 8a and 8b are separately provided on a central portion and a predetermined one portion of the upper surface of the protective film 6, and a plurality of underlying metal layers 6c are provided on a peripheral portion thereof. Dummy wirings or interconnections 9a, 9b and 9c respectively include the underlying metal layers 8a, 8b and 8c each of which is only formed of a connection pad and not electrically connected to each other and any other part.

On the upper surfaces of the dummy wirings 9a, 9b and 9c, there are respectively provided a post electrode or bump electrode 10b for a temporary alignment, a post electrode or bump electrode 10c for a final alignment, and dummy post electrodes or bump electrodes 10d. A sealing film 11 is formed on the upper surface of the protective film 6 such that its upper surface becomes flush with those of the post electrodes 10b, 10c and 10d.

The temporary alignment post electrode 10b has a columnar shape whose planar or horizontal section has a circular shape. The final alignment post electrode 10c has a planar or horizontal section of a cross shape, unlike the circular planar shape of the temporary alignment post electrode 10b. Each of the dummy post electrodes 10d has a columnar shape whose planar or horizontal section has a circular shape.

An example of size or dimensions of various members will be described next. The dummy post electrodes 10d and the post electrodes 10 of the semiconductor element 1 shown in FIG. 1 respectively have diameters of 0.2 mm, and arranging pitches of 0.4 mm. Referring to FIGS. 45A and 1, twenty dummy post electrodes and twenty-five post electrodes 10 are merely shown for making the figures clear, but actual or practical numbers of the respective post electrodes 10d and 10 are a few or several hundreds.

The temporary alignment post electrode 10b is used for a temporary alignment of the silicon substrate in a wafer state as described later, and has a relatively large size or diameter of, for example, 0.75 mm. The final alignment post electrode 10c is used for a final alignment of the silicon substrate in a wafer state as described later, and has a substantially cross band shape of a relatively smaller size which is formed in a square area whose each side is 0.45 mm by a band of a 0.15 mm width.

Figure 46:
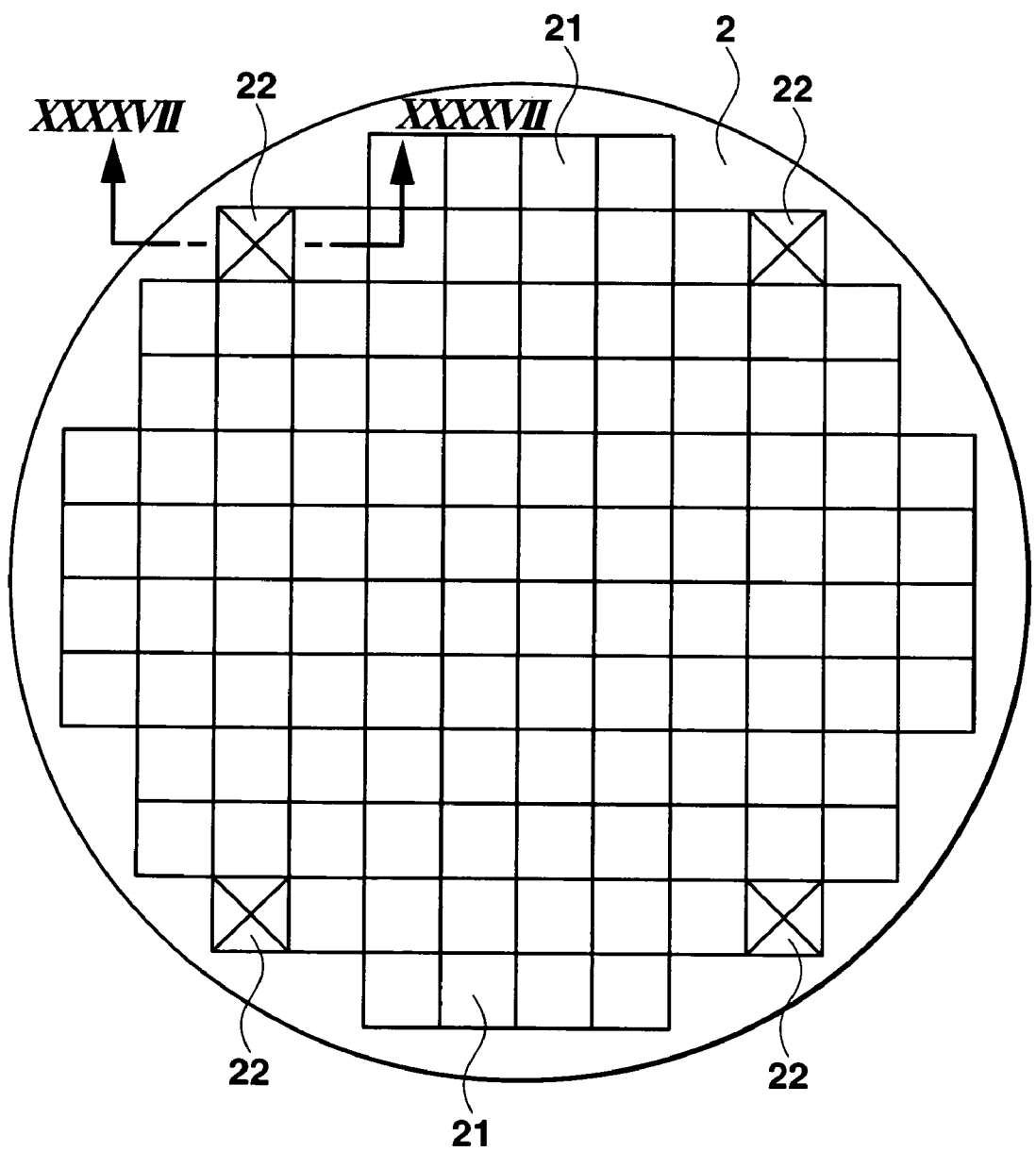
FIG. 46 is a plan view of a silicon substrate in a wafer state, which is initially prepared in manufacturing the semiconductor devices shown in FIGS. 1 and 45A.

An example of a method of manufacturing the semiconductor element 1 having the above structure will be described next. First, as shown in FIG. 46, the silicon substrate (semiconductor substrate) 2 in a wafer state is prepared. Referring to FIG. 46, each of a plurality of unmarked square region defined by vertical and horizontal lines is a semiconductor device formation region 21. Each of a plurality of regions marked with X is an alignment mark formation region 22. In this case, the planar size of the alignment mark formation region 22 is the same as that of the semiconductor device formation region 21. The alignment mark formation regions 22 are formed at four portions, i.e., the upper right, lower right, upper left, and lower left portions of the silicon substrate 2 in a wafer state.

Figure 47:
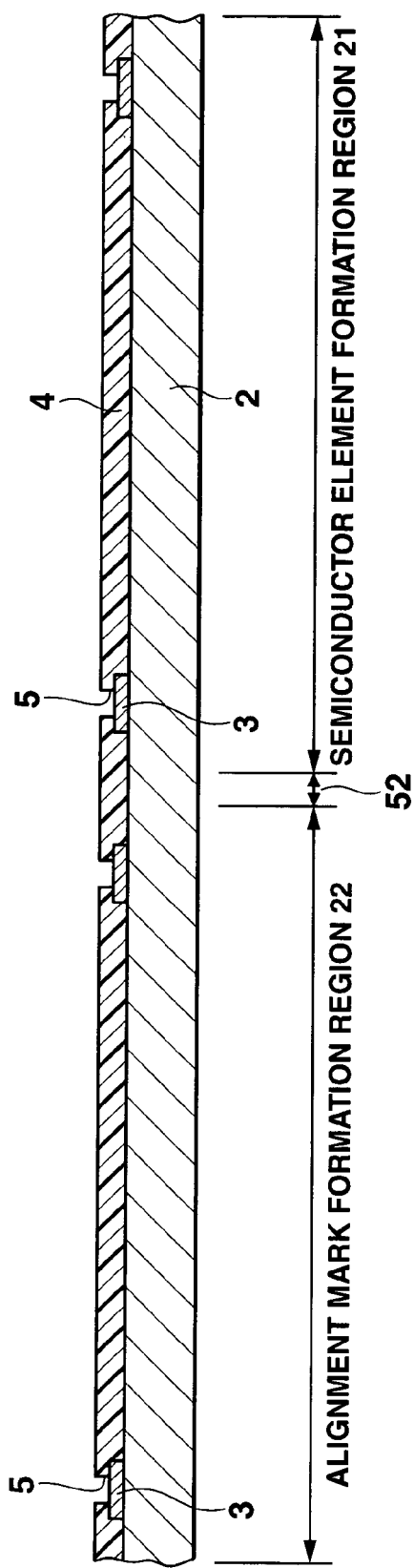
FIG. 47 is an enlarged sectional view taken along a line XXXXVII-XXXXVII in FIG. 45A.

FIG. 47 is an enlarged sectional view taken along a line XXXXVII-XXXXVII in FIG. 46. In this sate, the alignment mark formation region 22 and the semiconductor device formation region 21 have the same construction. That is, the integrated circuit (not shown) is formed on the upper surface of each of the formation regions 21 and 22, and the connection pads 3 made of a metal such as an aluminum-based metal are provided at the peripheral portion thereof and electrically connected to the integrated circuit.

On the upper surface of the silicon substrate 2 and the connection pads 3 except each of the central portions thereof, the insulating film 4 made of a insulating material such as silicon oxide is formed. The central portion of each connection pad 3 is exposed through the opening portion formed in the insulating film 4. A dicing line 52 is set or provided between the alignment mark formation region 22 and the semiconductor device formation region 21.

Figure 48:
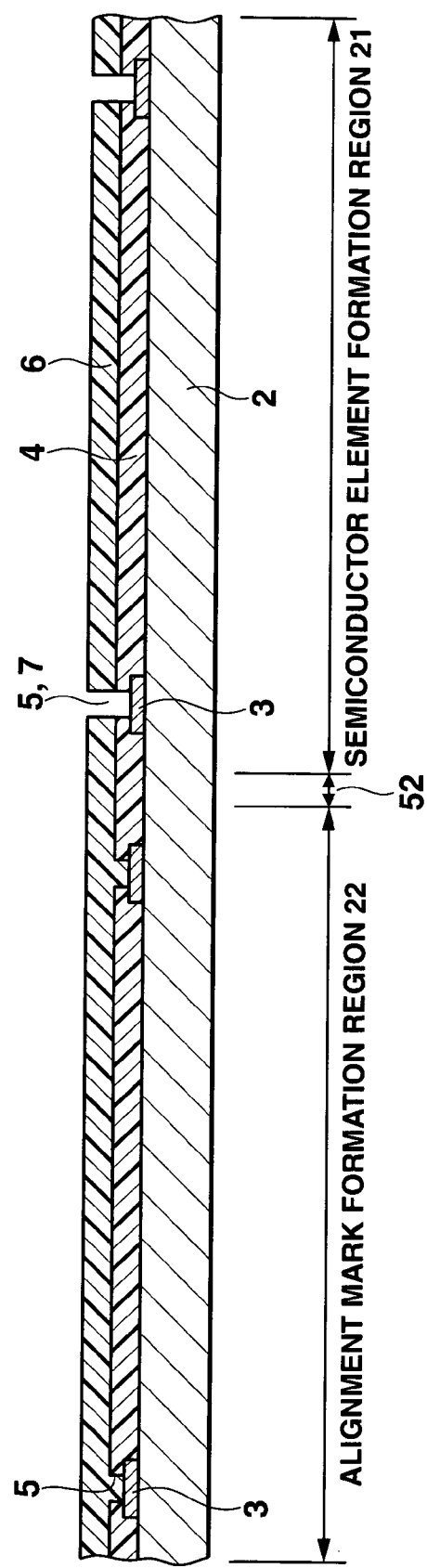
FIG. 48 is an enlarged sectional view for explaining a step following FIG. 47.

Next, as shown in FIG. 48, the protective film 6 made of polyimide is sequentially formed on the upper surface of the insulating film 4 and connection pads 3 except the central portion of each connection pad 3 by means of a plasma CVD method. Thereafter, the opening portion 7 is formed in the part of the protective film 6 corresponding to the opening portion 4 in the semiconductor device formation region 21, by using a lithography method. In this case, no opening portion is formed in the part of the protective film 6 corresponding to the opening portion 4 in the alignment mark formation region 22.

Figure 49:
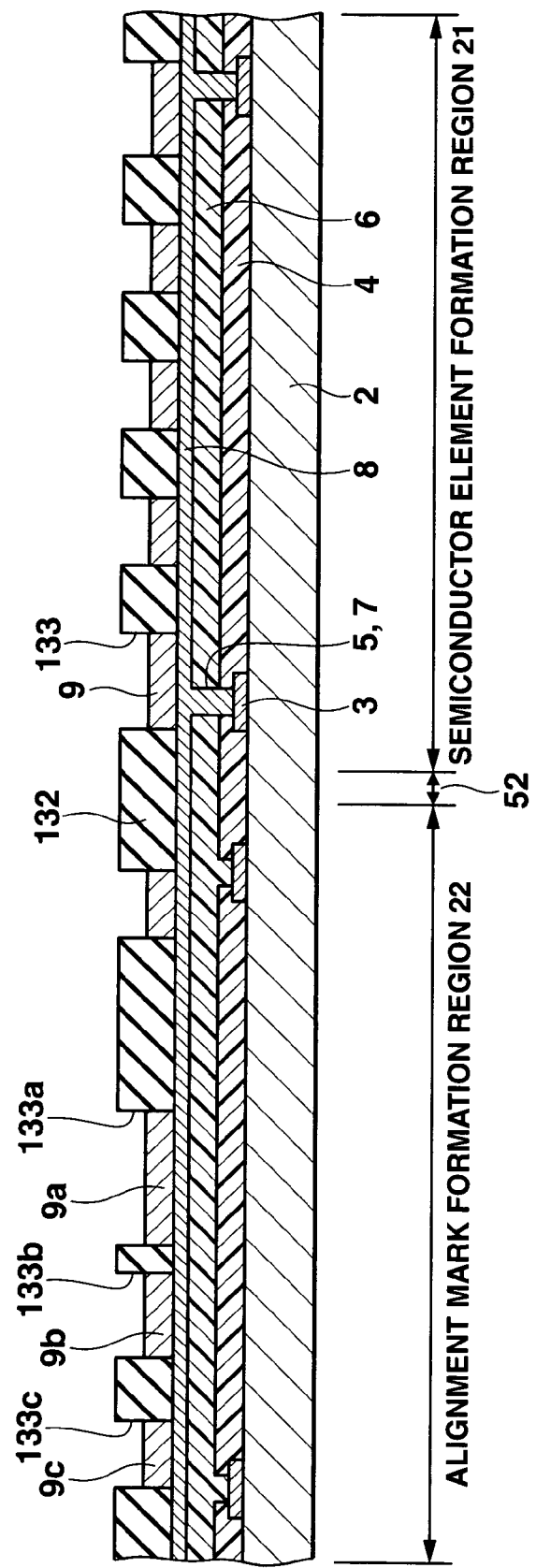
FIG. 49 is an enlarged sectional view for explaining a step following FIG. 48.

Next, as shown in FIG. 49, a layer for forming the underlying metal layer 8 is formed on the entire upper surface of the protective film 6 corresponding to the entire area of the alignment mark formation region 22, and the upper surfaces of the entire area of the semiconductor device formation region 21 and connection pads 3 exposed through the opening portions 5 and 7 formed in the protective film 6. The layer for forming the underlying metal layer 8 may be constructed only by a copper layer formed by electroless plating or sputtering, or a laminated layer including a thin layer made of, for example, titanium formed by sputtering and a copper layer formed on the titanium layer by sputtering.

A plating resist film 132 is deposited on the layer for forming the underlying metal layer 8 and then patterned so that opening portions 133, 133a, 133b and 133c are formed in the portions of the plating resist film 132 corresponding to the formation areas of the wirings 9, 9a, 9b and 9c. Next, the respective wirings 9, 9a, 9b and 9c are formed on the upper surface of the underlying metal layer 8, in the opening portions 133, 133a, 133b and 133c, by copper electroplating using the layer for forming the underlying metal layer 8 as a plating current path. The plating resist film 132 is then removed from the layer for forming the underlying metal layer 8.

Figure 50:
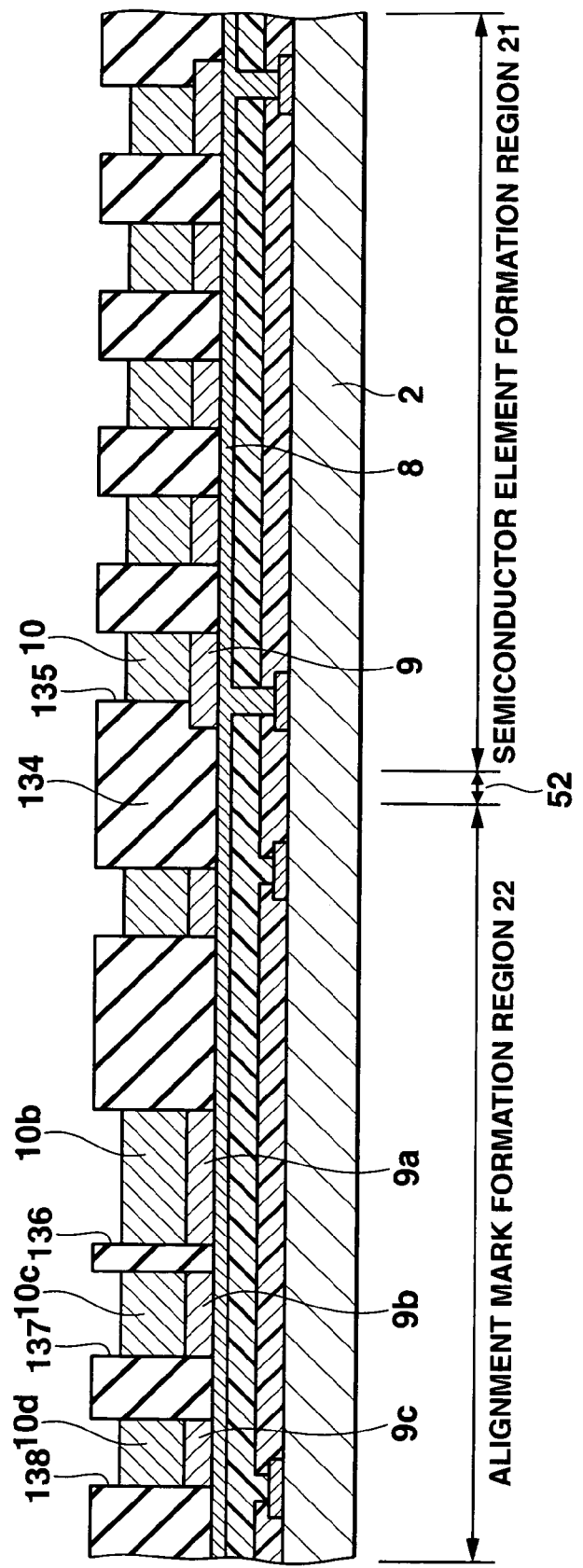
FIG. 50 is an enlarged sectional view for explaining a step following FIG. 49.

Next, as shown in FIG. 50, a plating resist film 134 is deposited on the upper surface of the layer for forming the underlying metal layers 8, 8a, 8b and 8c, and the wirings 9, 9a, 9b and 9c, and patterned so that opening portions 135, 136, 137 and 138 are respectively formed in the portions of the resist film 134 corresponding to the formation areas of the post electrodes 10, the temporary alignment post electrode 10b, the final alignment post electrode 10c and the dummy post electrodes 10d.

Next, copper electroplating is executed by using the layer for forming the underlying metal layer as a plating current path. Thus, in the semiconductor device formation region 21, the post electrodes 10 are formed on the upper surfaces of the connection pad portions of the interconnections 9 in the opening portions 135 of the plating resist film 134. In the alignment mark formation region 22, the temporary alignment post electrode 10b, the final alignment post electrode 10c, and the dummy post electrodes 10d are respectively formed on upper surfaces of the interconnections 9a, 9b and 9c in the opening portions 136, 137 and 138 of the plating resist film 134.

As this manner, in the alignment mark formation region 22, said plurality of dummy electrodes 10d are also formed in addition to the alignment post electrodes 10b and 10c, a current for plating may be prevented from a local concentration to increase in a part. Thus, all post electrodes 10, 10b, 10c and 10d are prevented from the deformation due to the local current concentration.

Figure 51:
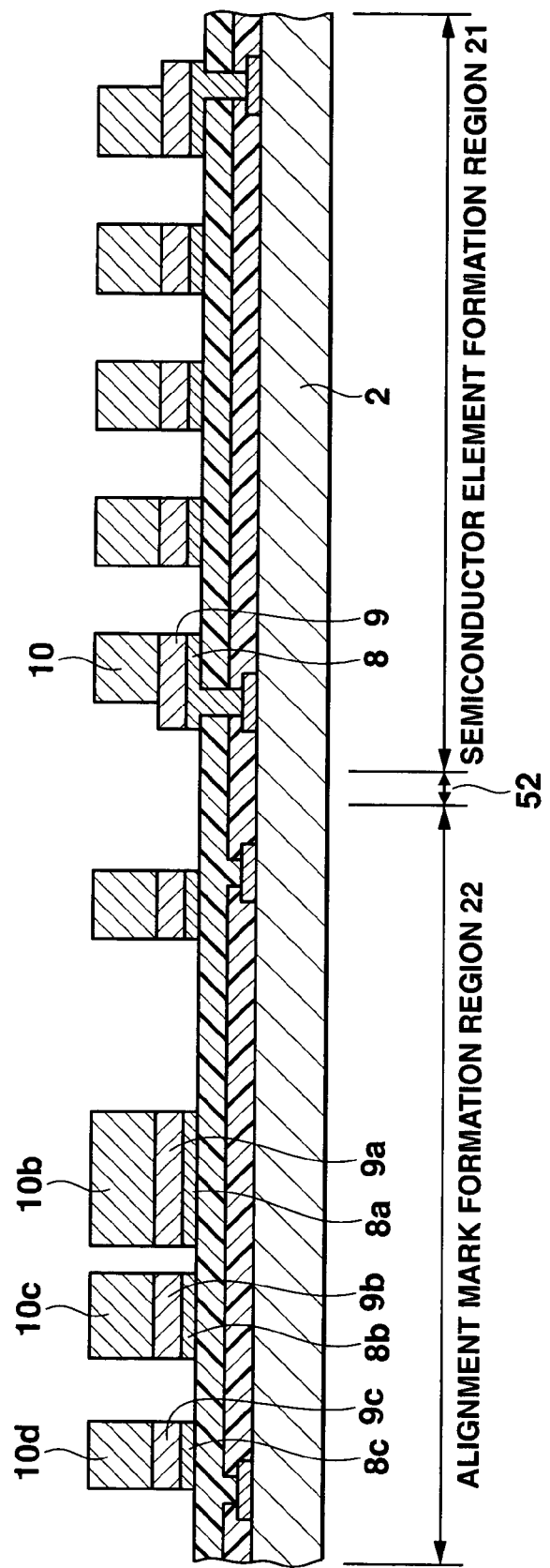
FIG. 51 is an enlarged sectional view for explaining a step following FIG. 50.

Next, the plating resist film 134 is removed from the upper surface of the layer for forming the underlying metal layer. Then, the interconnections 9 are used as a mask in the semiconductor formation region 21, and the respective post electrodes 10b, 10c and 10d are used as a mask, the layer for forming the underlying metal layer is selectively etched to remove the unnecessary portions, so that the underlying layers 8, 8a, 8b and 8c remain only under the respective interconnections 9, 9a, 9b and 9c, as shown in FIG. 51.

Figure 52:
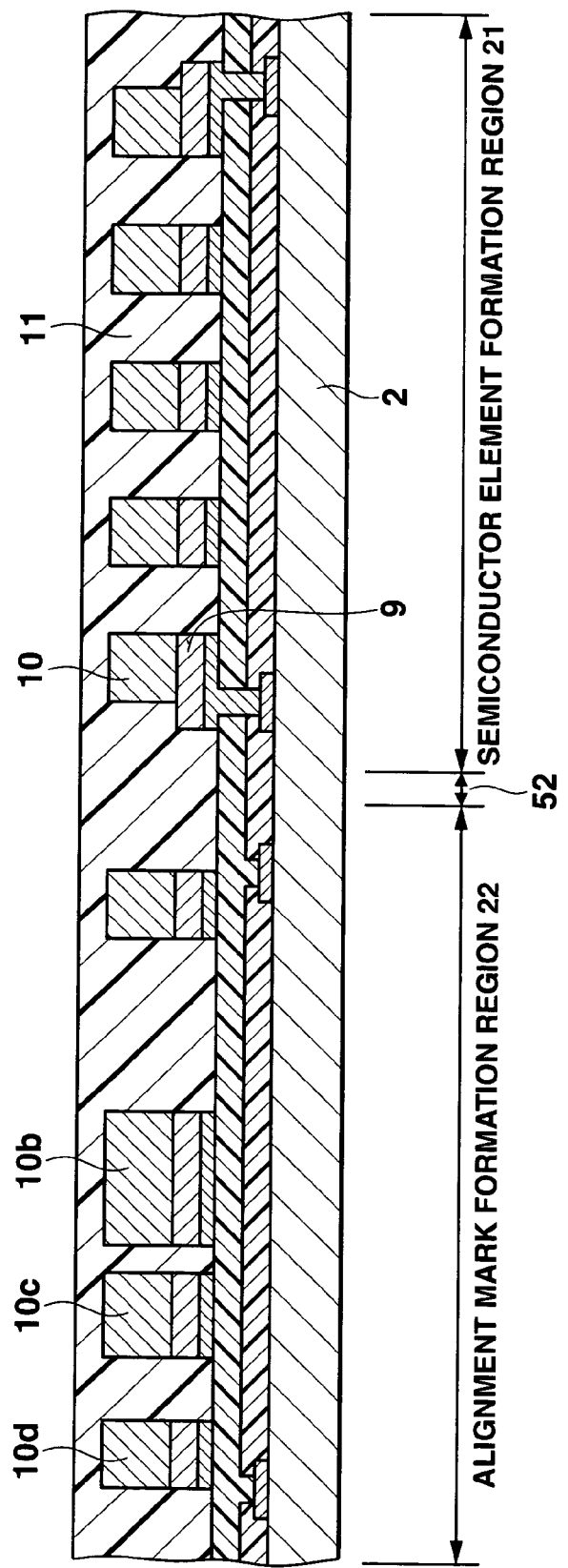
FIG. 52 is an enlarged sectional view for explaining a step following FIG. 51.
Figure 53:
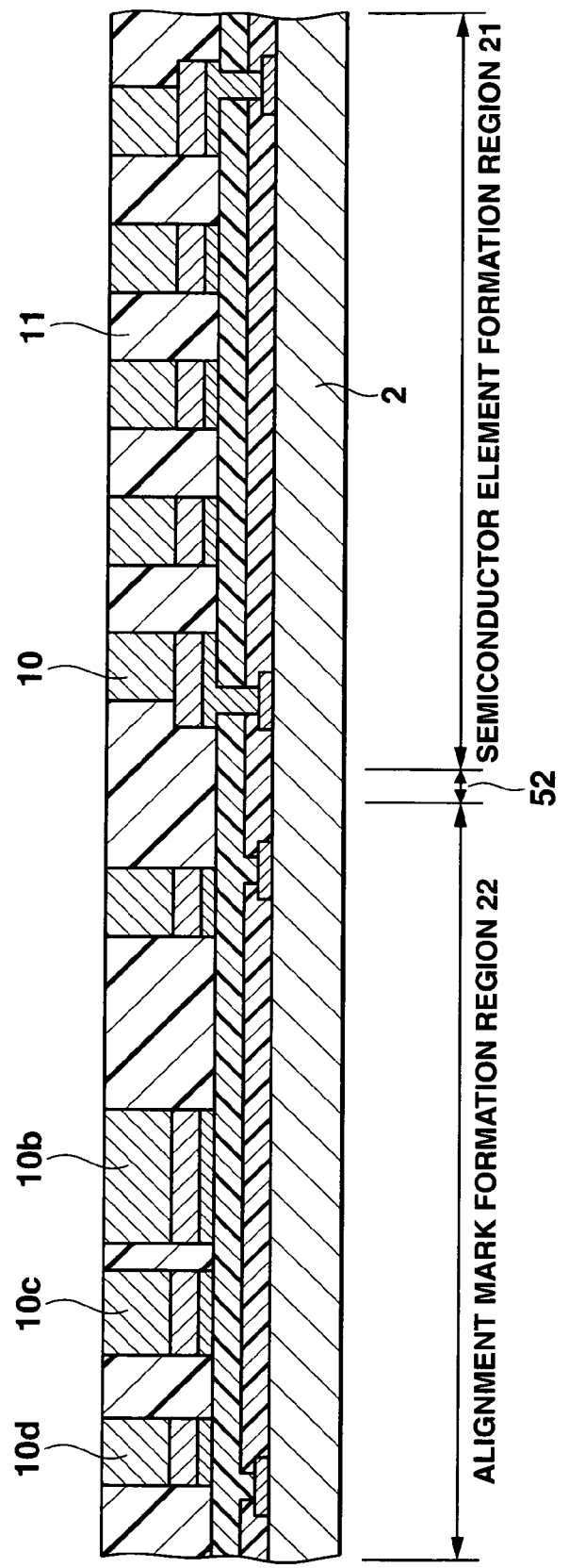
FIG. 53 is an enlarged sectional view for explaining a step following FIG. 52.

Next as shown in FIG. 52, the sealing film 11 made of, e.g., epoxy resin is formed on the entire upper surfaces of the protective film 6, the respective post electrodes 10, 10b, 10c and 10d, and interconnections 9, such that the thickness becomes slightly larger than the height of the respective post electrodes 10, 10b, 10c and 10d, by means of, for example, a screen printing or spin coating. Hence, in this state, the upper surfaces of the respective post electrodes 10, 10b, 10c and 10d are covered with the sealing film 11.

Next, the upper surface sides of the sealing film 11 and then the respective post electrodes 10, 10b, 10c and 10d are appropriately polished and removed. Accordingly, as shown in FIG.

53, the upper surfaces of the respective post electrodes 10, 10b, 10c and 10d are exposed from the sealing film 11. In this state, the exposed upper surfaces of the respective post electrodes are flush with the upper surface of the sealing film 11.

Figure 54:
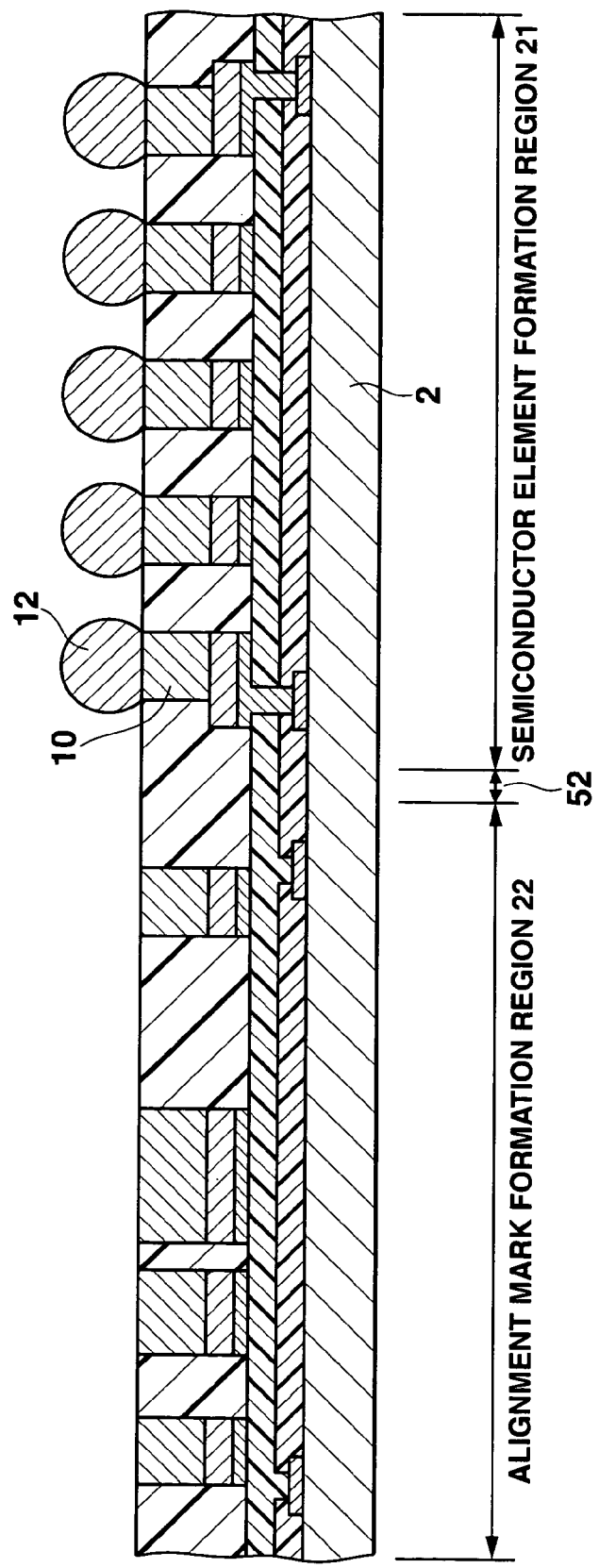
FIG. 54 is an enlarged sectional view for explaining a step following FIG. 53.
Figure 55:
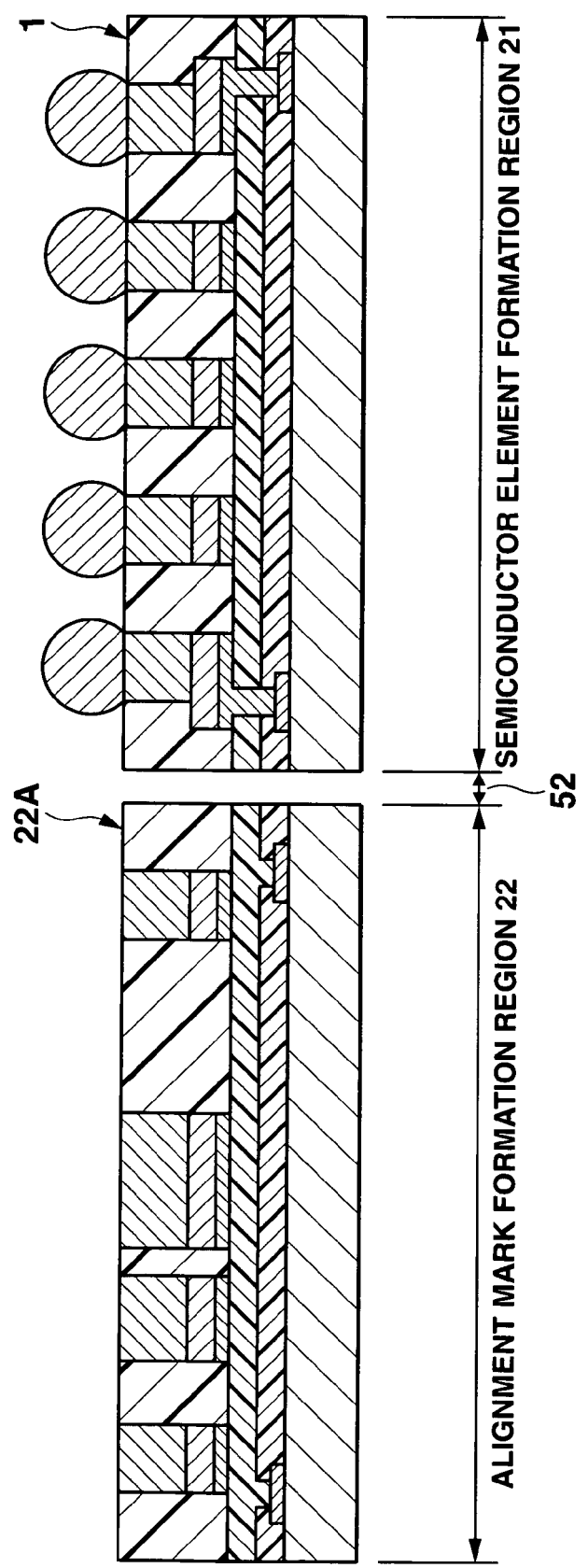
FIG. 55 is an enlarged sectional view for explaining a step following FIG. 54.

Next, as shown in FIG. 54, the solder balls 12 are formed on the exposed upper surfaces of the post electrodes 10, in the semiconductor element formation region 21. Next, predetermined marks (marking) are formed at predetermined portions on the lower surface of the silicon substrate 2 in regions corresponding to the semiconductor device formation regions 21. Thus, an assembly for forming semiconductor elements (semiconductor device) is formed. Finally, as shown in FIG. 55, a dicing step is executed, by cutting the assembly along the dicing line 52, thereby obtaining a plurality of semiconductor devices shown in FIGS. 1 and 2. In addition, four elements 22A with alignment marks shown in FIGS. 45A and 45B are obtained.

In addition, four elements with alignment marks shown in FIGS. 3 and 4 are obtained.

In the step of forming the solder balls 12, the mark (marking) formation step, and the dicing step after the step of forming the post electrodes 10, alignment of the silicon substrate 2 in the wafer state is necessary. Additionally, in some cases, a solder layer is formed on the upper surface of each post electrode 10 by printing before formation of the solder balls 12 on the upper surfaces of the post electrodes 10. Even in this case, alignment is necessary. When an electrical contact test process is to be executed after the mark (marking) formation step before the dicing step, alignment of the silicon substrate 2 in the wafer state is also necessary. In this case, the alignment post electrodes 10b and 10c formed in the alignment mark formation regions 22 are used as alignment marks. In this case, the temporary alignment post electrode 10b is prevented to be erroneously recognized as the post electrode 10, since even if the temporary alignment post electrode 10b has the same circular planer shape as the post electrode 10, the temporary alignment post electrode 10b is set to have a 0.75 mm diameter which is remarkably larger than the of the post electrode 10 having the 0.2 mm diameter, and is formed in the temporary alignment formation region 21.

The temporary alignment post electrode 10b is provided for temporary alignment of the silicon substrate 2 in a wafer state, while the final alignment post electrode 10c is set for final alignment of the silicon substrate 2 in a wafer state. Thus preferably a temporary alignment camera and a final alignment camera are provided to a dicing apparatus. In this case, it is preferable that the temporary alignment camera has a relatively wide visual field range and a relatively low lens magnification, and the final alignment camera has a relatively narrow visual field range and a relatively high lens magnification.

Temporary alignment is done to make the final alignment post electrode 10c on the silicon substrate 2 in the wafer state fall within the visual field range of the final alignment camera. Final alignment is done, in, e.g., a dicing apparatus, to cause the dicing saw to accurately cut the dicing line 52 of the silicon substrate 2 in the wafer state. This alignment can accurately be executed because it is done after temporary alignment.

In addition, in this case, since the final alignment post electrode 10c has a substantially cross planar shape, unlike the temporary alignment post electrode 10b having a circular planar shape. For this reason, any alignment mark recognition error can reliably be prevented without confusion between the two alignment post electrodes 10b and 10c.

In the present invention, the shape of the temporary alignment post electrode 10b is not limited to a cross shape, it may be different shape from the final alignment post electrode 10c and the post electrode 10, such as a rectangular shape or triangular shape.

As described above, according to the present invention, since an alignment post electrode is formed in an alignment mark formation region having the same planar size as that of a semiconductor device formation region where a post electrode is formed. Hence, after formation of post electrodes, the alignment mark can reliably be recognized, and alignment can efficiently be executed.

What is claimed is:
1. A semiconductor device comprising:
  a semiconductor substrate which has an upper surface including a plurality of semiconductor device formation regions and at least one alignment mark formation region having the same planar size as a planar size of each of the semiconductor device formation regions;
  a plurality of connection pads formed in each of the semiconductor device formation regions;
  an insulating film formed on the upper surface of the semiconductor substrate in all of the semiconductor device formation regions, including on the connection pads except for respective central portions thereof, and in the at least one alignment mark formation region;
  a plurality of post electrodes which are formed on an upper side of the insulating film in each of the semiconductor device formation regions and each of which is electrically connected to at least a corresponding one of the connection pads;
  at least one alignment post electrode which is formed on an upper side of the insulating film in the alignment mark formation region, and which is smaller in number than the post electrodes formed in each semiconductor device formation region; and
  a sealing film which is made from an organic resin and which is formed between the post electrodes in each of the semiconductor device formation regions and on an outside of the alignment post in the alignment mark formation region;
  wherein an upper surface of the alignment post electrode is exposed to outside and is flush with an upper surface of the sealing film; and
  wherein the semiconductor substrate includes a plurality of non-semiconductor device formation regions around the alignment mark formation region, and each of the non-semiconductor device formation regions has the same planar size as the planar size of each of the semiconductor device formation regions and does not have post electrodes formed thereon.

2. A semiconductor device comprising:
  a semiconductor substrate which includes a plurality of semiconductor device formation regions and at least one alignment mark formation region having the same planar size as a planar size of each of the semiconductor device formation regions;
  a plurality of post electrodes which are formed in each of the semiconductor device formation regions; and
  at least one alignment post electrode which is formed in the alignment mark formation region, and which is smaller in number than the post electrodes formed in each of the semiconductor device formation regions;
  wherein the semiconductor substrate includes a plurality of non-semiconductor device formation regions around the alignment mark formation region, and each of the non-semiconductor device formation regions has the same planar size as the planar size of each of the semiconductor device formation regions and does not have post electrodes formed thereon.

3. A semiconductor device comprising:
a semiconductor substrate including a plurality of semiconductor device formation regions in each of which a plurality of connection pads are formed, and at least one alignment mark formation region having the same planar size as a planar size of each of the semiconductor device formation regions;
a plurality of post electrodes which are formed in each of the semiconductor device formation regions and each of which is electrically connected to at least a corresponding one of the connection pads; and
at least one alignment post electrode and a plurality of dummy electrodes which are formed in the alignment mark formation region, the alignment post electrode being smaller in number than the post electrodes formed in each semiconductor device formation region, and the dummy electrodes being not electrically connected to the connection pads;
wherein the plurality of dummy electrodes comprise a plurality of dummy electrodes arranged around the alignment mark formation region.

4. The device according to claim 3, wherein each of the dummy electrodes has the same planar shape as a planar shape of each of the post electrodes.

5. The device according to claim 4, wherein the dummy electrodes are arranged with the same pitch as the post electrodes.

6. The device according to claim 3, wherein said at least one alignment post electrode includes at least one temporary post electrode for use in executing temporary alignment and at least one final alignment post electrode for use in executing final alignment, the temporary alignment post electrode and the final alignment post electrode having different shapes.

7. The device according to claim 6, wherein the temporary alignment post electrode has a substantially circular planar shape or a substantially rectangular planar shape, and the final alignment post electrode has a substantially cross-shaped planar shape or a substantially L-shaped planar shape.

8. The device according to claim 3, wherein said at least one alignment post electrode includes at least one temporary post electrode for use in executing temporary alignment and at least one final alignment post electrode for use in executing final alignment, a size of an upper surface of the temporary alignment post electrode being larger than a size of an upper surface of the final alignment post electrode.

9. The device according to claim 3, further comprising a protective film formed on the semiconductor substrate and having opening portions exposing the plurality of connection pads, wherein the post electrodes, the alignment post electrode, and the dummy electrodes are formed on the protective film.

10. The device according to claim 9, further comprising a plurality of other connection pads formed in the alignment mark formation region.

11. A semiconductor device comprising:
a semiconductor substrate including a plurality of semiconductor device formation regions in each of which a plurality of connection pads are formed, and at least one alignment mark formation region having the same planar size as a planar size of each of the semiconductor device formation regions;
a plurality of post electrodes which are formed in each of the semiconductor device formation regions and each of which is electrically connected to at least a corresponding one of the connection pads;
at least one alignment post electrode and at least one dummy electrode which are formed in the alignment mark formation region, the alignment post electrode being smaller in number than the post electrodes formed in each semiconductor device formation region, and the dummy electrode being not electrically connected to the connection pads;
a protective film formed on the semiconductor substrate and having opening portions exposing the plurality of connection pads, wherein the post electrodes, the alignment post electrode, and the dummy electrode are formed on the protective film; and
a plurality of other connection pads formed in the alignment mark formation region.

* * * * *